United States Patent
Miyata et al.

(10) Patent No.: US 12,140,786 B2
(45) Date of Patent: Nov. 12, 2024

(54) RESIN COMPOSITION, FILM, OPTICAL FILTER, SOLID IMAGE PICKUP ELEMENT, IMAGE DISPLAY DEVICE, AND INFRARED SENSOR

(71) Applicant: FUJIFILM Corporation, Tokyo (JP)

(72) Inventors: Tetsushi Miyata, Haibara-gun (JP); Shunsuke Kitajima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1071 days.

(21) Appl. No.: 16/821,858

(22) Filed: Mar. 17, 2020

(65) Prior Publication Data
US 2020/0217999 A1 Jul. 9, 2020

Related U.S. Application Data

(63) Continuation of application No. PCT/JP2018/031266, filed on Aug. 24, 2018.

(30) Foreign Application Priority Data

Sep. 28, 2017 (JP) .................. 2017-188024

(51) Int. Cl.
*G02B 5/00* (2006.01)
*C08F 2/44* (2006.01)
*C08K 5/3415* (2006.01)
*C08K 5/5415* (2006.01)
*C08L 33/00* (2006.01)
*C08L 101/00* (2006.01)
(Continued)

(52) U.S. Cl.
CPC ............... *G02B 5/223* (2013.01); *C08F 2/44* (2013.01); *C08K 5/3415* (2013.01); *C08K 5/5415* (2013.01); *C08L 33/00* (2013.01); *C08L 101/00* (2013.01); *G02B 5/003* (2013.01); *G02B 5/208* (2013.01); *H01L 27/14621* (2013.01); *H01L 31/0232* (2013.01)

(58) Field of Classification Search
CPC ....... G02B 5/003; G02B 5/223; G02F 1/1335; G02F 2001/1351; C08F 2/44; H01L 31/0232

See application file for complete search history.

(56) References Cited

U.S. PATENT DOCUMENTS

2017/0137605 A1* 5/2017 Suzuki ................ C09D 133/08
2017/0190923 A1* 7/2017 Tsuruta ................ C09B 57/004
2018/0120485 A1 5/2018 Oota et al.

FOREIGN PATENT DOCUMENTS

CN 105885705 A 8/2016
JP 2006-284630 A 10/2006
(Continued)

OTHER PUBLICATIONS

Office Action issued Sep. 28, 2021 in Taiwanese Patent Application No. 107130556, with English translation.
(Continued)

*Primary Examiner* — Bijan Ahvazi
(74) *Attorney, Agent, or Firm* — Birch, Stewart, Kolasch & Birch, LLP

(57) ABSTRACT

A resin composition includes a near infrared absorbing colorant, an antioxidant, and a resin, in which a content of the near infrared absorbing colorant is 5 mass % or higher with respect to a total solid content of the resin composition, and the antioxidant includes a hindered amine compound.

22 Claims, 1 Drawing Sheet

(51) Int. Cl.
*G02B 5/20* (2006.01)
*G02B 5/22* (2006.01)
*G02F 1/1335* (2006.01)
*H01L 27/146* (2006.01)
*H01L 31/0232* (2014.01)

(56) References Cited

FOREIGN PATENT DOCUMENTS

| JP | 2009-139892 | A |   | 6/2009 |   |
|----|-------------|---|---|--------|---|
| JP | 2009227851  | A | * | 10/2009 | ............... G02B 5/22 |
| JP | 2010-209205 | A |   | 9/2010 |   |
| JP | 2014-149514 | A |   | 8/2014 |   |
| JP | 2016-153474 | A |   | 8/2016 |   |
| JP | 2016-204593 | A |   | 12/2016 |   |
| JP | 2017-116776 | A |   | 6/2017 |   |
| TW | 201641610   | A |   | 12/2016 |   |
| WO | WO 2016/052091 | A1 |   | 4/2016 |   |

OTHER PUBLICATIONS

Japanese Office Action for corresponding Japanese Application No. 2019-544428, dated Apr. 13, 2021, with English translation.
Taiwanese Office Action for corresponding Taiwanese Application No. 107130556, dated Feb. 15, 2022, with English translation.
International Preliminary Report on Patentability, dated Apr. 9, 2020, and Written Opinion of the International Searching Authority, dated Nov. 27, 2018, (Forms PCT/IB/326, PCT/IB/373 and PCT/ISA/237) for International Application No. PCT/JP2018/031266, with English translation.
International Search Report (Form PCT/ISA/210) for International Application No. PCT/JP2018/031266, dated Nov. 27, 2018, with English translation.

* cited by examiner

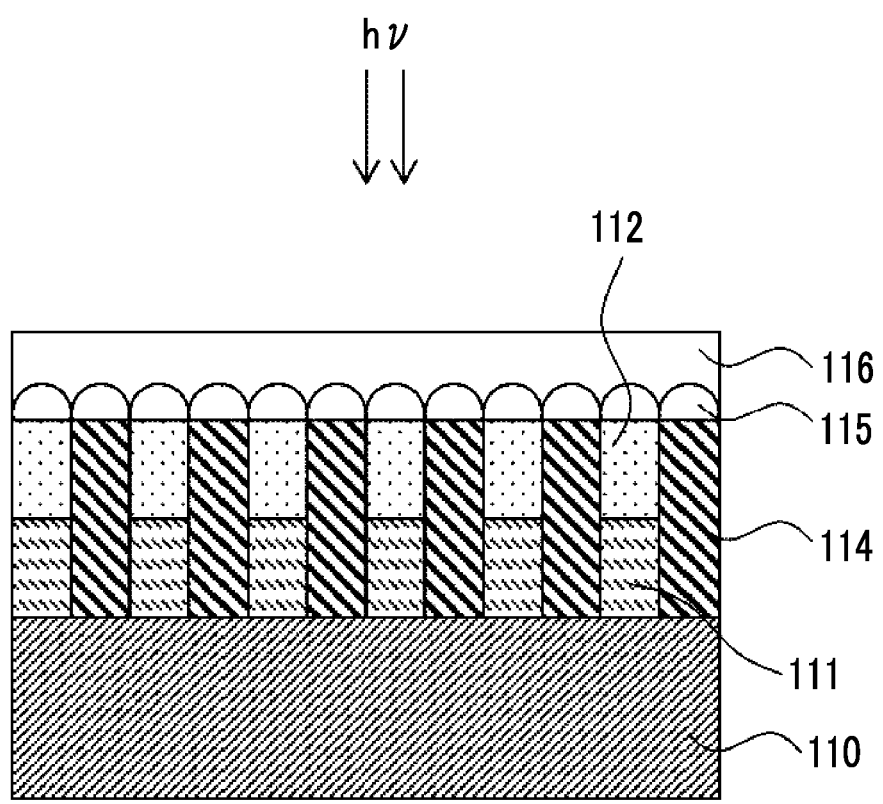

RESIN COMPOSITION, FILM, OPTICAL FILTER, SOLID IMAGE PICKUP ELEMENT, IMAGE DISPLAY DEVICE, AND INFRARED SENSOR

CROSS-REFERENCE TO RELATED APPLICATIONS

This application is a Continuation of PCT International Application No. PCT/JP2018/031266 filed on Aug. 24, 2018, which claims priority under 35 U.S.C § 119(a) to Japanese Patent Application No. 2017-188024 filed on Sep. 28, 2017. Each of the above application(s) is hereby expressly incorporated by reference, in its entirety, into the present application.

BACKGROUND OF THE INVENTION

1. Field of the Invention

The present invention relates to a resin composition including a near infrared absorbing colorant. In addition, the present invention relates to a film formed of the above-described resin composition, an optical filter, a solid image pickup element, an image display device, and an infrared sensor.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using a near infrared cut filter.

The near infrared cut filter is manufactured using a resin composition including a near infrared absorbing colorant (refer to JP2006-284630A, JP2017-116776A, and JP2014-149514A).

SUMMARY OF THE INVENTION

In a case where a film is formed using a resin composition including a near infrared absorbing colorant, the film may be formed using the resin composition immediately after the preparation or may be formed using the resin composition that is stored for a long period of time after the preparation. Therefore, it is desired for the above-described resin composition to have excellent storage stability.

In addition, recently, a reduction in thickness is also desired for the near infrared cut filter. However, it was found that, in a film that is formed by increasing the content of a near infrared absorbing colorant with respect to the total solid content of a resin composition, spectral characteristics are likely to vary by heating and thermal reliability are not sufficiently satisfactory. In addition, according to the investigation by the present inventors, it was found that, particularly in a case where the content of the near infrared absorbing colorant is 5 mass % or higher with respect to the total solid content of the resin composition, the spectral variation by heating is likely to occur.

Examples of JP2006-284630A do not describe the simultaneous improvement of the storage stability of the resin composition and the thermal reliability of the obtained film in a case where the content of the near infrared absorbing colorant is lower than 5 mass % with respect to the total solid content of the resin composition and the content of the near infrared absorbing colorant is 5 mass % or higher with respect to the total solid content of the resin composition.

In addition, as a result of the investigation on the compositions described in JP2017-116776A and JP2014-149514A, the present inventors found that the storage stability and the thermal reliability of the obtained film are not on a satisfactory level and further improvement thereof is necessary.

Accordingly, an object of the present invention is to provide a resin composition having excellent storage stability with which a film having excellent thermal reliability can be formed. In addition, another object of the present invention is to provide a film, an optical filter, a solid image pickup element, an image display device, and an infrared sensor.

As a result of thorough investigation under the above-described circumstances, the present inventors found that the objects of the present invention can be achieved using a resin composition described below, thereby completing the present invention. The present invention provides the following.

<1> A resin composition comprising:
a near infrared absorbing colorant;
an antioxidant; and
a resin,
in which a content of the near infrared absorbing colorant is 5 mass % or higher with respect to a total solid content of the resin composition, and
the antioxidant includes a hindered amine compound.

<2> The resin composition according to <1>,
in which the hindered amine compound is a compound having a partial structure represented by Formula (1) or a partial structure represented by Formula (2),

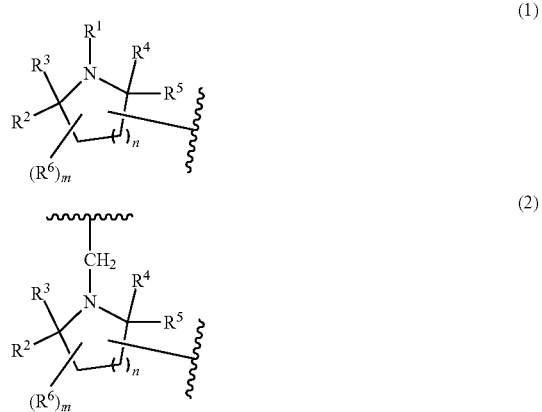

in Formulae (1) and (2), a wave line represents a linking site,
$R^1$ represents a hydrogen atom, an alkyl group, an alkoxy group, or an oxygen radical,
$R^2$ to $R^5$ each independently represent an alkyl group,
$R^6$ represents a substituent,
n represents an integer of 1 to 3,
in a case where n represents 1, m represents an integer of 0 to 3, in a case where n represents 2, m represents an integer of 0 to 5, and in a case where n represents 3, m represents an integer of 0 to 7, and in a case where m represents an integer of 2 or more, m R⁶'s may be the same as or different from each other.

<3> The resin composition according to <2>,
in which $R^2$ to $R^5$ each independently represent an alkyl group having 1 to 3 carbon atoms, and n represents 1 or 2.

<4> The resin composition according to <2> or <3>,
in which m represents 1 or more, and one or more R⁶'s among m R⁶'s represent a polymerizable group.

<5> The resin composition according to any one of <2> to <4>,
in which the hindered amine compound has two or more of the partial structures represented by Formula (1) or two or more of the partial structures represented by Formula (2) in one molecule.

<6> The resin composition according to any one of <2> to <4>,
in which the hindered amine compound is a polymer having the partial structure represented by Formula (1) or the partial structure represented by Formula (2).

<7> The resin composition according to <1>,
in which the hindered amine compound is a compound having a partial structure represented by the following Formula (1a) or a partial structure represented by the following Formula (2a),

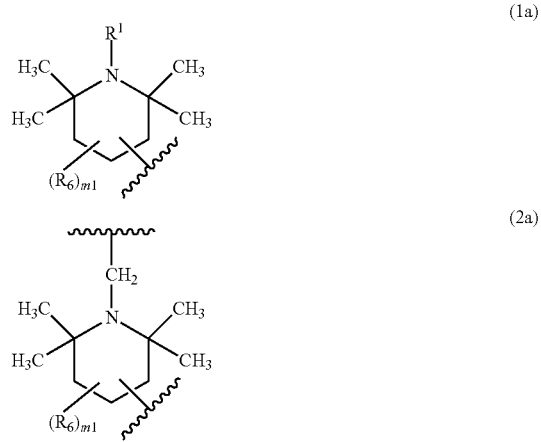

in Formulae (1a) and (2a), a wave line represents a linking site,
$R^1$ represents a hydrogen atom, an alkyl group, an alkoxy group, or an oxygen radical,
$R_6$ represents a substituent,
m1 represents an integer of 0 to 5, and
in a case where m1 represents an integer of 2 or more, m1 $R_6$'s may be the same as or different from each other.

<8> The resin composition according to any one of <1> to <7>,
in which the antioxidant further includes a compound that includes a phenol structure with a hydrocarbon group having one or more carbon atoms.

<9> The resin composition according to any one of <1> to <8>, further comprising:
a surfactant.

<10> The resin composition according to any one of <1> to <9>,
in which a weight-average molecular weight of the resin is 5000 to 40000.

<11> The resin composition according to any one of <1> to <10>,
in which the near infrared absorbing colorant is at least one selected from a cyanine compound, a squarylium compound, a pyrrolopyrrole compound, or an iminium compound.

<12> The resin composition according to any one of <1> to <11>, further comprising:
a curable compound.

<13> The resin composition according to any one of <1> to <11>, further comprising:
a radically polymerizable compound; and
a photoradical polymerization initiator.

<14> The resin composition according to any one of <1> to <13>, further comprising:
a silane coupling agent.

<15> A film which is formed of the resin composition according to any one of <1> to <14>.

<16> An optical filter comprising:
the film according to <15>.

<17> The optical filter according to <16>,
in which the optical filter is a near infrared cut filter or an infrared transmitting filter.

<18> A solid image pickup element comprising:
the film according to <15>.

<19> An image display device comprising:
the film according to <15>.

<20> An infrared sensor comprising:
the film according to <15>.

According to the present invention, it is possible to provide a resin composition having excellent storage stability with which a film having excellent thermal reliability can be formed. In addition, it is possible to provide a film, an optical filter, a solid image pickup element, an image display device, and an infrared sensor.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC).

In this specification, in a chemical formula, Me represents a methyl group, Et represents an ethyl group, Bu represents a butyl group, and Ph represents a phenyl group.

In this specification, near infrared light denotes light (electromagnetic wave) having a wavelength in a range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Resin Composition>

A resin composition according to an embodiment of the present invention comprises:
a near infrared absorbing colorant;
an antioxidant; and
a resin,
in which a content of the near infrared absorbing colorant is 5 mass % or higher with respect to a total solid content of the resin composition, and
the antioxidant includes a hindered amine compound.

The resin composition according to the embodiment of the present invention is a composition in which the content of the near infrared absorbing colorant is 5 mass % or higher with respect to the total solid content of the resin composition. This resin composition has excellent storage stability, and with the resin composition, a film having excellent thermal reliability can be formed. The reason why this effect is obtained is presumed to be as follows. In the resin composition, the hindered amine compound is likely to be present in the vicinity of the near infrared absorbing colorant and has a relatively bulky structure. Therefore, it is presumed that, due to steric hindrance caused by the bulky structure, aggregation or the like of the near infrared absorbing colorant can be suppressed and excellent storage stability can be achieved. In addition, it is presumed that the hindered amine compound is likely to be unevenly distributed in the vicinity of the near infrared absorbing colorant in the film, an attack of a thermally excited oxygen radical to the near infrared absorbing colorant can be effectively suppressed, and a film having excellent thermal reliability can be formed.

In addition, in a case where the resin composition according to the embodiment of the present invention further includes a surfactant, a film having higher thermal reliability is likely to be formed. By the resin composition according to the embodiment of the present invention including the surfactant, the surfactant is unevenly distributed on the film surface, and the hindered amine compound is likely to be present in the vicinity of the near infrared absorbing colorant in the film. Therefore, exposure of the near infrared absorbing colorant to the air interface can be suppressed by the surfactant unevenly distributed on the film surface, and an attack of a thermally excited oxygen radical to the near infrared absorbing colorant can be effectively suppressed by the hindered amine compound present in the vicinity of the near infrared absorbing colorant. Therefore, a film having higher thermal reliability can be formed.

In addition, in a case where the antioxidant used in the resin composition according to the embodiment of the present invention further includes a compound that includes a phenol structure with a hydrocarbon group having one or more carbon atoms in addition to the hindered amine compound, a film having higher thermal reliability can be formed. In addition, even in a case where the formed film is stored for a long period of time in a state where a heat treatment or the like is not performed thereon, the occurrence of foreign matter can be effectively suppressed. Further, in a case where the film is diced, the occurrence of defects or the like can be effectively suppressed. The detailed reason why this effect can be obtained is not clear but is presumed to be that, since the hindered amine compound and the compound having the above-described phenol structure are present together in the film, the crystallinity of the hindered amine compound deteriorates.

Hereinafter, each component of the resin composition according to the embodiment of the present invention will be described.

<<Antioxidant>>

The resin composition according to the embodiment of the present invention comprises an antioxidant. The antioxidant used in the resin composition according to the embodiment of the present invention includes a hindered amine compound. From the viewpoint of the thermal reliability of the obtained film, the pKb of the hindered amine compound is preferably 5 or lower, more preferably 4.5 or lower, and still more preferably 4 or lower. Here, the pKb refers to a base dissociation constant. The pKb of the hindered amine compound used in the present invention is a value calculated from the structural formula. In the present invention, in order to calculate pKb, software of pKa DB (Advanced Chemistry Development Inc.) is used.

It is preferable that the hindered amine compound used in the present invention is a compound having a partial structure represented by Formula (1) or a partial structure represented by Formula (2).

(1)

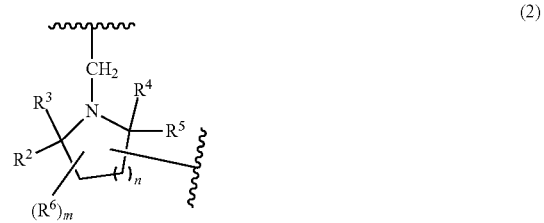

(2)

In Formulae (1) and (2), a wave line represents a linking site, $R^1$ represents a hydrogen atom, an alkyl group, an alkoxy group, or an oxygen radical, $R^2$ to $R^5$ each independently represent an alkyl group, $R^6$ represents a substituent, n represents an integer of 1 to 3, in a case where n represents 1, m represents an integer of 0 to 3, in a case where n represents 2, m represents an integer of 0 to 5, and in a case where n represents 3, m represents an integer of 0 to 7, and in a case where m represents an integer of 2 or more, m $R^6$'s may be the same as or different from each other.

The number of carbon atoms in the alkyl group represented by $R^1$ is preferably 1 to 15, more preferably 1 to 10, and still more preferably 1 to 5. The alkyl group may be linear, branched, or cyclic and is preferably linear or branched and more preferably linear. The alkyl group may have a substituent. Examples of the substituent include groups described below regarding a substituent T and a polymerizable group. Examples of the polymerizable group include a (meth)allyl group, a (meth)acryloyl group, a (meth)acryloyloxy group, an epoxy group, and an oxetane group.

The number of carbon atoms in the alkoxy group represented by $R^1$ is preferably 1 to 15, more preferably 1 to 10, and still more preferably 1 to 5. The alkoxy group may be linear, branched, or cyclic and is preferably linear or branched and more preferably linear. The alkoxy group may have a substituent. Examples of the substituent include groups described below regarding the substituent T and a polymerizable group. Examples of the polymerizable group include a (meth)allyl group, a (meth)acryloyl group, a (meth)acryloyloxy group, an epoxy group, and an oxetane group.

In Formula (1), $R^1$ represents preferably a hydrogen atom, an alkyl group, or an alkoxy group, more preferably a hydrogen atom or an alkyl group, still more preferably a hydrogen atom or an alkyl group having 1 to 15 carbon atoms, still more preferably a hydrogen atom or an alkyl group having 1 to 10 carbon atoms, and most preferably a hydrogen atom or an alkyl group having 1 to 5 carbon atoms.

In Formulae (1) and (2), $R^2$ to $R^5$ each independently represent an alkyl group. $R^2$ to $R^5$ each independently represent preferably an alkyl group having 1 to 3 carbon atoms, more preferably an alkyl group having 1 or 2 carbon atoms, and still more preferably a methyl group.

In Formulae (1) and (2), $R^6$ represents a substituent. Examples of the substituent include groups described below regarding the substituent T and a polymerizable group. Examples of the polymerizable group include a (meth)allyl group, a (meth)acryloyl group, a (meth)acryloyloxy group, an epoxy group, and an oxetane group. In a case where m represents 1 or more, it is preferable that one or more $R^6$'s among m $R^6$'s represent a polymerizable group. In addition, as the polymerizable group, a (meth)allyl group, a (meth)acryloyl group, or a (meth)acryloyloxy group is preferable, a (meth)acryloyl group or a (meth)acryloyloxy group is more preferable, and a (meth)acryloyloxy group is still more preferable. In this aspect, the temporal stability of the resin composition can be improved, and the thermal reliability of the obtained film can be further improved. The reason why this effect can be obtained is presumed to be that desorption of the antioxidant from the heat caused by heating during film formation can be effectively suppressed.

In Formulae (1) and (2), n represents an integer of 1 to 3, preferably 1 or 2, and more preferably 1.

It is preferable that the hindered amine compound is a compound having a partial structure represented by Formula (1a) or a partial structure represented by Formula (2a).

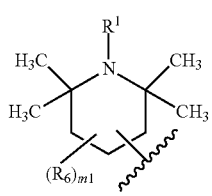

(1a)

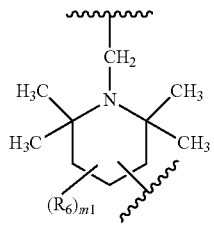

(2a)

In Formulae (1a) and (2a), a wave line represents a linking site, $R^1$ represents a hydrogen atom, an alkyl group, an alkoxy group, or an oxygen radical, $R_6$ represents a substituent, m1 represents an integer of 0 to 5, and in a case where m1 represents an integer of 2 or more, m1 $R_6$'s may be the same as or different from each other.

$R^1$ in Formula (1a) has the same definition and the same preferable range as $R^1$ in Formula (1). $R_6$ in Formulae (1a) and (2a) has the same definition and the same preferable range as $R^6$ in Formulae (1) and (2).

Preferable examples of the hindered amine compound include a compound represented by Formula (3).

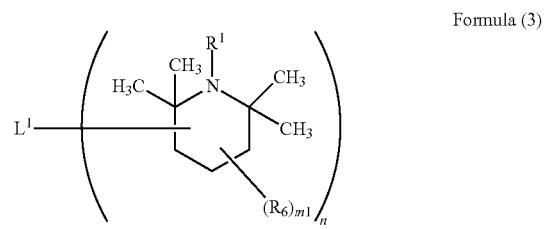

Formula (3)

$R^1$ represents a hydrogen atom, an alkyl group, an alkoxy group, or an oxygen radical. $R_6$ represents a substituent. m1 represents an integer of 0 to 5, and in a case where m1 represents an integer of 2 or more, m1 $R_6$'s may be the same as or different from each other. n represents an integer of 1 or more, in a case where n represents 1, $L^1$ represents a hydrogen atom or a substituent, and in a case where n represents 2 or more, $L^1$ represents an n-valent linking group.

$R^1$ to $R_6$ in Formula (3) have the same definitions and the same preferable ranges as $R^1$ and $R^6$ in Formula (1).

In Formula (3), n represents an integer of 1 or more, preferably an integer of 2 or more, more preferably an integer of 3 or more, and still more preferably an integer of 4 or more. The upper limit is, for example, 8 or lower. In addition, in a case where n in Formula (3) represents 1, m1 represents an integer of 1 or more, and it is preferable that one or more $R_6$'s among m1 $R_6$'s represent a polymerizable group.

In a case where n in Formula (3) represents 1, $L^1$ represents a hydrogen atom or a substituent. Examples of the substituent represented by $L^1$ include groups described below regarding the substituent T and a polymerizable group.

In a case where n in Formula (3) represents 2 or more, $L^1$ represents an n-valent linking group. Examples of the n-valent group represented by $L^1$ include a hydrocarbon group, a heterocyclic group, —O—, —S—, —NR—, —CO—, —COO—, —OCO—, —SO$_2$—, a group including a combination of the above-described groups. R represents a hydrogen atom, an alkyl group, or an aryl group.

The hydrocarbon group may be an aliphatic hydrocarbon group or an aromatic hydrocarbon group. In addition, the aliphatic hydrocarbon group may be cyclic or acyclic. The aliphatic hydrocarbon group may be a saturated aliphatic hydrocarbon group or an unsaturated aliphatic hydrocarbon group. The hydrocarbon group may have a substituent or may be unsubstituted. Examples of the substituent include the substituent T described below. In addition, the cyclic aliphatic hydrocarbon group and the aromatic hydrocarbon group may be a monocycle or a fused ring.

The heterocyclic group may be a monocycle or a fused ring. Examples of the heteroatom constituting the heterocyclic group include a nitrogen atom, an oxygen atom, and a sulfur atom.

Specific examples of the n-valent group include a group (in which a ring structure may be formed) including one of the following structural unit or a combination of two or more of the following structural units. R represents a hydrogen atom, an alkyl group, or an aryl group. In the following formulae, * represents a bonding position.

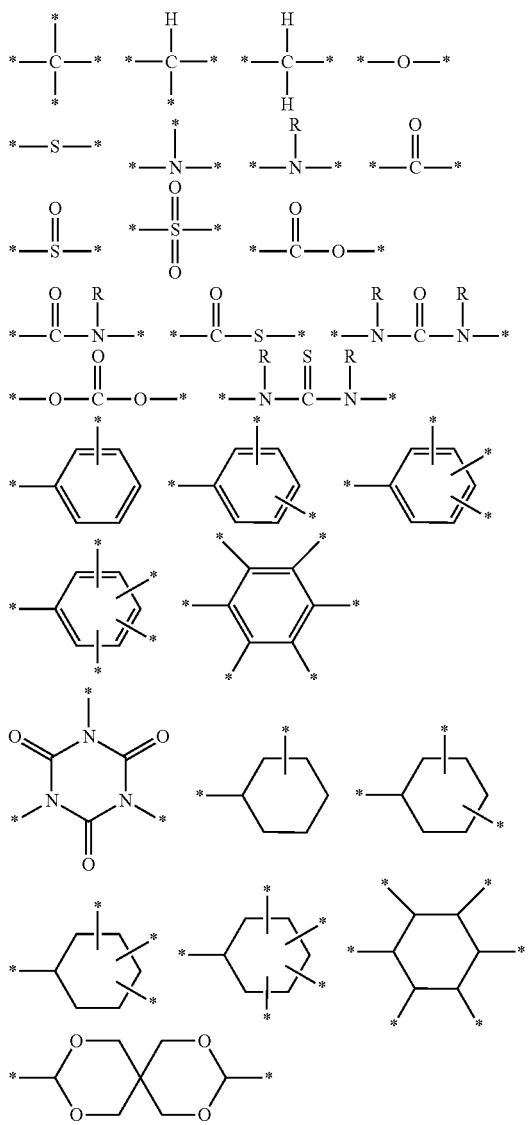

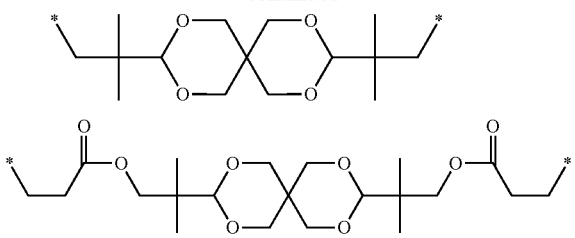

The molecular weight of the compound represented by Formula (3) is preferably 100 to 5000. The upper limit is preferably 4000 or lower, more preferably 3000 or lower, still more preferably 2000 or lower, and still more preferably 1000 or lower. The lower limit is preferably 150 or higher and more preferably 200 or higher.

From the viewpoints of the storage stability of the resin composition and the thermal reliability of the obtained film, the hindered amine compound is preferably a compound having two or more partial structures represented by Formula (1) or two or more partial structures represented by Formula (2) in one molecule, more preferably a compound having three or more partial structures represented by Formula (1) or three or more partial structures represented by Formula (2) in one molecule, and still more preferably a compound having four or more partial structures represented by Formula (1) or four or more partial structures represented by Formula (2) in one molecule. Examples of the above-described compound include a compound in which n represents an integer of 2 or more among the compounds represented by Formula (3).

It is also preferable that the hindered amine compound is a polymer (hereinafter, also referred to as "polymer type hindered amine compound") having the partial structure represented by Formula (1) or the partial structure represented by Formula (2). Examples of the polymer type hindered amine compound include a polymer having a partial structure represented by Formula (2) in a polymer main chain and a polymer having a partial structure represented by Formula (1) in a polymer side chain. Examples of the polymer having a partial structure represented by Formula (2) in a polymer main chain include a polymer having the following structure. Examples of a commercially available product include TINUVIN 622 SF (manufactured by BASF SE).

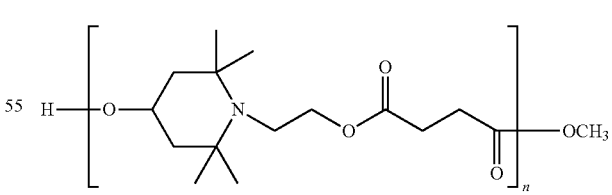

Examples of the polymer having a partial structure represented by Formula (1) in a polymer side chain include a polymer having the following structure. Examples of a commercially available product include CHIMASSORB 2020 FDL and CHIMASSORB 944 FDL (manufactured by BASF SE) and ADEKA STAB LA-63P and LA-68 (manufactured by Adeka Corporation).

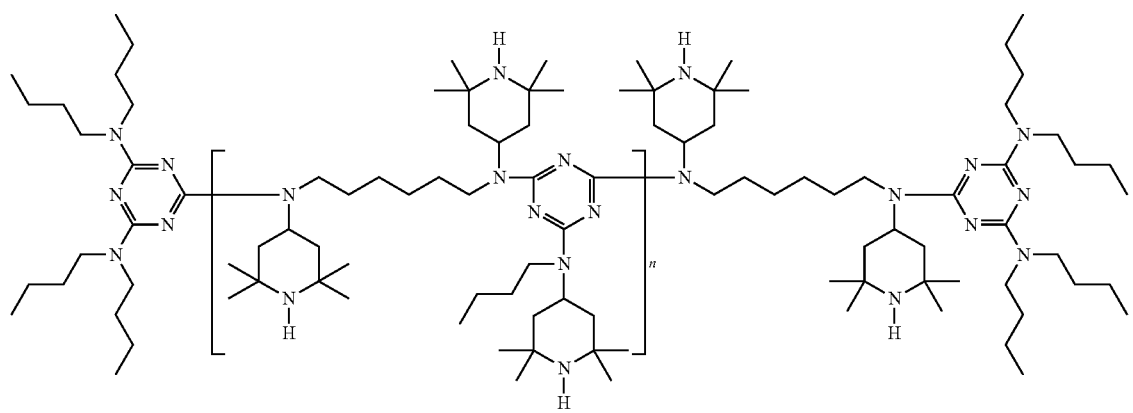
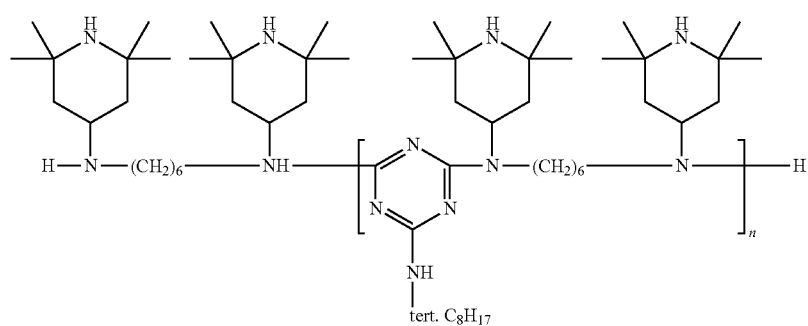
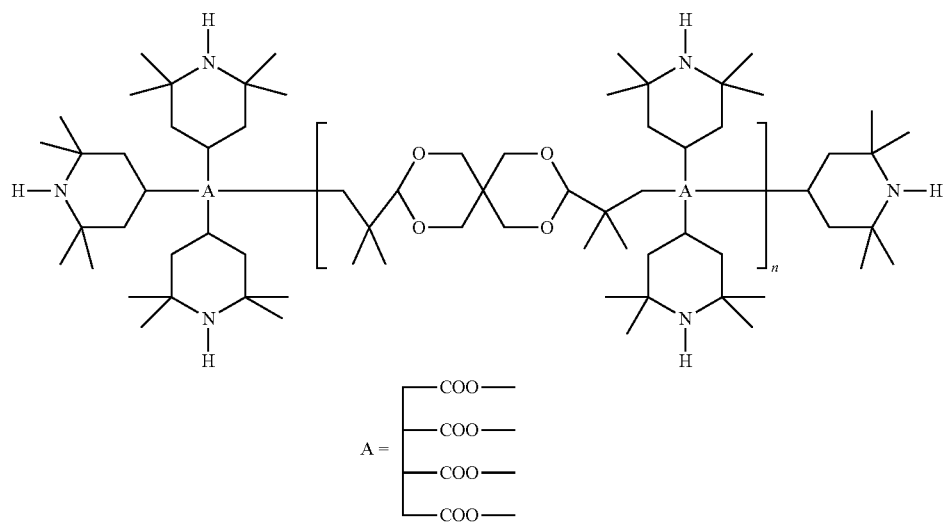

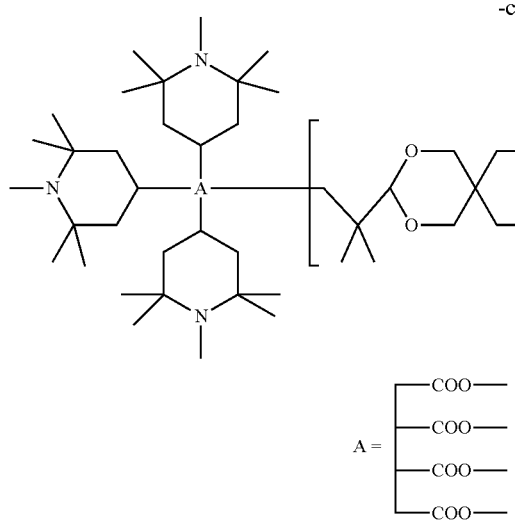

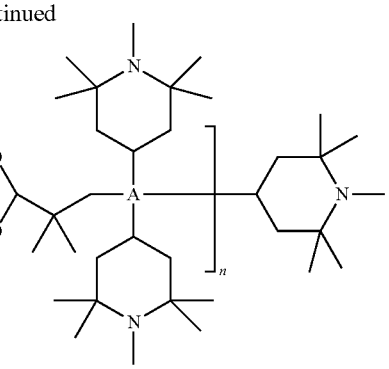

The weight-average molecular weight of the polymer type hindered amine compound is preferably 1500 or higher, more preferably 2000 or higher, and still more preferably 3000 or higher. The upper limit is preferably 100000 or lower, more preferably 50000 or lower, still more preferably 30000 or lower, still more preferably 25000 or lower, still more preferably 20000 or lower, still more preferably 10000 or lower, and most preferably 5000 or lower. In a case where the weight-average molecular weight of the polymer type hindered amine compound is in the above-described range, desorption of the antioxidant from the film caused by heating during film formation can be effectively suppressed. Further, compatibility with a resin or the like other than the antioxidant used in the resin composition is excellent.

As the hindered amine compound having a partial structure represented by Formula (1a) or a partial structure represented by Formula (2a), a commercially available product can also be used. In addition to the above-described products, representative examples which are available as a commercially available product include ADEKA STAB LA-52, LA-57, LA-72, LA-77Y, LA-77Q LA-81, LA-82, LA-87, LA-402AF, and LA-502XP (manufactured by Adeka Corporation) and TINUVIN 765, TINUVIN 770 DF, TINUVIN XT 55 FB, TINUVIN 111 FDL, TINUVIN 783 FDL, and TINUVIN 791 FB (manufactured by BASF SE). These examples can be preferably used.

In addition to the partial structure represented by Formula (1a) or the partial structure represented by Formula (2a), the hindered amine compound used in the present invention may further include a phenol structure with a hydrocarbon group having one or more carbon atoms in one molecule. Examples of the phenol structure include a structure represented by Formula (A-1) described below. In this aspect, excellent thermal reliability can be obtained with a small amount of mixing amount, and a reduction in costs can be expected. Examples of the compound include a compound having the following structure. Examples of a commercially available product include TINUVIN PA144 (manufactured by BASF SE).

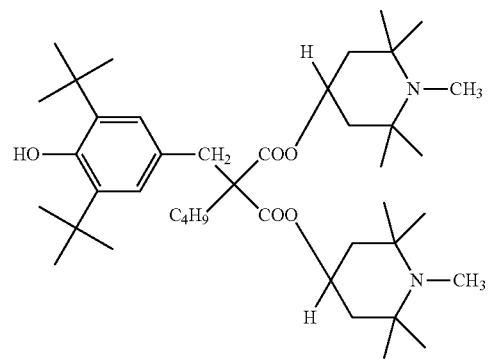

As the antioxidant used in the resin composition according to the embodiment of the present invention, an antioxidant (also referred to as "other antioxidant") other than the above-described hindered amine compound can be further used. Examples of the other antioxidant include a compound that includes a phenol structure with a hydrocarbon group having one or more carbon atoms, an N-oxide compound, a piperidine-1-oxyl free-radical compound, a pyrrolidine 1-oxyl free-radical compound, a N-nitrosophenylhydroxylamine compound, a diazonium compound, a phosphorus compound, and a sulfur compound. Specific examples of these compounds include compounds described in paragraphs "0034" to "0041" of JP2014-032380A, the content of which is incorporated herein by reference. Representative examples which are available as a commercially available product of the phosphorus compound include ADEKA STAB 2112, PEP-8, PEP-24G PEP-36, PEP-45, and HP-10 (manufactured by Adeka Corporation), and IRGAFOS 38, 168 and P-EPQ (manufactured by BASF SE). Representative examples which are available as a commercially available product of the sulfur compound include SUMILIZER MB (manufactured by Sumitomo Chemical Co., Ltd.) and ADEKA STAB AO-412S (manufactured by Adeka Corporation).

In the present invention, it is preferable that a compound (hereinafter, also referred to as "phenol antioxidant") that includes a phenol structure with a hydrocarbon group having one or more carbon atoms is used as the other antioxidant.

In this aspect, the thermal reliability of the obtained film tends to be further improved. In addition, even in a case where the formed film is stored for a long period of time in a state where a heat treatment or the like is not performed thereon, the occurrence of foreign matter can be effectively suppressed. Further, in a case where the film is diced, the occurrence of defects or the like can be effectively suppressed. Here, the phenol structure with a hydrocarbon group having one or more carbon atoms refers to a structure in which each of a hydroxy group and a hydrocarbon group having one or more carbon atoms is bonded to a benzene ring.

In the phenol structure with a hydrocarbon group having one or more carbon atoms in the phenol antioxidant, two or more hydroxy groups may be bonded to one benzene ring. However, a structure in which one hydroxy group is bonded to one benzene ring is preferable. In addition, the number of hydrocarbon groups having one or more carbon atoms bonded to one benzene ring is preferably 1 to 4, more preferably 1 to 3, and still more preferably 2 or 3. In addition, in the phenol structure with a hydrocarbon group having one or more carbon atoms, it is preferable that a hydroxy group and a hydrocarbon group having one or more carbon atoms are bonded to a benzene ring to be adjacent to each other.

The number of carbon atoms in the hydrocarbon group is 1 or more, preferably 1 to 30, more preferably 1 to 20, still more preferably 1 to 10, and still more preferably 1 to 5.

The hydrocarbon group is preferably an aliphatic hydrocarbon group and more preferably a saturated aliphatic hydrocarbon group. In addition, the aliphatic hydrocarbon group may be a linear, branched, or cyclic aliphatic hydrocarbon group but is preferably a branched aliphatic hydrocarbon group. Specifically, the hydrocarbon group is preferably a linear, branched, or cyclic alkyl group and more preferably a branched alkyl group. Specific examples of the hydrocarbon group include a methyl group, an ethyl group, a propyl group, an iso-propyl group, a butyl group, an iso-butyl group, and a tert-butyl group. The hydrocarbon group may have a substituent but is preferably unsubstituted. Examples of the substituent include the substituent T described below.

In the present invention, the phenol antioxidant may be a compound that includes only one phenol structure with a hydrocarbon group having one or more carbon atoms in one molecule. However, due to the reason that the approach capability to the near infrared absorbing colorant is high, it is preferable that the antioxidant is a compound that includes two or more phenol structures with a hydrocarbon group having one or more carbon atoms in one molecule. The upper limit of phenol structures with a hydrocarbon group having one or more carbon atoms in one molecule is preferably 8 or less and more preferably 6 or less.

The molecular weight of the phenol antioxidant is preferably 100 to 2500, more preferably 300 to 2000, and still more preferably 500 to 1500. According to this aspect, the sublimability (residual rate during film formation) of the phenol antioxidant is excellent, and the transferability of the phenol antioxidant in the film is excellent.

The phenol antioxidant is preferably a compound having a structure represented by the following Formula (A-1) and more preferably a compound having two or more structures represented by Formula (A-1) in one molecule. The upper limit of the structures represented by Formula (A-1) in one molecule is preferably 8 or less and more preferably 6 or less.

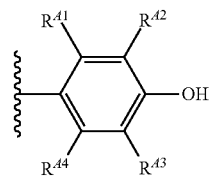

(A-1)

In the formula, $R^{41}$ to $R^{44}$ each independently represent a hydrogen atom or a substituent, at least one of $R^{41}$, . . . , or $R^{44}$ represents a hydrocarbon group having one or more carbon atoms, and a wave line represents a linking site.

Examples of the substituent represented by $R^{41}$ to $R^{44}$ include the substituent T described below. In Formula (A-1), at least one of $R^{41}$, . . . , or $R^{44}$ represents a hydrocarbon group having one or more carbon atoms. A preferable range of the hydrocarbon group is the same as the above-described range. It is preferable that at least one of $R^{42}$ or $R^{43}$ in Formula (A-1) represents a hydrocarbon group having one or more carbon atoms, it is more preferable that $R^{42}$ and $R^{43}$ represent a hydrocarbon group having one or more carbon atoms, it is still more preferable that $R^{42}$ and $R^{43}$ represent a hydrocarbon group having one or more carbon atoms and at least one of $R^{42}$ or $R^{43}$ represents a branched alkyl group, it is still more preferable that one of $R^{42}$ or $R^{43}$ represents a branched alkyl group and the other one of $R^{42}$ or $R^{43}$ represents a linear alkyl group or a branched alkyl group, it is still more preferable that one of $R^{42}$ or $R^{43}$ represents a branched alkyl group and the other one of $R^{42}$ or $R^{43}$ represents a linear alkyl group, and it is most preferable that one of $R^{42}$ or $R^{43}$ represents a tert-butyl group and the other one of $R^{42}$ or $R^{43}$ represents a methyl group. With the structure in which one of $R^{42}$ or $R^{43}$ represents a branched alkyl group and the other one of $R^{42}$ or $R^{43}$ represents a linear alkyl group or a branched alkyl group, an effect of improving the heat stability of the film or suppressing the aggregation of the near infrared absorbing colorant can be expected.

In the present invention, it is preferable that the phenol antioxidant is a compound represented by Formula (A-2).

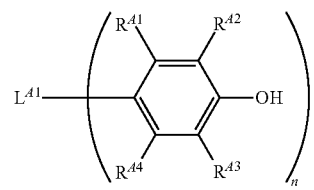

(A-2)

In the formula, $R^{41}$ to $R^{44}$ each independently represent a hydrogen atom or a substituent, and at least one of $R^{41}$, . . . , or $R^{44}$ represents a hydrocarbon group having one or more carbon atoms. n represents an integer of 1 or more, in a case where n represents 1, $L^{41}$ represents a hydrogen atom or a substituent, and in a case where n represents 2 or more, $L^{41}$ represents an n-valent linking group.

$R^{41}$ to $R^{44}$ in Formula (A-2) have the same definitions and the same preferable ranges as $R^{41}$ to $R^{44}$ in Formula (A-1).

In a case where n in Formula (A-2) represents 1, $L^{41}$ represents a hydrogen atom or a substituent. Examples of the substituent represented by $L^{41}$ include groups described below regarding the substituent T.

In a case where n in Formula (A-2) represents 2 or more, $L^{41}$ represents an n-valent linking group. Examples of the n-valent group represented by $L^{41}$ include a hydrocarbon group, a heterocyclic group, —O—, —S—, —NR—, —CO—, —COO—, —OCO—, —SO$_2$—, a group including a combination of the above-described groups. R represents a hydrogen atom, an alkyl group, or an aryl group. Specific examples of the n-valent group represented by $L^{41}$ include an n-valent group represented by $L^1$ in Formula (3).

In Formula (A-2), n represents an integer of 1 or more, preferably an integer of 1 to 8, more preferably an integer of 2 to 6, and still more preferably an integer of 2 to 4.

Specific examples of the phenol antioxidant include the following compounds. In addition, as the phenol antioxidant, a commercially available product may also be used. Representative examples which are available as the commercially available product include ADEKA STAB AO-20, 30, 40, 50, 60, 70, and 80 (all of which are manufactured by Adeka Corporation).

AO-3
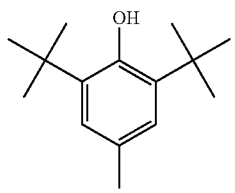

AO-4
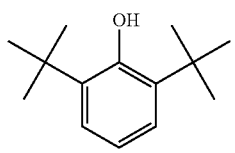

AO-6
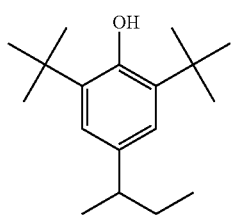

AO-7
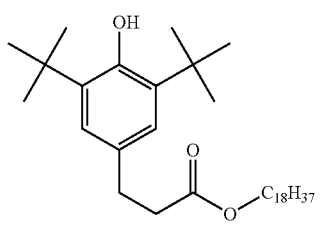

AO-8
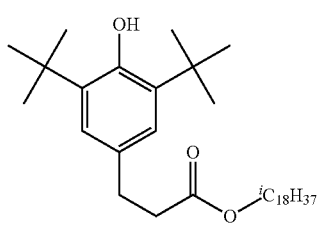

-continued

AO-9
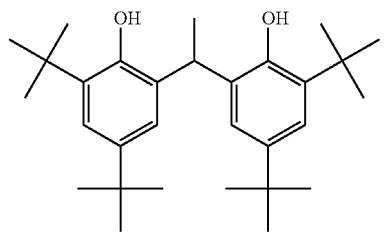

AO-10
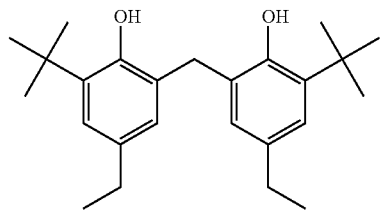

AO-11
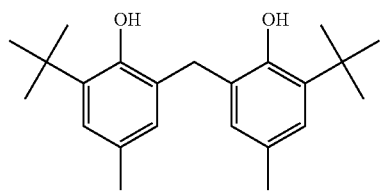

AO-12
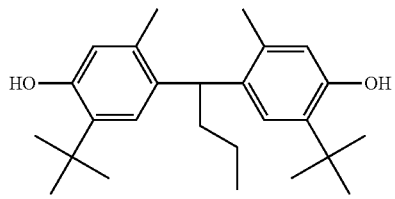

AO-13
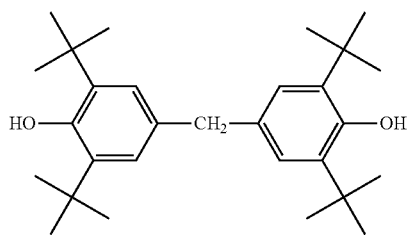

AO-14
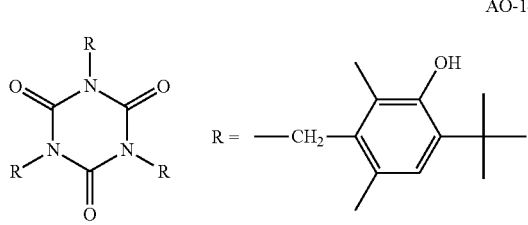

AO-15
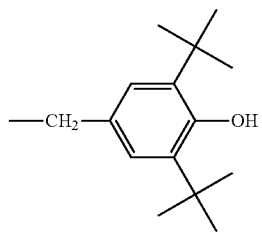

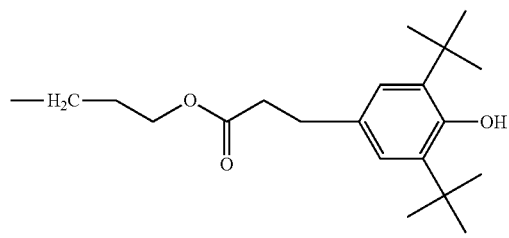 AO-16
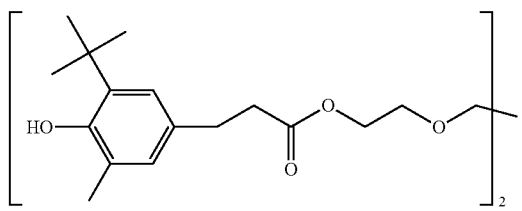 AO-22
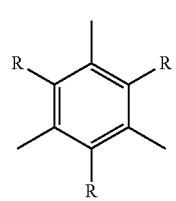 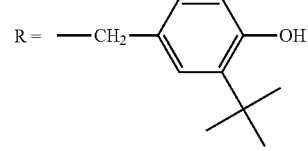 AO-17
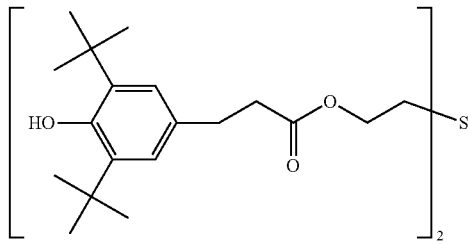 AO-23
AO-18
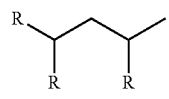 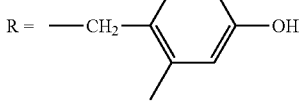
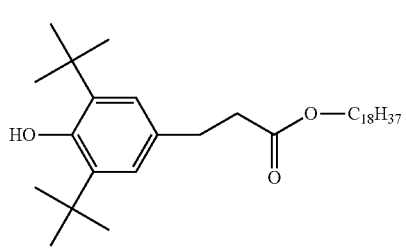 AO-24
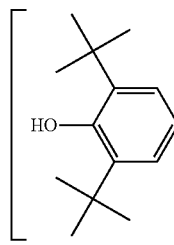 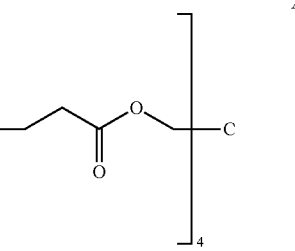 AO-19
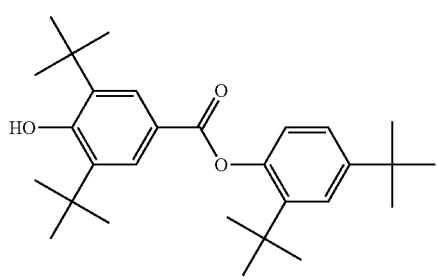 AO-25
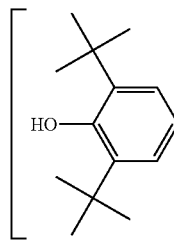 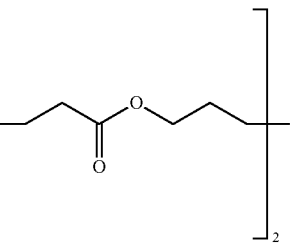 AO-20
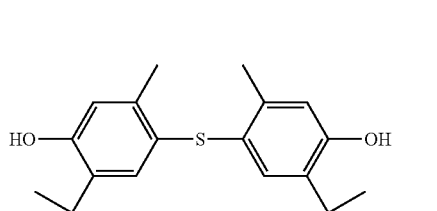 AO-26
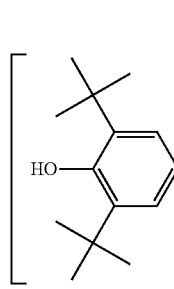 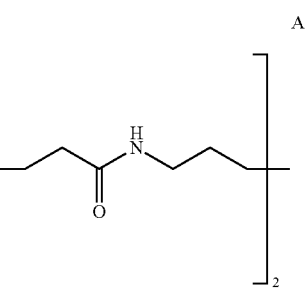 AO-21
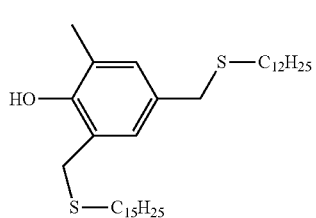 AO-27

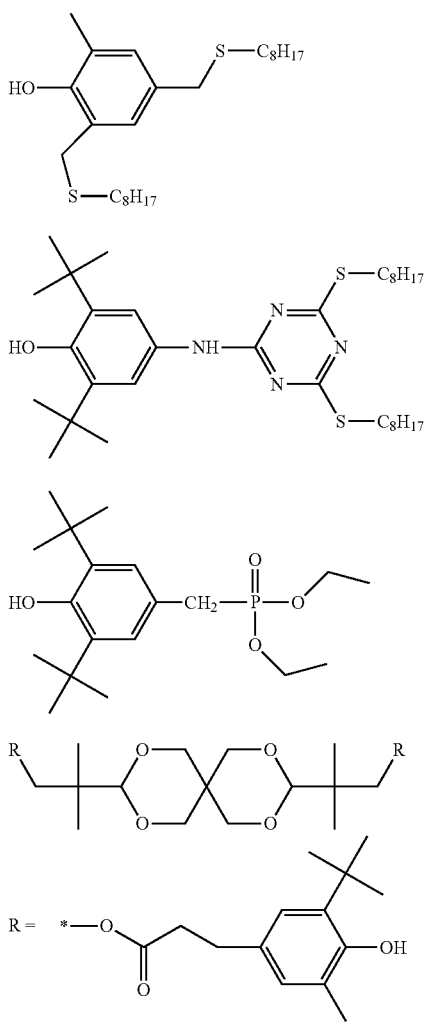

In the resin composition according to the embodiment of the present invention, the content of the antioxidant is preferably 0.01 to 10 mass % with respect to the total solid content of the resin composition. The upper limit is preferably 8 mass % or lower, more preferably 5 mass % or lower, and still more preferably 3 mass % or lower. The lower limit is preferably 0.1 mass % or higher.

In addition, in the resin composition according to the embodiment of the present invention, the content of the hindered amine compound is preferably 0.01 to 10 mass % with respect to the total solid content of the resin composition. The upper limit is preferably 8 mass % or lower, more preferably 5 mass % or lower, and still more preferably 3 mass % or lower. The lower limit is preferably 0.1 mass % or higher.

In addition, the content of the polymer type hindered amine compound or the hindered amine compound having a polymerizable group is preferably 10 to 100 mass % with respect to the total mass of the hindered amine compound. The lower limit is preferably 50 mass % or higher. In a case where the content of the polymer type hindered amine compound or the hindered amine compound having a polymerizable group is in the above-described range, a film having higher thermal reliability is likely to be formed.

In addition, in a case where the polymer type hindered amine compound and the hindered amine compound having a polymerizable group are used in combination, the total content of the polymer type hindered amine compound and the hindered amine compound having a polymerizable group is preferably 10 to 100 mass % with respect to the total mass of the hindered amine compound. The lower limit is preferably 50 mass % or higher.

In addition, the content of the hindered amine compound is preferably 0.03 to 100 parts by mass with respect to 100 parts by mass of the near infrared absorbing colorant. The upper limit is preferably 80 parts by mass or less, more preferably 50 parts by mass or less, and still more preferably 10 parts by mass or less. The lower limit is preferably 0.1 parts by mass or more. In a case where the ratio between the hindered amine compound and the near infrared absorbing colorant is in the above-described range, the storage stability of the resin composition and the thermal reliability of the obtained film can be simultaneously improved on a high level.

In addition, in the resin composition according to the embodiment of the present invention, the content of the hindered amine compound is preferably 10 mass % or higher, more preferably 20 mass % or higher, and still more preferably 30 mass % or higher with respect to the total mass of the antioxidant.

In addition, in a case where the resin composition according to the embodiment of the present invention further includes the phenol antioxidant as the antioxidant, the content of the phenol antioxidant is preferably 10 to 90 parts by mass with respect to 100 parts by mass of the hindered amine compound. The upper limit is preferably 80 parts by mass or less, more preferably 70 parts by mass or less, and still more preferably 60 parts by mass or less. The lower limit is preferably 30 parts by mass or more. In a case where the ratio between the hindered amine compound and the phenol antioxidant is in the above-described range, the thermal reliability of the obtained film can be further improved.

<<Near Infrared Absorbing Colorant>>

The resin composition according to the embodiment of the present invention includes a near infrared absorbing colorant. The near infrared absorbing colorant may be a pigment (also referred to as "near infrared absorbing pigment") or a dye (also referred to as "near infrared absorbing dye"). In addition, it is preferable that the near infrared absorbing dye and the near infrared absorbing pigment are used in combination. In a case where the near infrared absorbing dye and the near infrared absorbing pigment are used in combination, a mass ratio near infrared absorbing dye:near infrared absorbing pigment of the near infrared absorbing dye to the near infrared absorbing pigment is preferably 99.9:0.1 to 0.1:99.9, more preferably 99.9:0.1 to 10:90, and still more preferably 99.9:0.1 to 20:80.

In the present invention, a solubility of the near infrared absorbing dye in 100 g of at least one solvent selected from cyclopentanone, cyclohexanone, or dipropylene glycol monomethyl ether at 23° C. is preferably 1 g or higher, more preferably 2 g or higher, and still more preferably 5 g or higher. In addition, a solubility of the near infrared absorbing pigment in 100 g of each solvent of cyclopentanone, cyclohexanone, or dipropylene glycol monomethyl ether at 23° C. is preferably lower than 1 g, more preferably 0.1 g or lower, and still more preferably 0.01 g or lower.

It is preferable that the near infrared absorbing colorant is a compound that includes a π-conjugated plane having a monocyclic or fused aromatic ring. Due to an interaction between aromatic rings on the π-conjugated plane of the near infrared absorbing colorant, a J-aggregate of the near infrared absorbing colorant is likely to be formed during the formation of a film, and a film having excellent spectral characteristics in a near infrared range can be formed.

The number of atoms constituting the π-conjugated plane included in the near infrared absorbing colorant other than hydrogen is preferably 14 or more, more preferably 20 or more, still more preferably 25 or more, and still more preferably 30 or more. For example, the upper limit is preferably 80 or less and more preferably 50 or less.

The number of monocyclic or fused aromatic rings in the π-conjugated plane included in the near infrared absorbing colorant is preferably 2 or more, more preferably 3 or more, still more preferably 4 or more, and still more preferably 5 or more. The upper limit is preferably 100 or less, more preferably 50 or less, and still more preferably 30 or less. Examples of the aromatic ring include a benzene ring, a naphthalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

The near infrared absorbing colorant is preferably a compound that has at least one group selected from an acid group or a basic group and more preferably a compound having an acid group. In a case where the compound having an acid group or a basic group is used as the near infrared absorbing colorant, it becomes easy to form a film having excellent solvent resistance.

Examples of the acid group include a carboxyl group, a sulfo group, a phosphate group, a carboxylic acid amide group, a sulfonic acid amide group, and an imide acid group. Among these, a carboxylic acid amide group, a sulfonic acid amide group, and an imide acid group are preferable and a carboxylic acid amide group and a sulfonic acid amide group are more preferable from a reason that a film having excellent solvent resistance is easily formed. As the carboxylic acid amide group, a group represented by —NHCOR$^{a1}$ is preferable. As the sulfonic acid amide group, a group represented by —NHSO$_2$R$^{a2}$ is preferable. As the imide acid group, a group represented by —SO$_2$NHSO$_2$R$^{a3}$, —CONHSO$_2$R$^{a4}$, —CONHCOR$^{a5}$, or —SO$_2$NHCOR$^{a6}$ is preferable. R$^{a1}$ to R$^{a6}$ each independently represent a hydrocarbon group or a heterocyclic group. Examples of the hydrocarbon group include an alkyl group, an alkenyl group, an alkynyl group, and an aryl group. The hydrocarbon group and the heterocyclic group represented by R$^{a1}$ to R$^{a6}$ may further have a substituent. Examples of the substituent which may be further included include a group described in the following substituent T. Among these, a halogen atom is preferable and a fluorine atom is more preferable. In particular, as the carboxylic acid amide group, a fluoroalkyl-carboxylic acid amide group (a group that has a structure in which R$^{41}$ in the formula represents a fluoroalkyl group (an alkyl group in which at least one hydrogen atom is substituted with a fluorine atom)) is preferable and a perfluoroalkyl sulfonic acid amide group (a group that has a structure in which R$^{a1}$ in the formula represents a perfluoroalkyl group (an alkyl group in which a hydrogen atom is substituted with a fluorine atom)) is more preferable. In addition, as the sulfonic acid amide group, a perfluoroalkyl sulfonic acid amide group (a group that has a structure in which R$^{az}$ in the formula represents a fluoroalkyl group (an alkyl group in which at least one hydrogen atom is substituted with a fluorine atom)) is preferable and a perfluoroalkyl sulfonic acid amide group (a group that has a structure in which R$^{a2}$ in the formula represents a perfluoroalkyl group (an alkyl group in which a hydrogen atom is substituted with a fluorine atom)) is more preferable.

Examples of the basic group include a tertiary amino group, a secondary amino group, a primary amino group, and an ammonium group.

It is preferable that the near infrared absorbing colorant is a compound that has an absorption maximum in a wavelength range of 700 to 1300 nm and in which a ratio Amax/A550 of an absorbance Amax at the absorption maximum to an absorbance A550 at a wavelength of 550 nm is 50 to 500. Amax/A550 in the near infrared absorbing colorant is preferably 70 to 450 and more preferably 100 to 400. According to this aspect, a film having excellent visible transparency and near infrared blocking properties can be easily manufactured. The absorbance A550 at a wavelength of 550 nm and the absorbance Amax at the absorption maximum are values obtained from the absorption spectrum of the near infrared absorbing colorant in the solution.

In the present invention, as the near infrared absorbing colorant, at least two compounds having different absorption maximums are preferably used. According to this aspect, the waveform of the absorption spectrum of the film is wider than that in a case where one near infrared absorbing colorant is used, and the film can block near infrared light in a wide wavelength range. In a case where at least two compounds having different absorption maximums are used, it is preferable that the compounds include at least a first near infrared absorbing colorant having an absorption maximum in a wavelength range of 700 to 1300 nm, and a second near infrared absorbing colorant having an absorption maximum in a wavelength range of 700 to 1300 nm which is shorter than the absorption maximum of the first near infrared absorbing colorant, and a difference between the absorption maximum of the first near infrared absorbing colorant and the absorption maximum of the second near infrared absorbing colorant is 1 to 150 nm.

In the present invention, as the near infrared absorbing colorant, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, or an iminium compound is more preferable, at least one selected from a pyrrolopyrrole compound, a cyanine compound, or a squarylium compound is still more preferable, at least one selected from a pyrrolopyrrole compound or a squarylium compound is still more preferable, and a pyrrolopyrrole compound is most preferable. Examples of the iminium compound include a compound described in JP2008-528706A, the content of which is incorporated herein by reference. Examples include N,N,N',N'-tetrakis(p-di(n-butyl)aminophenyl)-p-phenylene diimmonium bis (pentafluorophenyl)borate and N,N,N',N'-tetrakis(p-di(n-butyl)aminophenyl)-p-phenylene diimmonium hexafluoroantimonate. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in a paragraph "0093" of JP2012-077153A, the content of which is incorporated herein by reference. In addition, as the cyanine compound, the phthalocyanine compound, the naphthalocyanine compound, the iminium compound, or the squarylium compound, for example, a compound described in paragraphs "0010" to "0081" of JP2010-111750A may be used, the content of which is incorporated herein by reference. In addition, the details of the cyanine compound can be found in "Functional Colorants by Makoto Okawara, Masaru Matsuoka, Teijiro Kitao, and Tsuneoka Hirashima, published by Kodansha Scientific Ltd.", the content of which is incorporated herein by reference. In addition, a compound described in paragraphs JP2016-146619A can also be used as the near infrared absorbing colorant, the content of which is incorporated herein by reference. In addition, it is also preferable that compounds having the following structures are used as the near infrared absorbing colorant.

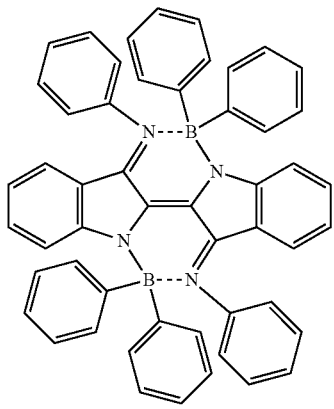

As the pyrrolopyrrole compound, a compound represented by Formula (PP) is preferable.

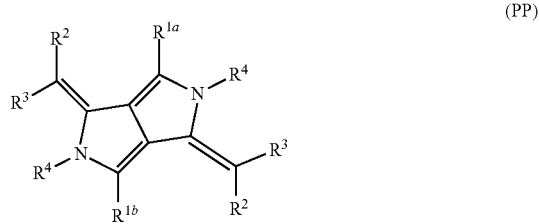

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may form a covalent bond or a coordinate bond with at least one selected from $R^{1a}$, $R^{1b}$, or $R^3$, and $R^{4A}$ and $R^{4B}$ each independently represent a substituent. $R^{4A}$ and $R^{4B}$ may be bonded to each other to form a ring. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

In Formula (PP), $R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ to $R^{1b}$ may have a substituent or may be unsubstituted. Examples of the substituent include substituents described in paragraphs "0020" to "0022" of 2009-263614A and the following substituent T.

(Substituent T)

The substituent T includes an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a hydroxy group, a carboxyl group, a sulfo group, a phosphate group, a carboxylic acid amide group, a sulfonic acid amide group, an imide acid group, a mercapto group, a halogen atom, a cyano group, an alkylsulfino group, an arylsulfino group, a hydrazino group, an imino group, and a heteroaryl group (preferably having 1 to 30 carbon atoms). In a case where the above-described groups can be further substituted, the groups may further have a substituent. Examples of the substituent include the groups described regarding the substituent T.

Specific examples of the group represented by $R^{1a}$ and $R^{1b}$ include an aryl group which has an alkoxy group as a substituent, an aryl group which has a hydroxy group as a substituent, and an aryl group which has an acyloxy group as a substituent.

In Formula (PP), $R^2$ and $R^3$ each independently represent a hydrogen atom or a substituent. Examples of the substituent include the above-described substituent T. It is preferable that at least one of R² or R³ represents an electron-withdrawing group. A substituent having a positive Hammett's substituent constant σ value (sigma value) acts as an electron-withdrawing group. Here, the substituent constant obtained by Hammett's rule includes a σp value and a σm value. The values can be found in many common books. In the present invention, a substituent having the Hammett's substituent constant σ value of 0.2 or more can be exemplified as the electron-withdrawing group. σ value is preferably 0.25 or more, more preferably 0.3 or more, and still more preferably 0.35 or more. The upper limit is not particularly limited, but preferably 0.80 or less. Specific examples of the electron-withdrawing group include a cyano group (σp value=0.66), a carboxyl group (—COOH: σp value=0.45), an alkoxycarbonyl group (for example, —COOMe: σp value=0.45), an aryloxycarbonyl group (for example, —COOPh: σp value=0.44), a carbamoyl group (for example, —CONH₂: σp value=0.36), an alkylcarbonyl group (for example, —COMe: σp value=0.50), an arylcarbonyl group (for example, —COPh: σp value=0.43), an alkylsulfonyl group (for example, —SO₂Me: σp value=0.72), and an arylsulfonyl group (for example, —SO₂Ph: σp value=0.68). Among these, a cyano group is preferable. Here, Me represents a methyl group, and Ph represents a phenyl group. For example, the Hammett's substituent constant σ value can be found in the description of paragraphs "0017" and "0018" of JP2011-068731A, the content of which is incorporated herein by reference.

In Formula (PP), it is preferable that R² represents an electron-withdrawing group (preferably a cyano group) and R³ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. Two R²'s in Formula (PP) may be the same as or different from each other. In addition, two R³'s in Formula (PP) may be the same as or different from each other.

In Formula (PP), R⁴ represents preferably a hydrogen atom, an alkyl group, an aryl group, a heteroaryl group, or a group represented by —BR⁴ᴬR⁴ᴮ, more preferably a hydrogen atom, an alkyl group, an aryl group, or a group represented by —BR⁴ᴬR⁴ᴮ, and still more preferably a group represented by —BR⁴ᴬA⁴ᴮ the substituent represented by R⁴ᴬ and R⁴ᴮ, a halogen atom, an alkyl group, an alkoxy group, an aryl group, or a heteroaryl group is preferable, an alkyl group, an aryl group, or a heteroaryl group is more preferable, and an aryl group is still more preferable. Each of the groups may further have a substituent. Two R⁴'s in Formula (PP) may be the same as or different from each other. R⁴ᴬ and R⁴ᴮ may be bonded to each other to form a ring.

Specific examples of the compound represented by Formula (PP) include the following compounds. In the following structural formulae, Me represents a methyl group, and Ph represents a phenyl group. In addition, Examples of the pyrrolopyrrole compound include compounds described in paragraphs "0016" to "0058" of JP2009-263614A, compounds described in paragraphs "0037" to "0052" of JP2011-068731A, compounds described in paragraphs "0010" to "0033" of WO2015/166873A, the contents of which are incorporated herein by reference.

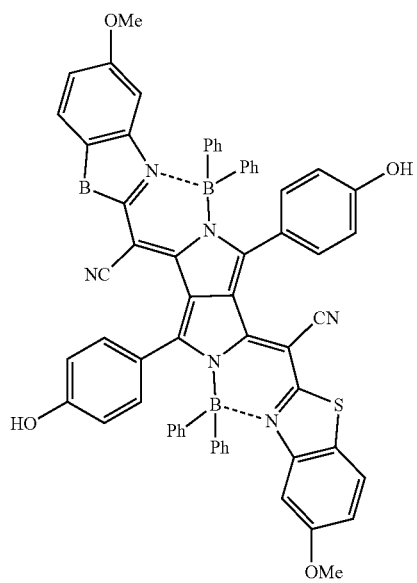

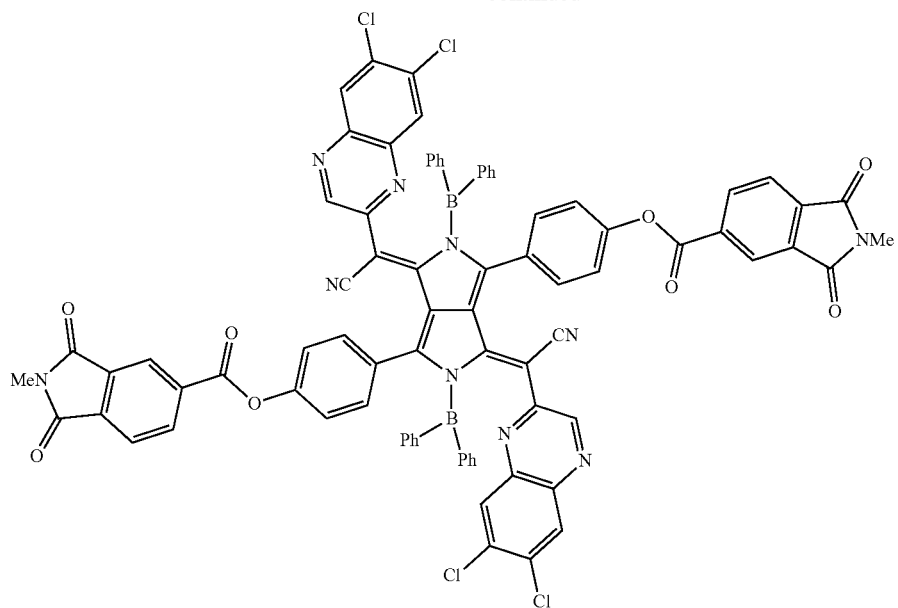
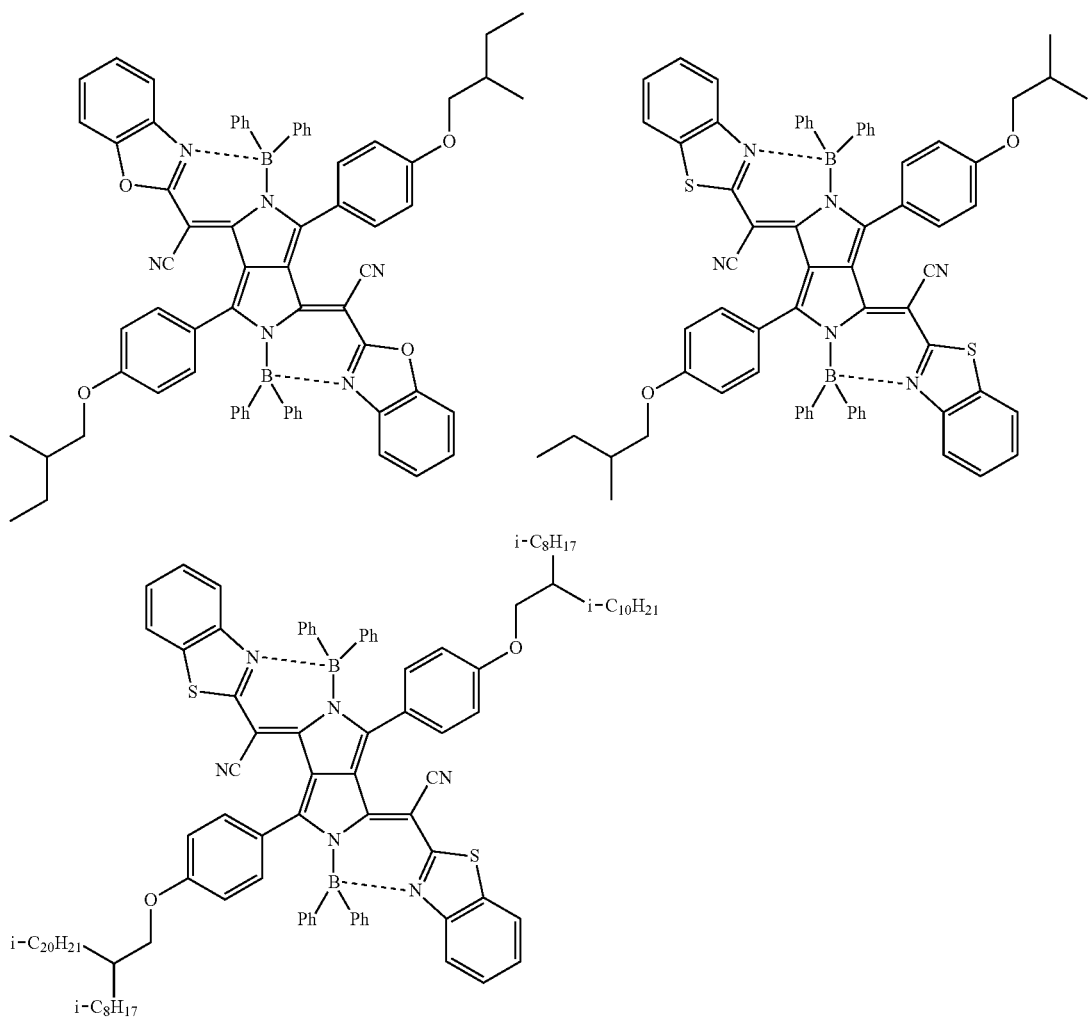

-continued

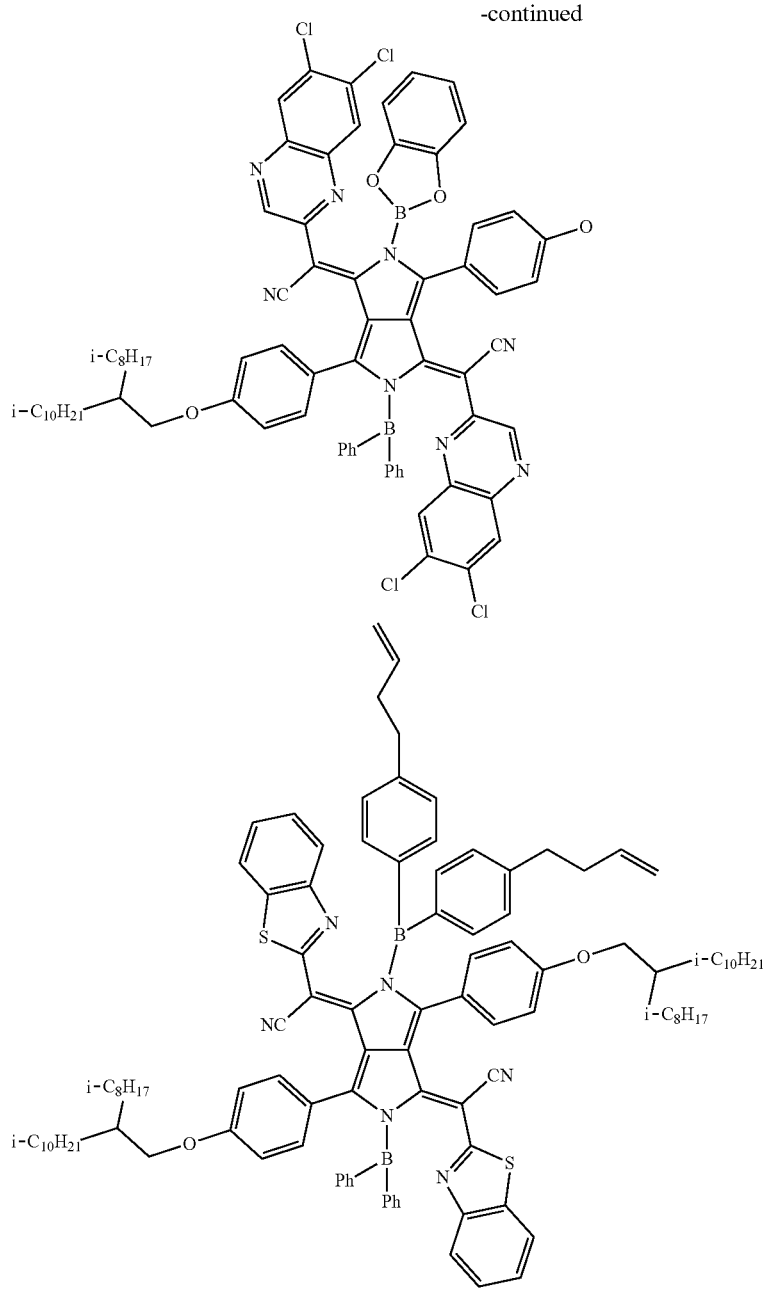

As the squarylium compound, a compound represented by the following Formula (SQ) is preferable.

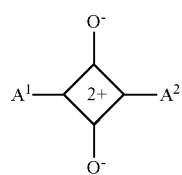
(SQ)

In Formula (SQ), $A^1$ and $A^2$ each independently represent an aryl group, a heteroaryl group, or a group represented by the following Formula (A-1).

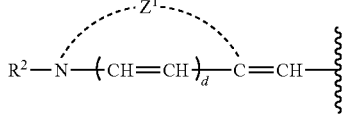
(A-1)

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a linking site. The details of Formula (SQ) can be found in paragraphs "0020" to "0049" of JP2011-208101A, paragraphs "0043"

to "0062" of JP6065169B, and paragraphs "0024" to "0040" of WO2016/181987A, the contents of which are incorporated herein by reference.

As shown below, cations in Formula (SQ) are present without being localized.

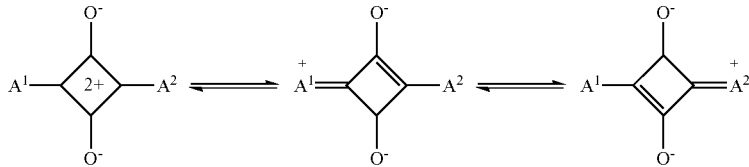

It is preferable that the squarylium compound is a compound represented by the following Formula (SQ-1).

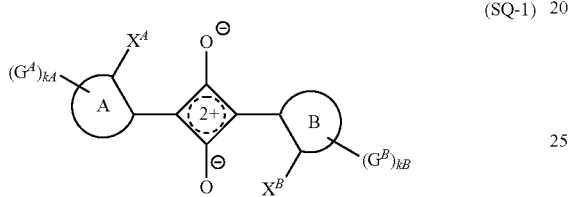

A Ring A and a ring B each independently represent an aromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represent integers representing the maximum numbers of $G^A$'s and GB's which may be substituted in the ring A and the ring B, respectively.

$X^A$ and $G^A$, $X^B$ and $G^B$, or $X^A$ and $X^B$ may be bonded to each other to form a ring, and in a case where a plurality of $G^A$'s and a plurality of $G^B$'s are present, $G^A$'s or $G^B$'s may be bonded to each other to form a ring structure.

Examples of a substituent represented by $G^A$ and $G^B$ include the substituent T described in Formula (PP).

As the substituent represented by $X^A$ and $X^B$, a group having active hydrogen is preferable, —OH, —SH, —COOH, —SO$_3$H, —NR$^{X1}$R$^{X2}$, NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable. R$^{X1}$ and R$^{X2}$ each independently represent a hydrogen atom or a substituent. Examples of the substituent $X^A$ and $X^B$ include an alkyl group, an aryl group, and a heteroaryl group. Among these, an alkyl group is preferable.

The ring A and the ring B each independently represent an aromatic ring. The aromatic ring may be a monocycle or a fused ring. Specific examples of the aromatic ring include a benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable. The aromatic ring may be unsubstituted or may have a substituent. Examples of the substituent include the substituent T described above regarding the Formula (PP).

$X^A$ and $G^A$, $X^B$ and $G^B$, or $X^A$ and $X^B$ may be bonded to each other to form a ring, and in a case where a plurality of $G^A$'s and a plurality of $G^B$'s are present, $G^A$'s or $G^B$'s may be bonded to each other to form a ring. It is preferable that the ring is a 5- or 6-membered ring. The ring may be a monocycle or a fused ring. In a case where $X^A$ and $G^A$, $X^B$ and $G^B$, $X^A$ and $X^B$, $G^A$'s, or $G^B$'s are bonded to each other to form a ring, the groups may be directly bonded to each other to form a ring, or may be bonded to each other to form a ring through a divalent linking group selected from the group consisting of an alkylene group, —CO—, —O—, —NH—, —BR—, and a combination thereof to form a ring. R represents a hydrogen atom or a substituent. Examples of the substituent include the substituent T described above regarding Formula (PP). Among these, an alkyl group or an aryl group is preferable.

kA represents an integer of 0 to $n_A$, kB represents an integer of 0 to $n_B$, $n_A$ represents an integer representing the maximum number of $G^A$'s which may be substituted in the ring A, and $n_B$ represents an integer representing the maximum number of $G^B$'s which may be substituted in the ring B. kA and kB each independently represent preferably an integer of 0 to 4, more preferably 0 to 2, and still more preferably 0 or 1.

It is also preferable that the squarylium compound is a compound represented by the following Formula (SQ-10), Formula (SQ-11), or Formula (SQ-12).

Formula (SQ-10)

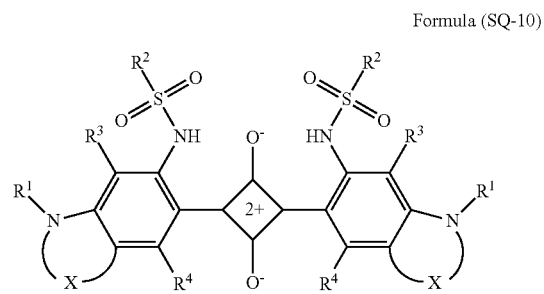

Formula (SQ-11)

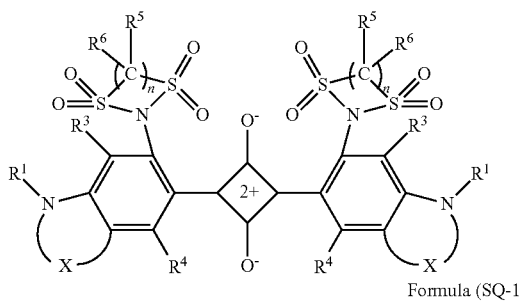

Formula (SQ-12)

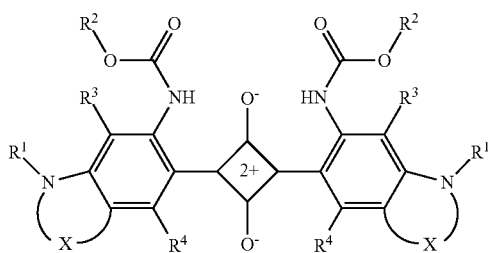

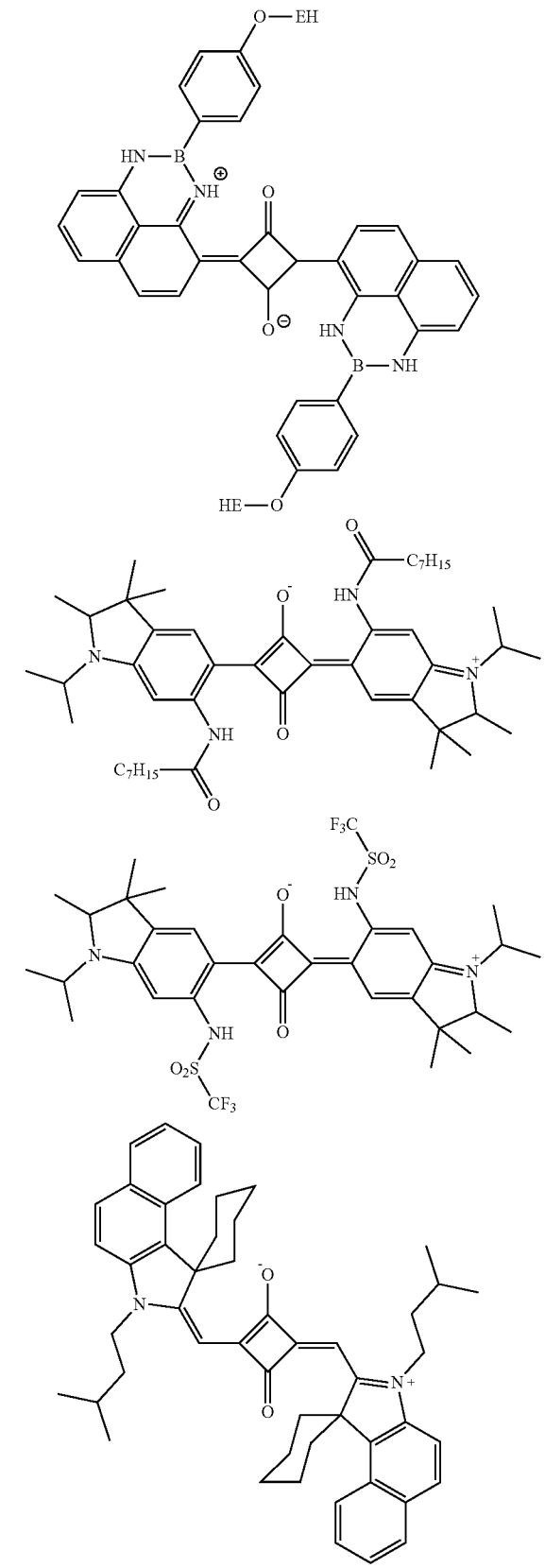

In Formulae (SQ-10) to (SQ-12), X's each independently represent a divalent organic group represented by Formula (1) or Formula (2) in which one or more hydrogen atoms may be substituted with a halogen atom, an alkyl group having 1 to 12 carbon atoms, or an alkoxy group.

$$—(CH_2)_{n1}— \quad (1)$$

In Formula (1), n1 represents 2 or 3.

$$—(CH_2)_{n2}—O—(CH_2)_{n3}— \quad (2)$$

In Formula (2), n2 and n3 each independently represent an integer of 0 to 2, and n2+n3 represents 1 or 2.

$R^1$ and $R^2$ each independently represent an alkyl group or an aryl group. The alkyl group and the aryl group may have a substituent or may be unsubstituted. Examples of the substituent include the substituent T described above regarding the Formula (PP).

$R^3$ to $R^6$ each independently represent a hydrogen atom, a halogen atom, an alkyl group, or an alkoxy group.

n represents 2 or 3.

Examples of the squarylium compound include a compound having the following structure. In the following structural formula, EH represents an ethylhexyl group. In addition, examples of the squarylium compound include a compound described in paragraphs "0044" to "0049" of JP2011-208101A, a compound described in paragraphs "0060" and "0061" of JP6065169B, a compound described in paragraph "0040" of WO2016/181987A, a compound described in WO2013/133099A, a compound described in WO2014/088063A, a compound described in JP2014-126642A, a compound described in JP2016-146619A, a compound described in JP2015-176046A, a compound described in JP2017-025311A, a compound described in WO2016/154782A, a compound described in JP5884953B, a compound described in JP6036689B, a compound described in JP5810604B, and a compound described in JP2017-068120A, the contents of which are incorporated herein by reference.

As the cyanine compound, a compound represented by Formula (C) is preferable.

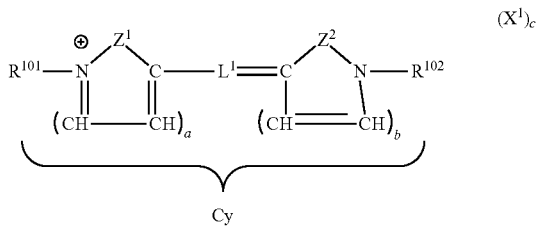

In the formula, $Z^1$ and $Z^2$ each independently represent a non-metal atomic group for forming a 5- or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain including an odd number of methine groups, a and b each independently represent 0 or 1, in a case where a represents 0, a carbon atom and a nitrogen atom are bonded through a double bond. In a case where b represents 0, a carbon atom and a nitrogen atom are bonded through a single bond, and In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

Specific examples of the cyanine compound include the following compounds. In the following structural formulae, Me represents a methyl group.

In addition, examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, and a compound described in JP2008-088426A, the contents of which are incorporated herein by reference.

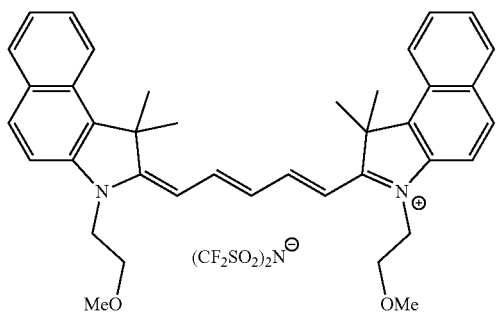

In the present invention, as the near infrared absorbing colorant, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.); Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

In the resin composition according to the embodiment of the present invention, the content of the near infrared absorbing colorant is 5 mass % or higher, preferably 10 mass % or higher, and more preferably 15 mass % or higher with respect to the total solid content of the resin composition according to the embodiment of the present invention. In a case where the content of the near infrared absorbing colorant is 5 mass % or higher, a thin film having excellent near infrared blocking properties can be easily formed. In addition, as the content of the near infrared absorbing colorant with respect to the total solid content of the resin composition increases, the temporal stability of the resin composition tends to deteriorate. In the resin composition according to the embodiment of the present invention, the content of the near infrared absorbing colorant is high, and the temporal stability is excellent. Therefore, in a case where the content of the near infrared absorbing colorant is high, the effect is particularly significant. The upper limit of the content of the near infrared absorbing colorant is preferably 80 mass % or lower, more preferably 75 mass % or lower, and still more preferably 70 mass % or lower. In the present invention, as the near infrared absorbing colorant, one kind may be used alone, or two or more kinds may be used. In a case where two or more near infrared absorbing colorants are used in combination, it is preferable that the total content of the two or more near infrared absorbing colorants is in the above-described range.

<<Other Near Infrared Absorbers>>

The resin composition according to the embodiment of the present invention may further include near infrared absorbers (also referred to as "other near infrared absorbers") other than the near infrared absorbing colorant. Examples of the other near infrared absorber include an inorganic pigment (inorganic particles). The shape of the inorganic pigment is not particularly limited and may have a sheet shape, a wire shape, or a tube shape irrespective of whether or not the shape is spherical or non-spherical. As the inorganic pigment, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic pigment, a tungsten oxide compound can also be used. As the tungsten oxide compound, cesium tungsten oxide is preferable. The details of the tungsten oxide compound can be found in paragraph "0080" of JP2016-006476A, the content of which is incorporated herein by reference.

In a case where the resin composition according to the embodiment of the present invention includes the other near infrared absorbers, the content of the other near infrared absorbers is preferably 0.01 to 50 mass % with respect to the total solid content of the resin composition. The lower limit is preferably 0.1 mass % or higher and more preferably 0.5 mass % or higher. The upper limit is preferably 30 mass % or lower, and more preferably 15 mass % or lower.

In addition, the content of the other near infrared absorber is preferably 1 to 99 mass % with respect to the total mass of the near infrared absorbing colorant and the other near infrared absorber. The upper limit is preferably 80 mass % or lower, more preferably 50 mass % or lower, and still more preferably 30 mass % or lower.

In addition, it is also preferable that the resin composition according to the embodiment of the present invention does not substantially include the other near infrared absorbers. Substantially not including the other near infrared absorbers represents that the content of the other near infrared absorbers is preferably 0.5 mass % or lower, more preferably 0.1 mass % or lower, and still more preferably 0 mass % with respect to the total mass of the near infrared absorbing colorant and the other near infrared absorbers.

<<Resin>>

The resin composition according to the embodiment of the present invention includes a resin. The resin is mixed, for example, in order to disperse the pigment and the like in the composition or to be used as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 100000. The upper limit is preferably 80000 or lower, more preferably 50000 or lower, and still more preferably 40000 or lower. The lower limit is preferably 3000 or higher, more preferably 4000 or higher, and still more preferably 5000 or higher. From the viewpoint of compatibility with other materials and volatility, the weight-average molecular weight of the resin is still more preferably 5000 to 40000.

Examples of the resin include a (meth)acrylic resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used. In addition, as the resin, a resin described in Examples of WO2016/088645A, a resin described in JP2017-057265A, a resin described in JP2017-032685A, a resin described in JP2017-075248A, or a resin described in JP2017-066240A can also be used, the contents of which are incorporated herein by reference. In addition, a resin having a fluorene skeleton can also be preferably used. Examples of the resin having a fluorene skeleton include a resin having the following structure. In the following structural formula, A represents a residue of a carboxylic dianhydride selected from pyromellitic dianhydride, benzophenone tetracarboxylic dianhydride, biphenyl tetracarboxylic dianhydride, or diphenyl ether tetracarboxylic dianhydride, and M represents a phenyl group or a benzyl group. The details of the resin having a fluorene skeleton can be found in US2017/0102610A, the content of which is incorporated herein by reference.

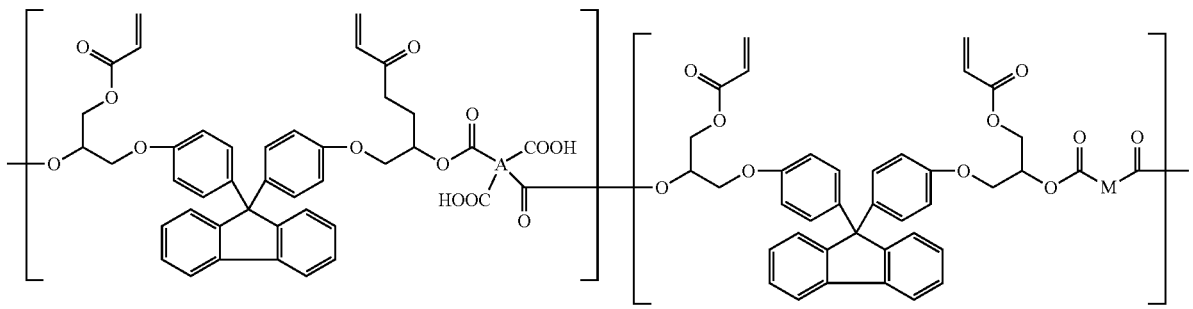

The resin used in the present invention may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. The resin having an acid group can also be used as an alkali-soluble resin.

As the resin having an acid group, a polymer having a carboxyl group at a side chain is preferable. Specific examples of the resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group at a side chain thereof, and a resin obtained by adding an acid anhydride to a polymer having a hydroxy group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (JP-H10-300922A) such as N-phenylmaleimide or N-cyclohexylmaleimide. Among these monomers which are copolymerizable with the (meth)acrylic acid, one kind may be used alone, or two or more kinds may be used in combination.

The resin having an acid group may further have a polymerizable group. Examples of the polymerizable group include a (meth)allyl group, a (meth)acryloyl group, and a (meth)acryloyloxy group. Examples of a commercially available product of the resin include DIANAL NR series (manufactured by Mitsubishi Rayon Co., Ltd.), PHO- TOMER 6173 (a carboxyl group-containing polyurethane acrylate oligomer; manufactured by Diamond Shamrock Co., Ltd.), VISCOAT R-264 and KS Resist 106 (both of which are manufactured by Osaka Organic Chemical Industry Ltd.), CYCLOMER series (for example, ACA230AA or ACA250) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer that includes a repeating unit derived from monomer components including a compound represented by the following Formula (ED1) and/or a compound represented by the following Formula (ED2) (hereinafter, these compounds will also be referred to as "ether dimer") is also preferable.

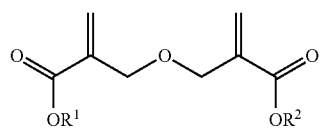

(ED1)

In Formula (ED1), $R^1$ and $R^2$ each independently represent a hydrogen atom or a hydrocarbon group having 1 to 25 carbon atoms which may have a substituent.

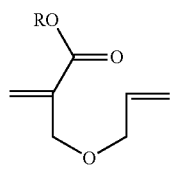

(ED2)

In Formula (ED2), R represents a hydrogen atom or an organic group having 1 to 30 carbon atoms.

Specific examples of the ether dimer include a compound described in paragraph "0317" of JP2013-029760A, the content of which is incorporated herein by reference. Among these ether dimers, one kind may be used alone, or two or more kinds may be used in combination.

The resin having an acid group may include a repeating unit which is derived from a compound represented by the following Formula (X).

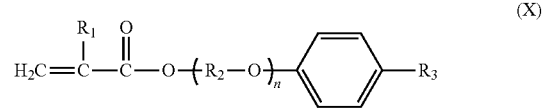

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

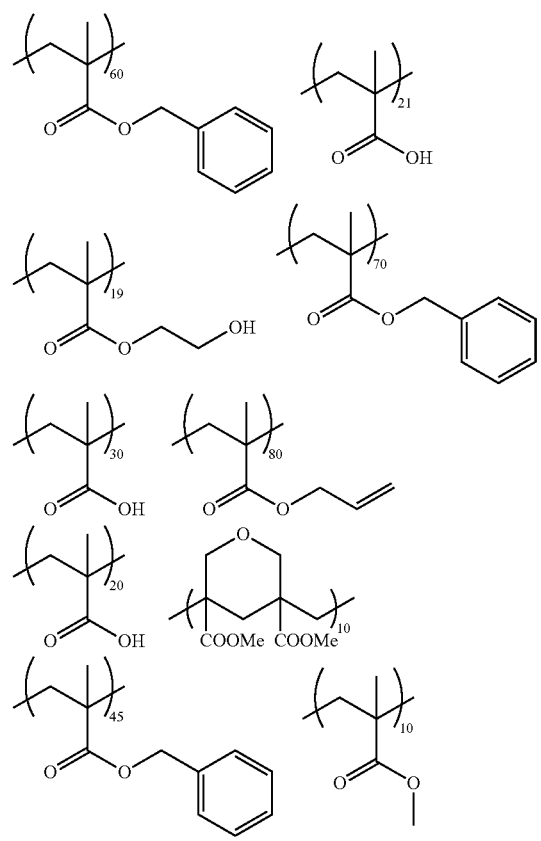

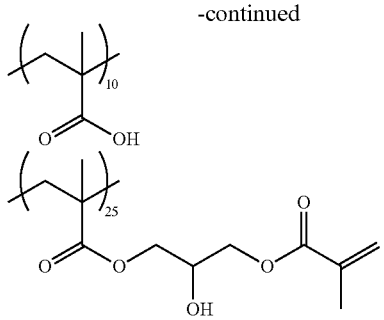

The resin composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin A used as the dispersant further includes a repeating unit having an acid group. By the resin, which is used as the dispersant, including the repeating unit having an acid group, in a case where a pattern is formed using a photolithography method, the amount of residues formed in an underlayer of a pixel can be reduced.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference. In addition, specific examples of the graft copolymer include the following resins. The following resin may also be a resin having an acid group (alkali-soluble resin). In addition, other examples of the graft copolymer include resins described in paragraphs "0072" to "0094" of JP2012-255128A, the content of which is incorporated herein by reference.

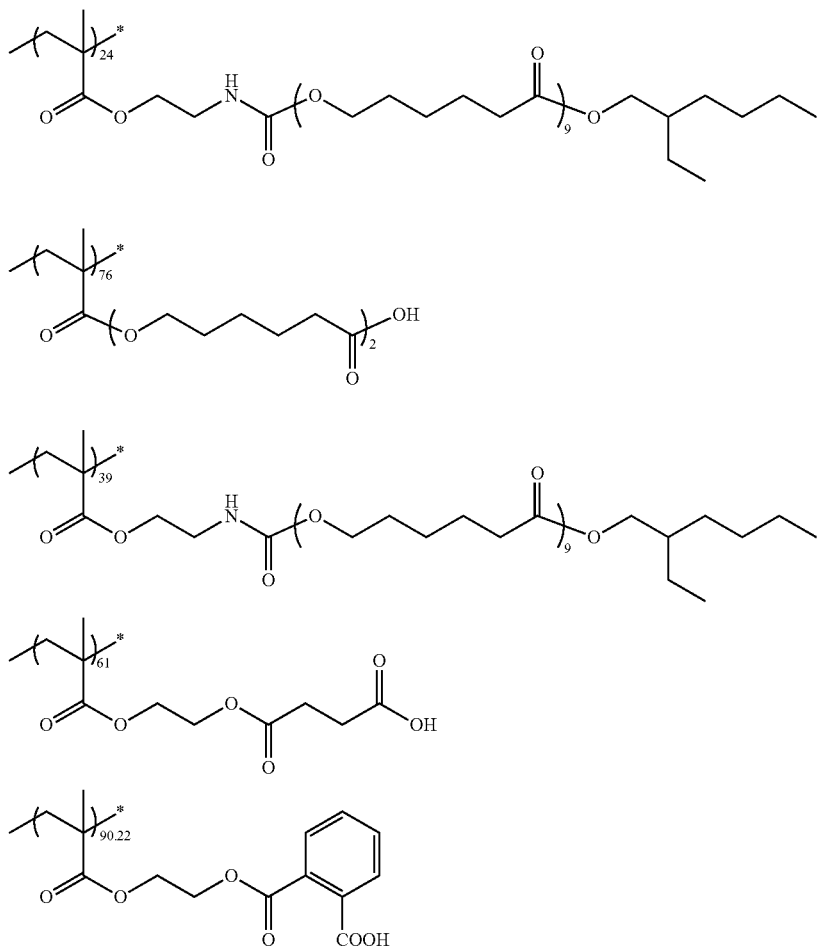

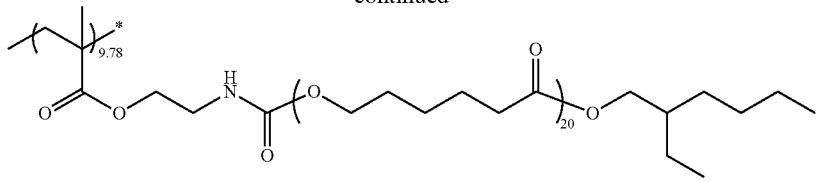

In addition, in the present invention, as the resin (dispersant), an oligoimine dispersant having a nitrogen atom at at least either a main chain or a side chain is also preferably used. As the oligoimine dispersant, a resin, which includes a structural unit having a partial structure X with a functional group (pKa: 14 or lower) and a side chain including a side chain Y having 40 to 10000 atoms and has a basic nitrogen atom at at least either a main chain or a side chain, is preferable. The basic nitrogen atom is not particularly limited as long as it is a nitrogen atom exhibiting basicity. The oligoimine dispersant can be found in the description of paragraphs "0102" to "0166" of JP2012-255128A, the content of which is incorporated herein by reference. As the oligoimine dispersant, a resin having the following structure or a resin described in paragraphs "0168" to "0174" of JP2012-255128A can be used.

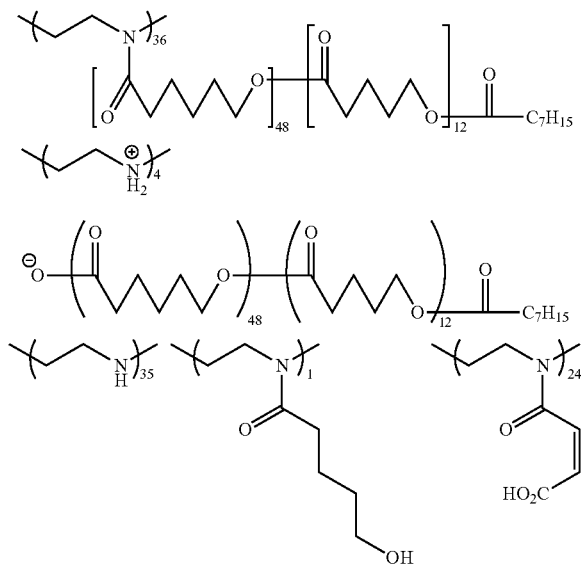

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference.

The content of the resin is preferably 1 mass % or higher, more preferably 5 mass % or higher, still more preferably 10 mass % or higher, and still more preferably 20 mass % or higher with respect to the total solid content of the resin composition. The upper limit is preferably 80 mass % or lower, more preferably 70 mass % or lower, still more preferably 50 mass % or lower, still more preferably 40 mass % or lower, and still more preferably 30 mass % or lower. In addition, the content of the resin having an acid group is preferably 1 mass % or higher, more preferably 5 mass % or higher, still more preferably 10 mass % or higher, and still more preferably 20 mass % or higher with respect to the total solid content of the resin composition. The upper limit is preferably 80 mass % or lower, more preferably 70 mass % or lower, still more preferably 50 mass % or lower, still more preferably 40 mass % or lower, and still more preferably 30 mass % or lower. The resin composition may include one resin or two or more resins. In a case where the resin composition includes two or more resins, it is preferable that the total content of the two or more resins is in the above-described range.

In addition, in a case where the resin composition includes a dispersant as the resin, the content of the dispersant is preferably 0.1 to 40 mass % with respect to the total solid content of the resin composition. The upper limit is preferably 20 mass % or lower, and more preferably 10 mass % or lower. The lower limit is preferably 0.5 mass % or higher and more preferably 1 mass % or higher. The content of the dispersant is preferably 1 to 100 parts by mass with respect to 100 parts by mass of the pigment. The upper limit is preferably 80 parts by mass or less and more preferably 75 parts by mass or less. The lower limit is preferably 2.5 parts by mass or more and more preferably 5 parts by mass or more.

<<Curable Compound>>

It is preferable that the resin composition includes a curable compound. As the curable compound, a well-known compound which is crosslinkable by a radical, an acid, or heat can be used. Examples of the crosslinking compound include a compound which has a group having an ethylenically unsaturated bond and a compound having a cyclic ether group. Examples of the group having an ethylenically unsaturated bond include a vinyl group, a (meth)allyl group, and a (meth)acryloyl group. Examples of the cyclic ether group include an epoxy group and an oxetanyl group. In the present invention, it is preferable that the curable compound is a radically polymerizable compound. In a case where a cationically polymerizable compound is used as the curable compound, the hindered amine compound used as the antioxidant may be consumed by a curing reaction of the cationically polymerizable compound, and the desired effect of the present invention may be insufficiently obtained. In a case where the radically polymerizable compound is used as the curable compound, the effect is excellent even with a small mixing amount of the hindered amine compound.

The content of the curable compound is preferably 0.1 to 40 mass % with respect to the total solid content of the resin composition. For example, the lower limit is more preferably 0.5 mass % or higher and still more preferably 1 mass % or higher. For example, the upper limit is more preferably 30 mass % or lower and still more preferably 20 mass % or lower. As the curable compound, one kind may be used alone, or two or more kinds may be used in combination. In a case where two or more curable compounds are used in combination, it is preferable that the total content of the two or more curable compounds is in the above-described range.

(Radically Polymerizable Compound)

The radically polymerizable compound is not particularly limited as long as it is a compound that is polymerizable by the action of a radical. As the radically polymerizable compound, a compound having one or more groups having an ethylenically unsaturated bond is preferable, a compound having two or more groups having an ethylenically unsaturated bond is more preferable, and a compound having three or more groups having an ethylenically unsaturated bond is still more preferable. The upper limit of the number of the groups having an ethylenically unsaturated bond is, for example, preferably 15 or less and more preferably 6 or less. Examples of the group having an ethylenically unsaturated bond include a vinyl group, a (meth)allyl group, and a (meth)acryloyl group. Among these, a (meth)acryloyl group is preferable. The radically polymerizable compound is preferably a (meth)acrylate compound having 3 to 15 functional groups and more preferably a (meth)acrylate compound having 3 to 6 functional groups.

It is preferable that the radically polymerizable compound is a monomer. The molecular weight of the monomer type radically polymerizable compound is preferably 200 to 3000. The upper limit of the molecular weight is preferably 2500 or lower and more preferably 2000 or lower. The lower limit of the molecular weight is preferably 250 or higher and more preferably 300 or higher.

Examples of the radically polymerizable compound can be found in paragraphs "0033" and "0034" of JP2013-253224A, the content of which is incorporated herein by reference. As the polymerizable compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol residue and/or a propylene glycol residue is preferable. In addition, oligomers of the above-described examples can be used. For example, the details of the polymerizable compound can be found in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the contents of which are incorporated herein by reference. In addition, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can be used. For example, RP-1040 (manufactured by Nippon Kayaku Co., Ltd.) is used. In addition, as the radically polymerizable compound, ARONIX M-350 or TO-2349 (manufactured by Toagosei Co., Ltd.) can also be used.

It is preferable that the radically polymerizable compound is a compound (also referred to as "radically polymerizable compound A") that has a group having an ethylenically unsaturated bond and at least one selected from an acid group or a hydroxy group. In this aspect, a resin composition having excellent storage stability is likely to be obtained. In particular, in a case where a compound that has a group having an ethylenically unsaturated bond and an acid group is used as the radically polymerizable compound A, the storage stability of the resin composition is likely to be further improved. Further, the solvent resistance of the obtained film is likely to be further improved.

An acid value of the radically polymerizable compound A is preferably 1.0 mmol/g or higher, more preferably 1.5 mmol/g or higher, and still more preferably 2.0 mmol/g or higher. In a case where the acid value of the radically polymerizable compound A is in the above-described range, the storage stability of the resin composition and the light fastness and solvent resistance of the obtained film are particularly excellent. In addition, a hydroxy group value of the radically polymerizable compound A is preferably 1.5 mmol/g or higher, more preferably 2.0 mmol/g or higher, and still more preferably 2.5 mmol/g or higher. In a case where the hydroxy group value of the radically polymerizable compound A is in the above-described range, penetration of oxygen caused by hydrophilization of the film is suppressed, and a film having excellent light fastness is likely to be obtained.

It is preferable that the radically polymerizable compound A is a compound represented by the following Formula (M-1).

$(A^1)_{n1}$-$L^1$-$(Ac^1)_{n2}$                              Formula (M-1)

(In Formula (M-1), $A^1$ represents a hydroxy group or an acid group, $L^1$ represents a (n1+n2) valent group, $Ac^1$ represents a group having an ethylenically unsaturated bond, n1 represents an integer of 1 or more, and n2 represents an integer of 1 or more)

Examples of the acid group represented by $A^1$ include a carboxyl group, a sulfo group, and a phosphate group. Among these, a carboxyl group is preferable.

Examples of the (n1+n2) valent group represented by $L^1$ include a hydrocarbon group, a heterocyclic group, —O—, —S—, —NR—, —CO—, —COO—, —OCO—, —SO$_2$—, a group including a combination of the above-described groups. R represents a hydrogen atom, an alkyl group, or an aryl group and preferably a hydrogen atom. The hydrocarbon group may be an aliphatic hydrocarbon group or an aromatic hydrocarbon group. In addition, the aliphatic hydrocarbon group may be cyclic or acyclic. In addition, the aliphatic hydrocarbon group may be a saturated aliphatic hydrocarbon group or an unsaturated aliphatic hydrocarbon group. The hydrocarbon group may have a substituent or may be unsubstituted. In addition, the cyclic aliphatic hydrocarbon group and the aromatic hydrocarbon group may be a monocycle or a fused ring. The heterocyclic group may be a monocycle or a fused ring. It is preferable that the heterocyclic group is a 5- or 6-membered ring. The heterocyclic group may be an aliphatic heterocyclic group or an aromatic heterocyclic group. In addition, examples of the heteroatom constituting the heterocyclic group include a nitrogen atom, an oxygen atom, and a sulfur atom. It is preferable that $L^1$ represents a group including at least a hydrocarbon group. The number of carbon atoms constituting $L^1$ is preferably 3 to 100 and more preferably 6 to 50.

Examples of the group having an ethylenically unsaturated bond represented by $Ac^1$ include a vinyl group, a (meth)allyl group, and a (meth)acryloyl group. Among these, a (meth)acryloyl group is preferable.

n1 represents preferably 1 or 2 and more preferably 1. n2 represents preferably 2 or more and more preferably 3 or more. The upper limit of n2 is preferably 15 or less, more preferably 10 or less, still more preferably 6 or less, and still more preferably 4 or less.

Specific examples of the radically polymerizable compound A include a compound having the following structure. In addition, examples of a commercially available product of the radically polymerizable compound A include ARONIX series (for example, M-305, M-510, or M-520, manufactured by Toagosei Co., Ltd.).

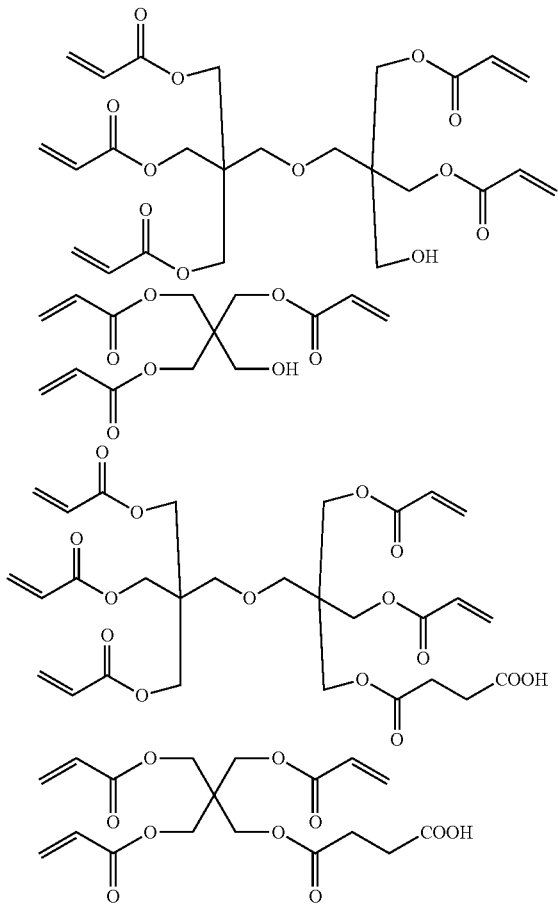

In addition, it is also preferable that the radically polymerizable compound is a compound having a caprolactone structure. The radically polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine.

Examples of the polymerizable compound having a caprolactone structure can be found in paragraphs "0042" to "0045" of JP2013-253224A, the content of which is incorporated herein by reference. As the compound having a caprolactone structure, for example, KAYARAD DPCA series (manufactured by Nippon Kayaku Co., Ltd.) is commercially available, and examples thereof include DPCA-20, DPCA-30, DPCA-60, and DPCA-120.

As the radically polymerizable compound, a compound which has a group having an ethylenically unsaturated bond and an alkyleneoxy group can also be used. As the compound which has a group having an ethylenically unsaturated bond and an alkyleneoxy group, a compound which has a group having an ethylenically unsaturated bond, an ethyleneoxy group, and/or a propyleneoxy group is preferable, a compound which has a group having an ethylenically unsaturated bond and an ethyleneoxy group is more preferable, and a trifunctional to hexafunctional (meth)acrylate compound having 4 to 20 ethyleneoxy groups is still more preferable. Examples of a commercially available product of the compound which has a group having an ethylenically unsaturated bond and an alkyleneoxy group include SR-494 (manufactured by Sartomer) which is a tetrafunctional (meth)acrylate having four ethyleneoxy groups, and KAYARAD TPA-330 which is a trifunctional (meth)acrylate having three isobutyleneoxy groups.

As the radically polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

In addition, as the radically polymerizable compound, a compound described in JP2017-048367A, JP6057891B, or JP6031807B can also be used.

In addition, as the radically polymerizable compound, for example, 8UH-1006 or 8UH-1012 (manufactured by Taisei Fine Chemical Co., Ltd.) or LIGHT ACRYLATE POB-A0 (manufactured by Kyoeisha Chemical Co., Ltd.) is also preferably used.

In a case where the resin composition according to the embodiment of the present invention includes the radically polymerizable compound, the content of the radically polymerizable compound is preferably 0.1 to 40 mass % with respect to the total solid content of the resin composition. For example, the lower limit is more preferably 0.5 mass % or higher and still more preferably 1 mass % or higher. For example, the upper limit is more preferably 30 mass % or lower and still more preferably 20 mass % or lower. In addition, a mass ratio radically polymerizable compound/resin of the radically polymerizable compound to the resin is preferably 0.4 to 1.4. The lower limit of the mass ratio is preferably 0.5 or higher and more preferably 0.6 or higher. The upper limit of the mass ratio is preferably 1.3 or lower and more preferably 1.2 or lower. In a case where the mass ratio is in the above-described range, a pattern having more excellent rectangularity can be formed. As the radically polymerizable compound, one kind may be used alone, or two or more kinds may be used in combination. In a case where two or more radically polymerizable compounds are used in combination, it is preferable that the total content of the two or more radically polymerizable compounds is in the above-described range.

(Cationically Polymerizable Compound)

Examples of the cationically polymerizable compound include a compound having a cationically polymerizable group. Examples of the cationically polymerizable group include a cyclic ether group such as an epoxy group or an oxetanyl group. As the cationically polymerizable compound, a compound having a cyclic ether group is preferable, and a compound having an epoxy group is more preferable.

Examples of the compound having an epoxy group include a compound having one or more epoxy groups in one molecule. In particular, a compound having two or more epoxy groups in one molecule is preferable. It is preferable that the compound having an epoxy group is a compound having 1 to 100 epoxy groups in one molecule. The upper limit of the number of epoxy groups is, for example, 10 or less or 5 or less. The lower limit of the number of epoxy groups is preferably 2 or more.

The compound having an epoxy group may be a low molecular weight compound (for example, molecular weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

In a case where the compound having an epoxy group is a low molecular weight compound, the compound having an epoxy group is, for example, a compound represented by the following Formula (EP1).

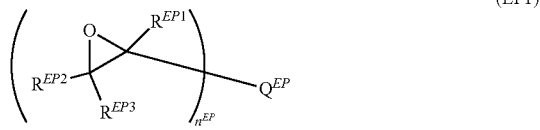

(EP1)

In Formula (EP1), $R^{EP1}$ to $R^{EP3}$ each independently represent a hydrogen atom, a halogen atom, or an alkyl group. The alkyl group may have a cyclic structure or may have a substituent. In addition, $R^{EP1}$ and $R^{EP2}$, or $R^{EP2}$ and $R^{EP3}$ may be bonded to each other to form a ring structure. $Q^{EP}$ represents a single bond or a $n^{EP}$-valent organic group. $R^{EP1}$ to $R^{EP3}$ may be bonded to $Q^{EP}$ to form a ring structure. $n^{EP}$ represents an integer of 2 or more, preferably 2 to 10, and more preferably 2 to 6. In a case where $Q^{EP}$ represents a single bond, $n^{EP}$ represents 2.

The details of $R^{EP1}$ to $R^{EP3}$ and $Q^{EP}$ can be found in paragraphs "0087" and "0088" of JP2014-089408A, the content of which is incorporated herein by reference. Specific examples of the compound represented by Formula (EP1) include a compound described in paragraph "0090" of JP2014-089408A and a compound described in paragraph "0151" of JP2010-054632A, the contents of which are incorporated herein by reference.

As the low molecular weight compound, a commercially available product can also be used. Examples of the commercially available product include ADEKA GLYCILOL series manufactured by Adeka Corporation (for example, ADEKA GLYCILOL ED-505) and EPOLEAD series manufactured by Daicel Corporation (for example, EPOLEAD GT401).

As the compound having an epoxy group, an epoxy resin can be preferably used. Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq. As the epoxy resin, a commercially available product can also be used. Examples of the commercially available product include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer).

In the present invention, as the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of this specification are incorporated herein by reference.

In a case where the resin composition according to the embodiment of the present invention includes the cationically polymerizable compound, the content of the cationically polymerizable compound is preferably 0.1 to 40 mass % with respect to the total solid content of the resin composition. For example, the lower limit is more preferably 0.5 mass % or higher and still more preferably 1 mass % or higher. For example, the upper limit is more preferably 30 mass % or lower and still more preferably 20 mass % or lower. As the cationically polymerizable compound, one kind may be used alone, or two or more kinds may be used in combination. In a case where two or more cationically polymerizable compounds are used in combination, it is preferable that the total content of the two or more cationically polymerizable compounds is in the above-described range.

In addition, in a case where the resin composition includes the radically polymerizable compound and the cationically polymerizable compound, a mass ratio radically polymerizable compound:cationically polymerizable compound is preferably 100:1 to 100:400 and more preferably 100:1 to 100:100.

In addition, it is also preferable that the resin composition according to the embodiment of the present invention does not substantially include a cationically polymerizable compound. In a case where the resin composition according to the embodiment of the present invention does not substantially include a cationically polymerizable compound, the content of the cationically polymerizable compound is preferably 0.05 mass % or lower, more preferably 0.01 mass % or lower, and still more preferably 0 mass % with respect to the total solid content of the resin composition.

<<Photopolymerization Initiator>>

The resin composition according to the embodiment of the present invention may include a photopolymerization initiator. Examples of the photopolymerization initiator include a photoradical polymerization initiator and a photocationic polymerization initiator. It is preferable that the photoinitiator is selected and used according to the kind of the curable compound. In a case where the radically polymerizable compound is used as the curable compound, it is preferable that the photoradical polymerization initiator is used as the photopolymerization initiator. In a case where the cationically polymerizable compound is used as the curable compound, it is preferable that the photocationic polymerization initiator is used as the photopolymerization initiator. The photopolymerization initiator is not particularly limited and can be appropriately selected from well-known photopolymerization initiators. For example, a compound having photosensitivity to light in a range from an ultraviolet range to a visible range is preferable.

The content of the photopolymerization initiator is preferably 0.1 to 50 mass %, more preferably 0.5 to 30 mass %, and still more preferably 1 to 20 mass % with respect to the total solid content of the resin composition. In a case where the content of the photopolymerization initiator is in the above-described range, higher sensitivity and pattern formability can be obtained. The resin composition may include one photopolymerization initiator or two or more photopolymerization initiators. In a case where the composition includes two or more photopolymerization initiators, it is preferable that the total content of the photopolymerization initiators is in the above-described range.

(Photoradical Polymerization Initiator)

Examples of the photoradical polymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photoradical polymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. The details of the photoradical polymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

Examples of the oxime compound include a compound described in JP2001-233842A, a compound described in JP2000-080068A, a compound described in JP2006-342166A, a compound described in J. C. S. Perkin II (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, and a compound described in WO2017/051680A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photoradical polymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photoradical polymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by Adeka Corporation).

In the present invention, as the photoradical polymerization initiator, an oxime compound having a benzofuran skeleton can also be used. Specific examples include OE-01 to OE-75 described in WO2015/036910A.
Hereinafter, specific examples of the oxime compound which are preferably used in the present invention are shown below, but the present invention is not limited thereto.
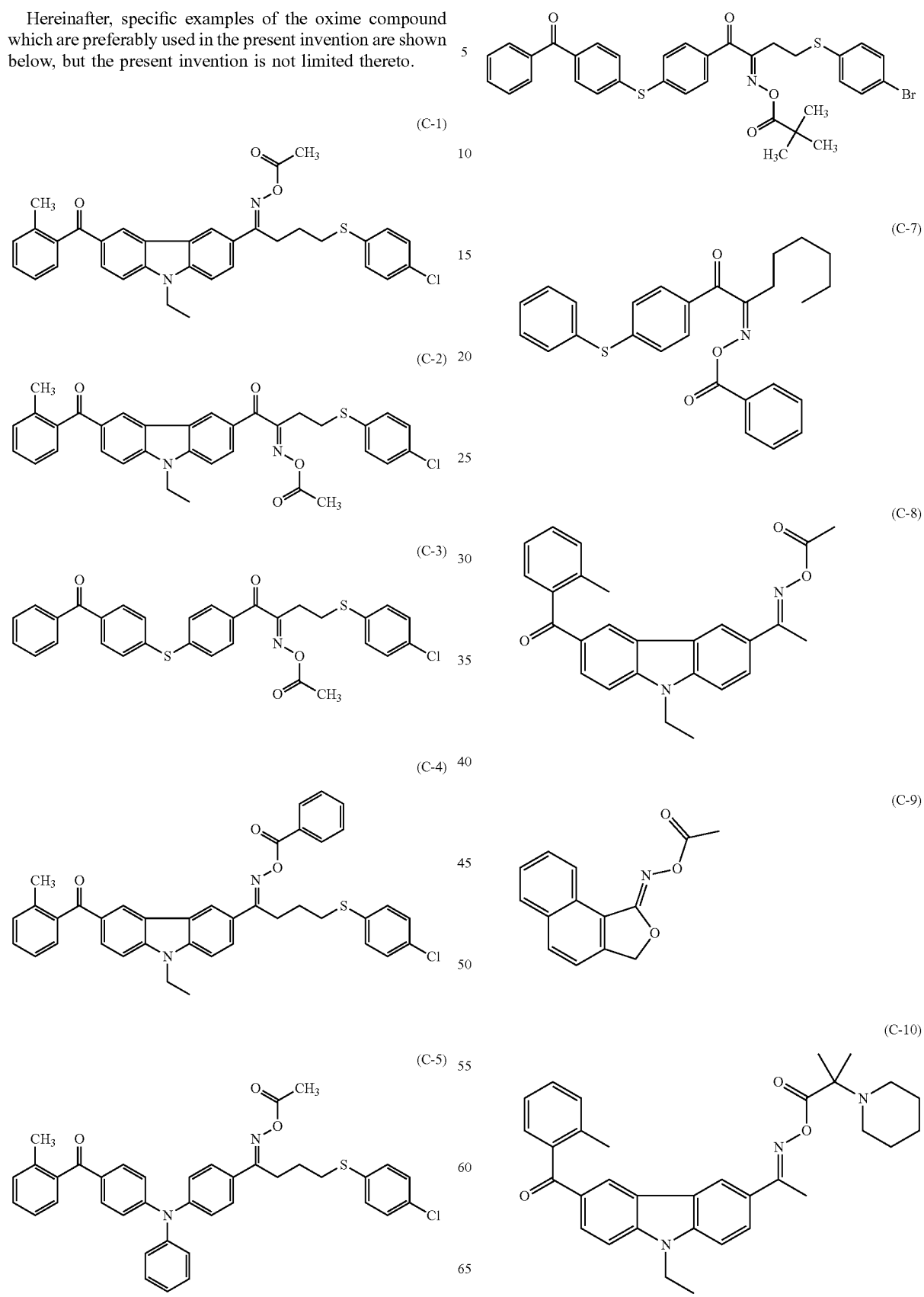

(C-11)

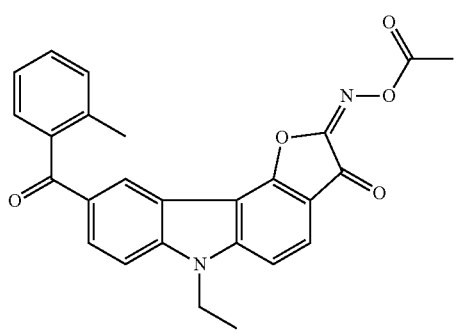

(C-12)

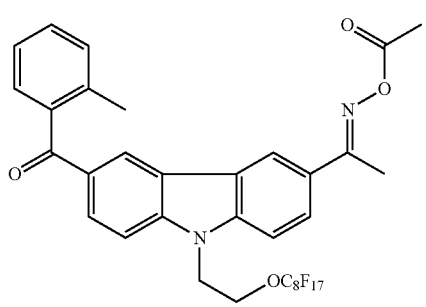

(C-13)

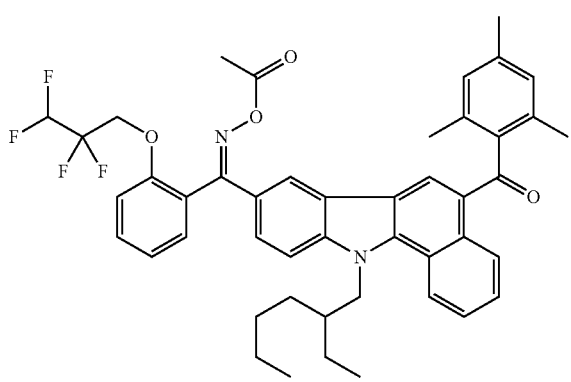

(C-14)

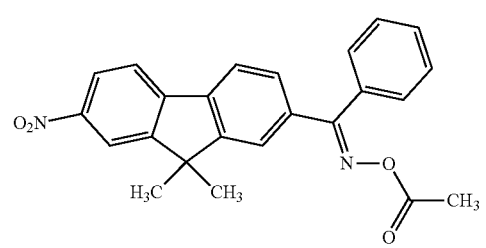

(C-15)

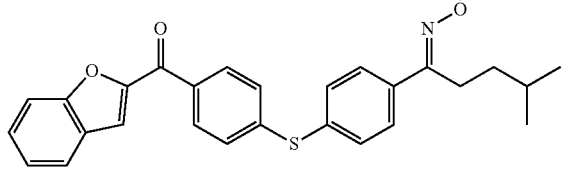

(C-16)

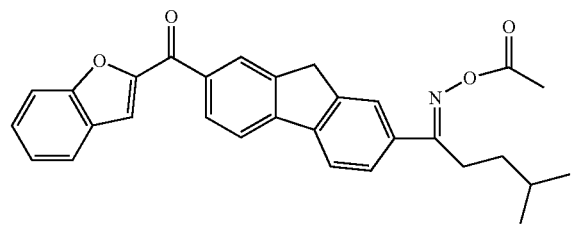

The oxime compound is preferably a compound having a maximum absorption wavelength in a wavelength range of 350 to 500 nm and more preferably a compound having a maximum absorption wavelength in a wavelength range of 360 to 480 nm. In addition, the molar absorption coefficient of the oxime compound at a wavelength of 365 nm or 405 nm is preferably high, more preferably 1,000 to 300,000, still more preferably 2,000 to 300,000, and still more preferably 5,000 to 200,000 from the viewpoint of sensitivity. The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photoradical polymerization initiator, a photoradical polymerization initiator having two functional groups or three or more functional groups may be used. Specific examples of the photoradical polymerization initiator include a dimer of an oxime compound described in JP2010-527339A, JP2011-524436A, WO2015/004565A, paragraphs "0417" to "0412" of JP2016-532675A, or paragraphs "0039" to "0055" of WO2017/033680A, a compound (E) and a compound (G) described in JP2013-522445A, and Cmpd 1 to 7 described in WO2016/034963A.

It is preferable that the photoradical polymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photoradical polymerization initiator is preferably 0.1 to 50 mass %, more preferably 0.5 to 30 mass %, and still more preferably 1 to 20 mass % with respect to the total solid content of the resin composition. In a case where the content of the photoradical polymerization initiator is in the above-described range, higher sensitivity and pattern formability can be obtained. The resin composition may include one photoradical polymerization initiator or two or more photoradical polymerization initiators. In a case where the composition includes two or more photoradical polymerization initiators, it is preferable that the total content of the photoradical polymerization initiators is in the above-described range.

(Photocationic Polymerization Initiator)

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. The details of the photocationic polymerization initiator can be found in paragraphs "0139" to "0214" of JP2009-258603A, the content of which is incorporated herein by reference.

The content of the photocationic polymerization initiator is preferably 0.1 to 50 mass %, more preferably 0.5 to 30 mass %, and still more preferably 1 to 20 mass % with respect to the total solid content of the resin composition. In a case where the content of the photocationic polymerization initiator is in the above-described range, higher sensitivity and pattern formability can be obtained. The resin composition may include one photocationic polymerization initiator or two or more photocationic polymerization initiators. In a case where the composition includes two or more photocationic polymerization initiators, it is preferable that the total content of the two or more photocationic polymerization initiators is in the above-described range.

<<Chromatic Colorant>>

The resin composition according to the embodiment of the present invention may include a chromatic colorant. In the present invention, "chromatic colorant" denotes a colorant other than a white colorant and a black colorant. It is preferable that the chromatic colorant is a colorant having an absorption in a wavelength range of 400 nm or longer and shorter than 650 nm.

As the chromatic colorant, a pigment or a dye may be used. As the pigment, an organic pigment is preferable. Examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In a case where the resin composition according to the embodiment of the present invention includes a chromatic colorant, the content of the chromatic colorant is preferably 1 to 50 mass % with respect to the total solid content of the resin composition according to the embodiment of the present invention. In a case where the resin composition according to the embodiment of the present invention includes two or more chromatic colorants, it is preferable that the total content of the two or more chromatic colorants is in the above-described range.

In addition, it is also preferable that the resin composition according to the embodiment of the present invention does not substantially include a chromatic colorant. A case where the resin composition according to the embodiment of the present invention does not substantially include a chromatic colorant represents that the content of the chromatic colorant is preferably 0.1 mass % or lower, more preferably 0.05 mass % or lower, and still more preferably 0 mass % with respect to the total solid content of the resin composition.

<<Coloring Material that allows Transmission of Infrared Light and Blocks Visible Light>>

The resin composition according to the embodiment of the present invention may also include the coloring material that allows transmission of infrared light and blocks visible light (hereinafter, also referred to as "coloring material that blocks visible light").

In the present invention, it is preferable that the coloring material that blocks visible light is a coloring material that absorbs light in a wavelength range of violet to red. In addition, in the present invention, it is preferable that the coloring material that blocks visible light is a coloring material that blocks light in a wavelength range of 450 to 650 nm. In addition, it is preferable that the coloring material that blocks visible light is a coloring material that allows transmission of light in a wavelength range of 900 to 1300 nm.

In the present invention, it is preferable that the coloring material that blocks visible light satisfies at least one of the following requirement (A) or (B).

(A): The coloring material that blocks visible light includes two or more chromatic colorants, and a combination of the two or more chromatic colorants forms black.

(B): The coloring material that blocks visible light includes an organic black colorant.

Examples of the chromatic colorant are as described above. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available. Examples of the perylene compound include C.I. Pigment Black 31 and 32. Examples of the azomethine compound include a compound described in JP1989-170601A (JP-H1-170601A) and JP1990-034664A (JP-H2-034664A). For example, "CHRO- MOFINE BLACK A1103" (manufactured by Dainichiseika Color & Chemicals Mfg. Co., Ltd.) is available.

In a case where a combination of two or more chromatic colorants forms black, examples of the combination of chromatic colorants are as follows.

(1) An aspect in which the coloring material that blocks visible light includes a yellow colorant, a blue colorant, a violet colorant, and a red colorant.
(2) An aspect in which the coloring material that blocks visible light includes a yellow colorant, a blue colorant, and a red colorant.
(3) An aspect in which the coloring material that blocks visible light includes a yellow colorant, a violet colorant, and a red colorant.
(4) An aspect in which the coloring material that blocks visible light includes a yellow colorant and a violet colorant.
(5) An aspect in which the coloring material that blocks visible light includes a green colorant, a blue colorant, a violet colorant, and a red colorant.
(6) An aspect in which the coloring material that blocks visible light includes a violet colorant and an orange colorant.
(7) An aspect in which the coloring material that blocks visible light includes a green colorant, a violet colorant, and a red colorant.
(8) An aspect in which the coloring material that blocks visible light includes a green colorant and a red colorant.

In a case where the resin composition according to the embodiment of the present invention includes the coloring material that blocks visible light, the content of the coloring material that blocks visible light is preferably 60 mass % or lower, more preferably 50 mass % or lower, still more preferably 30 mass % or lower, still more preferably 20 mass % or lower, and still more preferably 15 mass % or lower with respect to the total solid content of the resin composition. The lower limit is, for example, 0.1 mass % or higher or 0.5 mass % or higher.

In addition, it is also preferable that the resin composition according to the embodiment of the present invention does not substantially include the coloring material that blocks visible light. The resin composition substantially not including the coloring material that blocks visible light represents that the content of the coloring material that blocks visible light is preferably 0.05 mass % or lower, more preferably 0.01 mass % or lower, and still more preferably 0% with respect to the total solid content of the resin composition according to the embodiment of the present invention.

<<Pigment Derivative>>

The resin composition according to the embodiment of the present invention may further include a pigment derivative. Examples of the pigment derivative include a compound in which at least one selected from an acid group or a basic group is bonded to a colorant skeleton. As the pigment derivative, a compound represented by Formula (B1) is preferable.

(B1)

In Formula (B1), P represents a colorant skeleton, L represents a single bond or a linking group, X represents an acid group or a basic group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

As the colorant skeleton represented by P, at least one selected from a pyrrolopyrrole colorant skeleton, a diketo pyrrolo pyrrole colorant skeleton, a quinacridone colorant skeleton, an anthraquinone colorant skeleton, a dianthraquinone colorant skeleton, a benzoisoindole colorant skeleton, a thiazine indigo colorant skeleton, an azo colorant skeleton, a quinophthalone colorant skeleton, a phthalocyanine colorant skeleton, a naphthalocyanine colorant skeleton, a dioxazine colorant skeleton, a perylene colorant skeleton, a perinone colorant skeleton, a benzimidazolone colorant skeleton, a benzothiazole colorant skeleton, a benzimidazole colorant skeleton, or a benzoxazole colorant skeleton, is preferable, at least one selected from a pyrrolopyrrole colorant skeleton, a diketo pyrrolo pyrrole colorant skeleton, a quinacridone colorant skeleton, or a benzimidazolone colorant skeleton is more preferable, and a pyrrolopyrrole colorant skeleton is still more preferable.

The linking group represented by L is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent. Examples of the substituent include the substituent T described above regarding the Formula (PP).

Examples of the acid group represented by X include a carboxyl group, a sulfo group, a carboxylic acid amide group, a sulfonic acid amide group, and an imide acid group. As the carboxylic acid amide group, a group represented by —NHCOR$^{X1}$ is preferable. As the sulfonic acid amide group, a group represented by —NHSO$_2$R$^{X2}$ is preferable. As the imide acid group, a group represented by —SO$_2$NHSO$_2$R$^{X3}$, —CONHSO$_2$R$^{X4}$, —CONHCOR$^{X5}$, or —SO$_2$NHCOR$^{X6}$ is preferable. R$^{X1}$ to R$^{X6}$ each independently represent a hydrocarbon group or a heterocyclic group. The hydrocarbon group and the heterocyclic group represented by R$^{X1}$ to R$^{X6}$ may further have a substituent. Examples of the substituent which may be further included include the substituent T described above regarding Formula (PP). Among these, a halogen atom is preferable and a fluorine atom is more preferable.

Examples of the basic group represented by X include an amino group.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, and paragraphs "0063" to "0094" of WO2012/102399A can be used, the content of which is incorporated herein by reference.

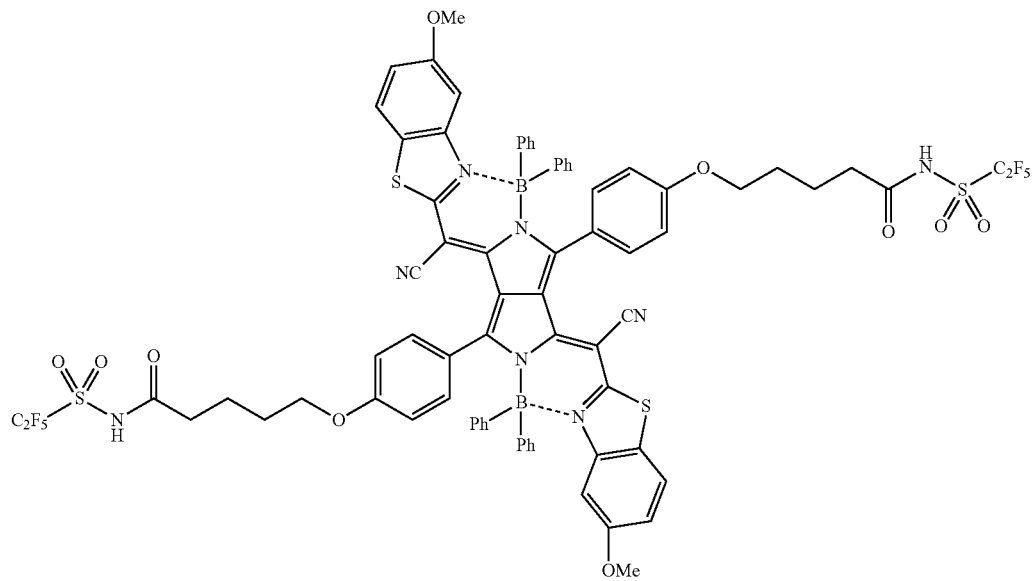
(B1)
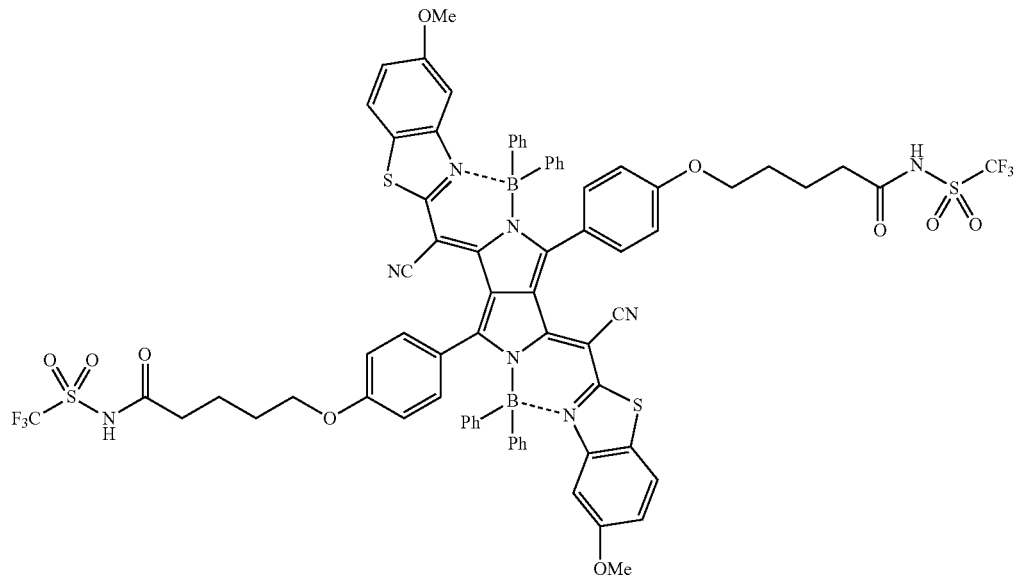
(B2)

-continued
(B3)
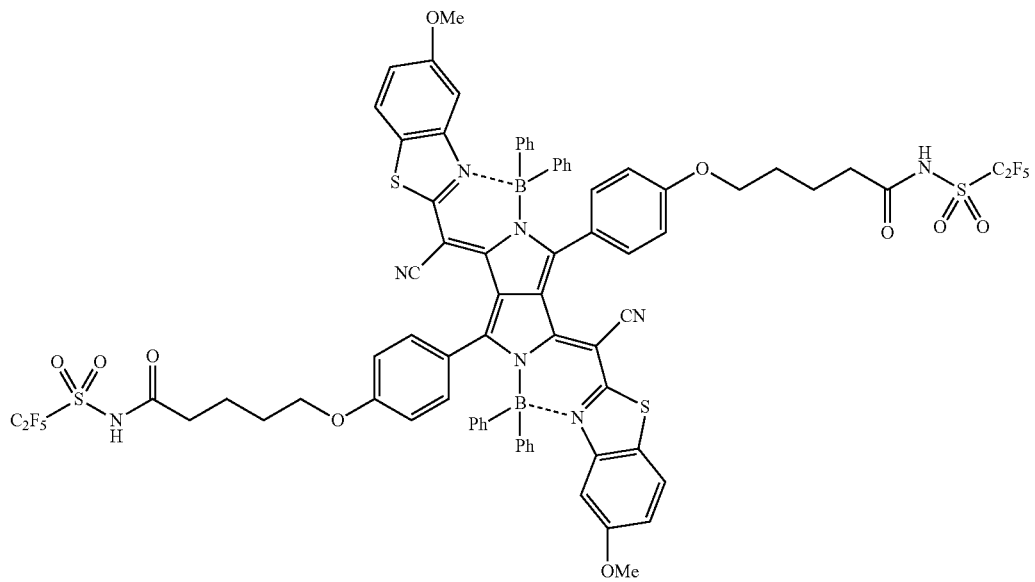
(B4)
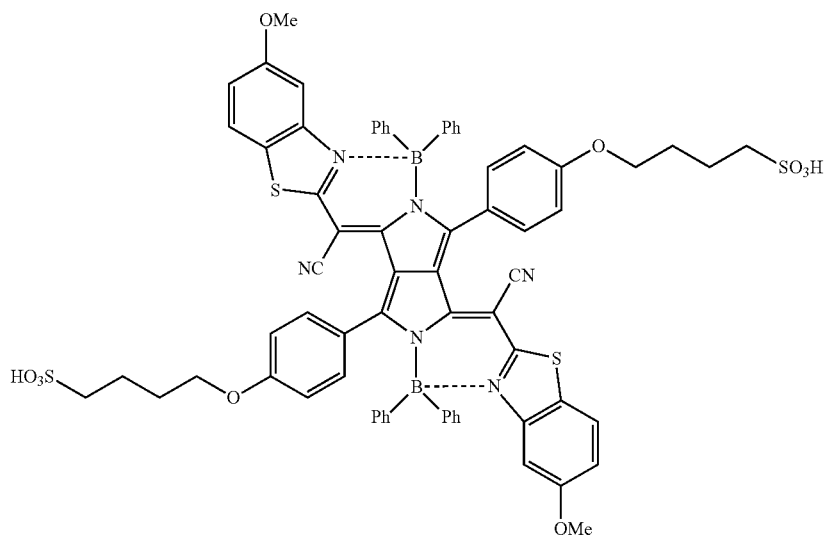
(B5)
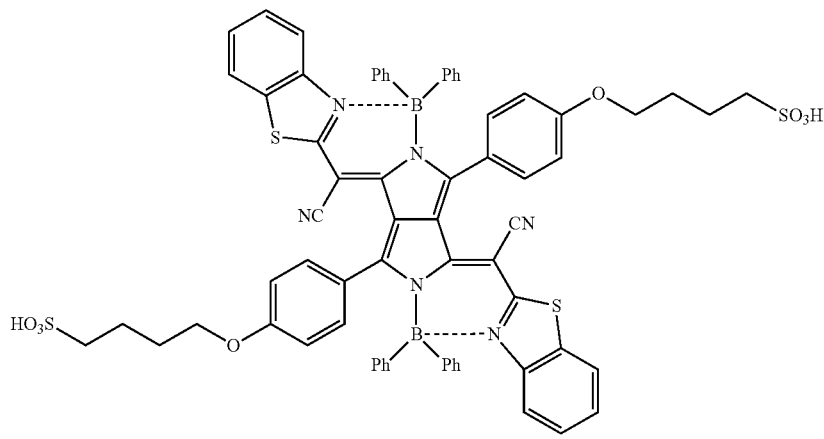

(B6)

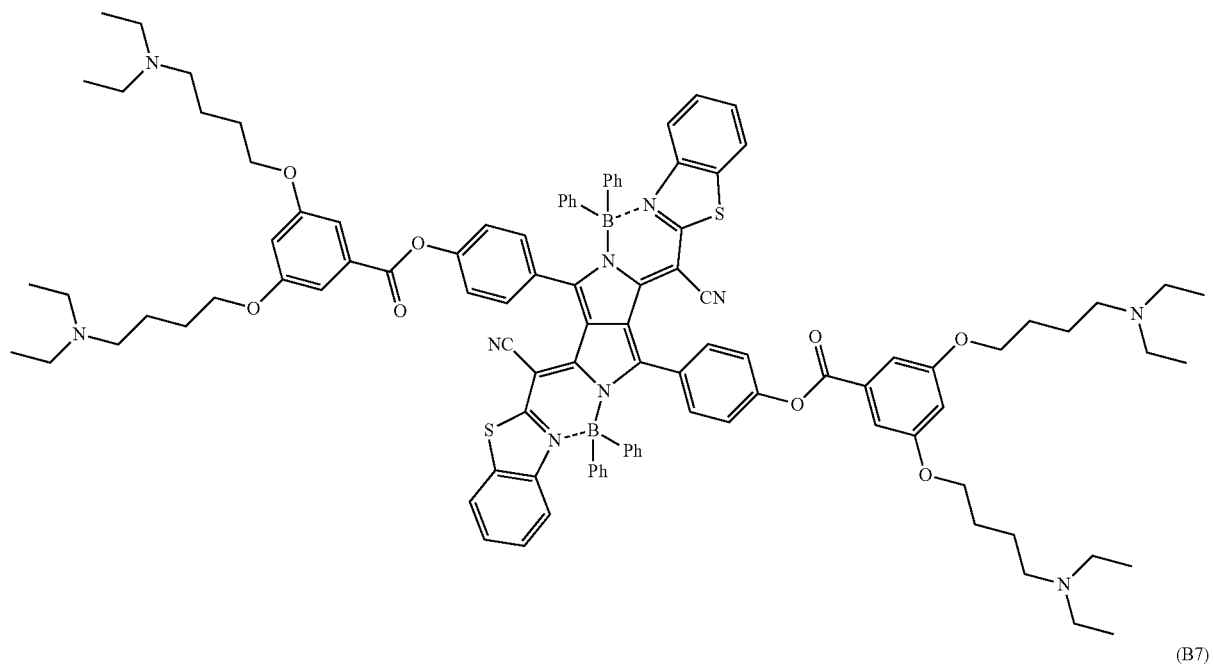

(B7)

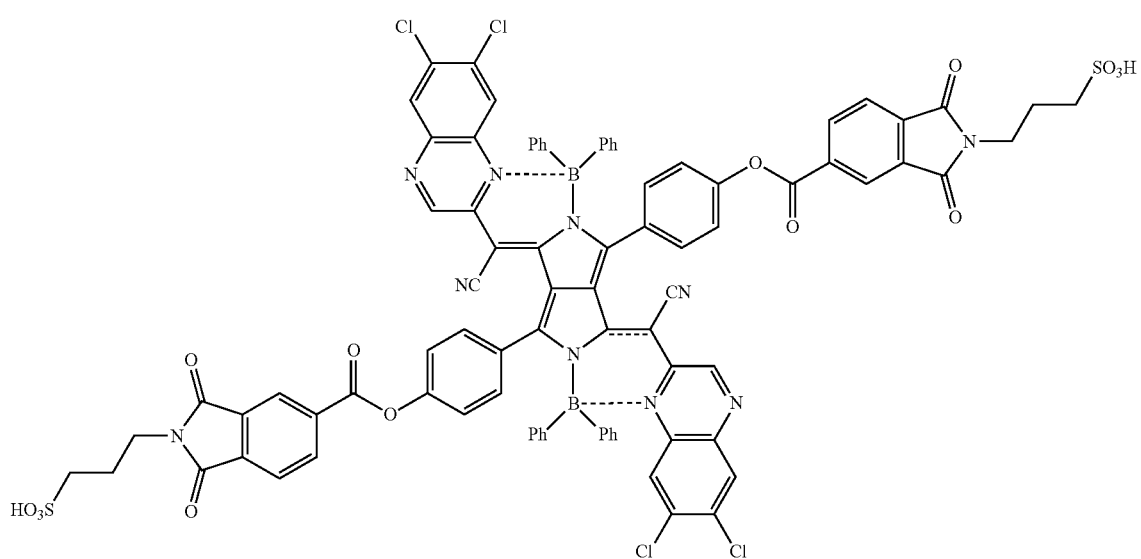

In a case where the resin composition according to the embodiment of the present invention includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be effectively suppressed. As the pigment derivative, one kind may be used alone, or two or more kinds may be used in combination. In a case where two or more pigment derivatives are used in combination, it is preferable that the total content of the two or more pigment derivatives is in the above-described range.

<<Solvent>>

The resin composition according to the embodiment of the present invention may include a solvent. Examples of the solvent include an organic solvent. Basically, the solvent is not particularly limited as long as it satisfies the solubility of the respective components and the coating properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 90 mass %, and still more preferably 30 to 90 mass % with respect to the total mass of the resin composition. In addition, due to the reasons of an environmental aspect, it may be preferable that the resin composition does not include an aromatic hydrocarbon (for example, benzene, toluene, xylene, or ethylbenzene) as a solvent.

<<Surfactant>>

It is preferable that the resin composition according to the embodiment of the present invention includes a surfactant. By the resin composition including the surfactant, the antioxidant can be made to be likely to be present in the vicinity of the near infrared absorbing colorant in the film while making the surfactant unevenly distributed on the film surface. Therefore, it is presumed that exposure of the near infrared absorbing colorant to the air interface can be suppressed by the surfactant unevenly distributed on the film surface, and an attack of a thermally excited oxygen radical to the near infrared absorbing colorant can be effectively suppressed by the antioxidant present in the vicinity of the near infrared absorbing colorant. Therefore, a film having higher thermal reliability can be formed.

As the surfactants, various surfactants such as a fluorine surfactant, a nonionic surfactant, a cationic surfactant, an anionic surfactant, or a silicone surfactant can be used, and a fluorine surfactant is preferable. By the resin composition according to the embodiment of the present invention including the fluorine surfactant, the floating of the near infrared absorbing colorant on the film surface can be effectively suppressed, and a film having higher thermal reliability is likely to be formed.

The surfactant may be a compound having a molecular weight of lower than 1000 or a compound having a molecular weight (in the case of a polymer, weight-average molecular weight) of 1000 or higher. In particular, due to the reason that the effect of the present invention can be obtained, it is preferable that the surfactant is a polymer having a weight-average molecular weight of 1000 or higher. The weight-average molecular weight of the surfactant is preferably 3000 or higher and more preferably 5000 or higher. In addition, the upper limit of the weight-average molecular weight of the surfactant is preferably 100000 or lower, more preferably 50000 or lower, and still more preferably 30000 or lower.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, 5393, and KH-40 (all of which are manufactured by Asahi Glass Co., Ltd.); POLYFOX PF636, PF656, PF6320, PF6520, and PF7002 (all of which are manufactured by OMNOVA Solutions Inc.); and FTERGENT FTX-218D (manufactured by Neos Co., Ltd.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

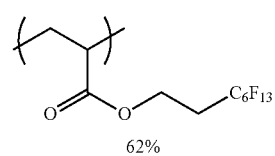

-continued

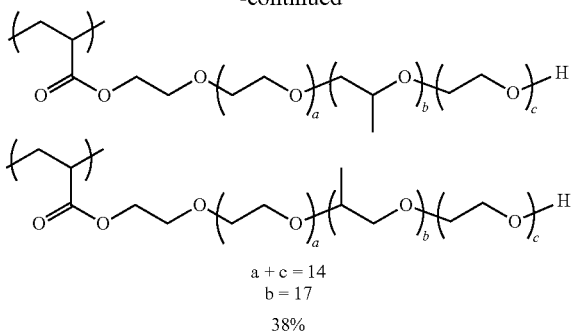

a + c = 14
b = 17
38%

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the cationic surfactant include KP-341 (manufactured by Shin-Etsu Chemical Co., Ltd.), POLYFLOW No. 75, No. 90, or No. 95 (manufactured by Kyoeisha Chemical Co., Ltd.), and W001 (manufactured by Yusho Co., Ltd.).

Examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP-341, KF-6001, and KF-6002 (all of which are manufactured by Shin-Etsu Chemical Co., Ltd.); and BYK307, BYK323, and BYK330 (all of which are manufactured by BYK-Chemie Japan K.K.).

The content of the surfactant is preferably 0.01 to 1 mass % with respect to the resin composition. The upper limit is preferably 0.5 mass % or lower, more preferably 0.1 mass % or lower, and still more preferably 0.05 mass % or lower. The lower limit is preferably 0.015 mass % or higher.

In addition, the content of the fluorine surfactant is preferably 0.01 to 1 mass % with respect to the resin composition. The upper limit is preferably 0.5 mass % or lower, more preferably 0.1 mass % or lower, and still more preferably 0.05 mass % or lower. The lower limit is preferably 0.015 mass % or higher.

As the surfactant, one kind may be used alone, or two or more kinds may be used in combination.

<<Polymerization Inhibitor>>

The resin composition according to the embodiment of the present invention may include a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The content of the polymerization inhibitor is preferably 0.001 to 5 mass % with respect to the total solid content of the resin composition.

<<Silane Coupling Agent>>

The resin composition according to the embodiment of the present invention may include a silane coupling agent. By the resin composition including the silane coupling agent, a film having excellent adhesiveness with a support is likely to be formed. In particular, the silane coupling agent is effective in a case where glass is used as the support.

In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a styrene group, a (meth)acryloyl group, a mercapto group, an epoxy group, an oxetanyl group, an amino group, an ureido group, a sulfide group, an isocyanate group, and a phenyl group. Among these, a (meth)acryloyl group or an epoxy group is preferable. Examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.01 to 15.0 mass % and more preferably 0.05 to 10.0 mass % with respect to the total solid content of the resin composition. As the silane coupling agent, one kind may be used alone, or two or more kinds may be used. In a case where two or more surfactants are used in combination, it is preferable that the total content of the two or more surfactants is in the above-described range.

<<Ultraviolet Absorber>>

The resin composition according to the embodiment of the present invention may include an ultraviolet absorber. As the ultraviolet absorber, for example, a conjugated diene compound, an aminobutadiene compound, a methyldibenzoyl compound, a coumarin compound, a salicylate compound, a benzophenone compound, a benzotriazole compound, an acrylonitrile compound, an azomethine compound, an indole compound, or a triazine compound can be used. The details of the ultraviolet absorber can be found in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Examples of a commercially available product of the conjugated diene compound include UV-503 (manufactured by Daito Chemical Co., Ltd.). Specific examples of the indole compound include compounds having the following structures. In addition, as the benzotriazole compound, MYUA series (manufactured by Miyoshi Oil&Fat Co., Ltd.; The Chemical Daily, Feb. 1, 2016) may be used.

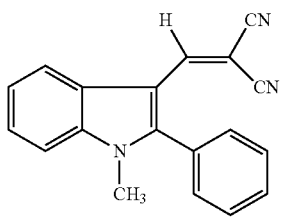 [SMILES: Cn1c(-c2ccccc2)c(C=C(C#N)C#N)c2ccccc21]

In the present invention, as the ultraviolet absorber, compounds represented by Formulae (UV-1) to (UV-3) can also be preferably used.

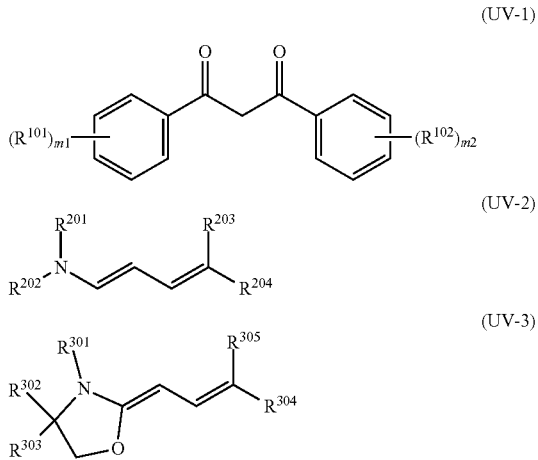

(UV-1)

(UV-2)

(UV-3)

In Formula (UV-1), $R^{101}$ and $R^{102}$ each independently represent a substituent, and m1 and m2 each independently represent 0 to 4. In Formula (UV-2), $R^{201}$ and $R^{202}$ each independently represent a hydrogen atom or an alkyl group, and $R^{203}$ and $R^{204}$ each independently represent a substituent. In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formulae (UV-1) to (UV-3) include the following compounds.

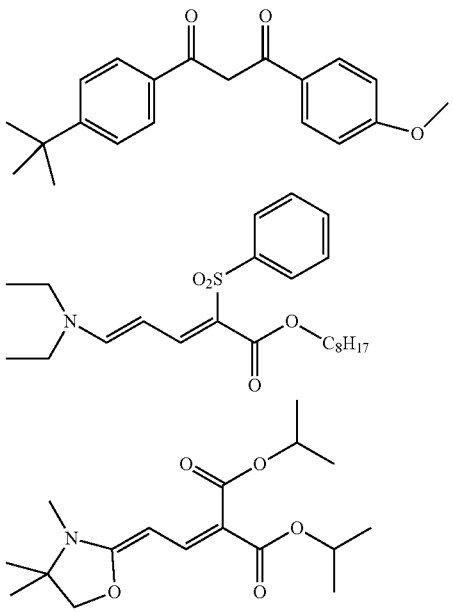

In the resin composition according to the embodiment of the present invention, the content of the ultraviolet absorber is preferably 0.01 to 10 mass % and more preferably 0.01 to 5 mass % with respect to the total solid content of the resin composition. In the present invention, as the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Other Components>>

Optionally, the resin composition according to the embodiment of the present invention may further include a sensitizer, a curing accelerator, a filler, a thermal curing accelerator, a thermal polymerization inhibitor, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). The details of these components can be found in paragraphs "0101" to "0104" and "0107" to "0109" of JP2008-250074A, the content of which is incorporated herein by reference.

In addition, the resin composition according to the embodiment of the present invention may optionally include a potential antioxidant. The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

For example, in a case where a film is formed by coating, the viscosity (23° C.) of the resin composition according to the embodiment of the present invention is preferably in a range of 1 to 3000 mPa·s. The lower limit is preferably 3 mPa·s or higher and more preferably 5 mPa·s or higher. The upper limit is preferably 2000 mPa·s or lower and more preferably 1000 mPa·s or lower.

A storage container of the resin composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

The resin composition according to the embodiment of the present invention can be preferably used for forming a near infrared cut filter or the like. In addition, by the resin composition according to the embodiment of the present invention including the coloring material that blocks visible light, an infrared transmitting filter that can allow transmission of only near infrared light at a specific wavelength or higher can also be formed.

<Method of Preparing Resin Composition>

The resin composition according to the embodiment of the present invention can be prepared by mixing the above-described components with each other. During the preparation of the resin composition, for example, all the components may be dissolved or dispersed in an organic solvent at the same time to prepare the resin composition. Optionally, two or more solutions or dispersions in which the respective components are appropriately mixed may be prepared, and the solutions or dispersions may be mixed with each other during use (during application) to prepare the resin composition.

In addition, it is preferable that a method of preparing the resin composition according to the embodiment of the present invention includes a process of dispersing particles of the pigment and the like. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that coarse particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the resin composition, it is preferable that the resin composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene. Among these materials, polypropylene (including high-density polypropylene) or nylon is preferable. The pore size of the filter is suitably about 0.01 to 7.0 µm and is preferably about 0.01 to 3.0 µm and more preferably about 0.05 to 0.5 µm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. At this time, the filtering using each of the filters may be performed once, or twice or more. In addition, a combination of filters having different pore sizes in the above-described range may be used. Here, the pore size of the filter can refer to a nominal value of a manufacturer of the filter. A commercially available filter can be selected from various filters manufactured by Pall Corporation (for example, DFA4201NIEY), Toyo Roshi Kaisha, Ltd., Entegris Japan Co., Ltd. (former Mykrolis Corporation), or Kits Microfilter Corporation. The second filter may be formed of the same material as that of the first filter. In addition, the filtering using the first filter may be performed only on the dispersion, and the filtering using the second filter may be performed on a mixture of the dispersion and other components.

<Film>

A film according to the embodiment of the present invention is obtained from the above-described resin composition according to the embodiment of the present invention. The film according to the present invention can be preferably used as a near infrared cut filter. In addition, the film according to the embodiment of the present disclosure can also be used as a heat ray blocking filter or an infrared transmitting filter. The film according to the embodiment of the present invention may be a film having a pattern or a film (flat film) not having a pattern.

The film according to the embodiment of the present invention may be used in a state where it is laminated on a support, or may be peeled off from a support. Examples of the support include a semiconductor substrate such as a silicon substrate and a transparent substrate.

In addition, a charge coupled device (CCD), a complementary metal-oxide semiconductor (CMOS), a transparent conductive film, or the like may be formed on the semiconductor substrate used as the support. In addition, a black matrix that separates pixels from each other may be formed on the semiconductor substrate. In addition, optionally, an undercoat layer may be provided on the semiconductor substrate to improve adhesiveness with a layer above the support, to prevent diffusion of materials, or to make a surface of the substrate flat.

The transparent substrate used as the support is not particularly limited as long as it is formed of a material that can allow transmission of at least visible light. For example, a substrate formed of a material such as glass or a resin can be used. Examples of the resin include a polyester resin such as polyethylene terephthalate or polybutylene terephthalate, a polyolefin resin such as polyethylene, polypropylene, or an ethylene vinyl acetate copolymer, a norbornene resin, an acrylic resin such as polyacrylate or polymethyl methacrylate, a urethane resin, a vinyl chloride resin, a fluororesin, a polycarbonate resin, a polyvinyl butyral resin, and a polyvinyl alcohol resin. Examples of the glass include soda-lime glass, borosilicate glass, non-alkali glass, quartz glass, and copper-containing glass. Examples of the copper-containing glass include a phosphate glass including copper and a fluorophosphate glass including copper. The content of copper in the copper-containing glass is preferably 0.1 to 20 mass %, more preferably 0.3 to 17 mass %, and still more preferably 0.5 to 15 mass %. It is preferable that the copper-containing glass has a maximum absorption wavelength in a wavelength range of 700 to 1100 nm. The lower limit is preferably 800 nm or longer and more preferably 900 nm or longer. The upper limit is preferably 1050 nm or shorter and more preferably 1000 nm or shorter. As the copper-containing glass, a commercially available product can also be used. Examples of a commercially available product of the copper-containing glass include NF-50 (manufactured by AGC Techno Glass Co., Ltd.).

The thickness of the film according to the embodiment of the present invention can be adjusted according to the purpose. The thickness of the film is preferably 20 μm or less, more preferably 10 μm or less, and still more preferably 5 μm or less. The lower limit of the thickness of the film is preferably 0.1 μm or more and more preferably 0.2 μm or more.

In a case where the film according to the embodiment of the present invention is used as a near infrared cut filter, it is preferable that the film according to the embodiment of the present invention has a maximum absorption wavelength in a wavelength range of 700 to 1300 nm, it is more preferable that the film according to the embodiment of the present invention has a maximum absorption wavelength in a wavelength range of 700 to 1000 nm, it is still more preferable that the film according to the embodiment of the present invention has a maximum absorption wavelength in a wavelength range of 720 to 980 nm, and it is still more preferable that the film according to the embodiment of the present invention has a maximum absorption wavelength in a wavelength range of 740 to 960 nm. In addition, a ratio Amax/A550 of an absorbance Amax at the absorption maximum to an absorbance A550 at a wavelength of 550 nm is preferably 50 to 500, more preferably 70 to 450, and still more preferably 100 to 400.

In a case where the film is used as a near infrared cut filter, it is preferable that the film according to the embodiment of the present invention satisfies at least one of the following condition (1), . . . , or (4), and it is more preferable that the film according to the embodiment of the present invention satisfies all the following conditions (1) to (4).

(1) A light transmittance at a wavelength of 400 nm is preferably 70% or higher, more preferably 80% or higher, still more preferably 85% or higher, and still more preferably 90% or higher.

(2) A light transmittance at a wavelength of 500 nm is preferably 70% or higher, more preferably 80% or higher, still more preferably 90% or higher, and still more preferably 95% or higher.

(3) A light transmittance at a wavelength of 600 nm is preferably 70% or higher, more preferably 80% or higher, still more preferably 90% or higher, and still more preferably 95% or higher.

(4) A light transmittance at a wavelength of 650 nm is preferably 70% or higher, more preferably 80% or higher, still more preferably 90% or higher, and still more preferably 95% or higher.

The film according to the embodiment of the present invention can be used in combination with a color filter that includes a chromatic colorant. The color filter can be manufactured using a coloring composition including a chromatic colorant. Examples of the chromatic colorant include the chromatic colorants which may be included in the resin composition according to the embodiment of the present invention. In addition, the film according to the embodiment of the present invention may be a filter having not only a function as a near infrared cut filter but also a function as a color filter by including a chromatic colorant.

In a case where the film according to the embodiment of the present invention is used as a near infrared cut filter and in combination with a color filter, it is preferable that the color filter is disposed on an optical path of the film according to the embodiment of the present invention. For example, the film according to the embodiment of the present invention and the color filter can be laminated to be used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid image pickup element may be interposed between the film according to the embodiment of the present invention and the color filter.

In the present invention, "near infrared cut filter" refers to a filter that allows transmission of light (visible light) in the visible range and blocks at least a part of light (near infrared light) in the near infrared range. The near infrared cut filter may be a filter that allows transmission of light in the entire wavelength range of the visible range, or may be a filter that allows transmission of light in a specific wavelength range of the visible range and blocks light in another specific wavelength range of the visible range. In addition, in the present invention, a color filter refers to a filter that allows transmission of light in a specific wavelength range of the visible range and blocks light in another specific wavelength range of the visible range. In addition, in the present invention, "infrared transmitting filter" refers to a filter that blocks visible light and allows transmission of at least a part of infrared light.

The film according to the embodiment of the present invention can be used in various devices including a solid image pickup element such as a charge coupled device (CCD) or a complementary metal-oxide semiconductor (CMOS), an infrared sensor, or an image display device.

<Film Forming Method>

The film according to the embodiment of the present invention can be formed through a step of applying the resin composition according to the embodiment of the present invention to a support.

Examples of the support include the above-described examples. As a method of applying the resin composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic method, screen printing, gravure printing, reverse offset printing, and metal mask printing; a transfer method using a mold or the like; and a nanoimprint method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A.

A resin composition layer formed by applying the resin composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 3000 seconds, more preferably 40 to 2500 seconds, and still more preferably 80 to 220 seconds. Drying can be performed using a hot plate, an oven, or the like.

The film forming method according to the embodiment of the present invention may further include a step of forming a pattern. Examples of a pattern forming method include a pattern forming method using a photolithography method and a pattern forming method using a dry etching method. In a case where the film according to the embodiment of the present invention is used as a flat film, the step of forming a pattern is not necessarily performed. Hereinafter, the step of forming a pattern will be described in detail.

(Case where Pattern is Formed Using Photolithography Method)

It is preferable that the pattern forming method using a photolithography method includes: a step (exposure step) of exposing the resin composition layer, which is formed by applying the resin composition according to the embodiment of the present invention, in a pattern shape; and a step (development step) of forming a pattern by removing a non-exposed portion of the resin composition layer for development. Optionally, the pattern forming method may further include a step (post-baking step) of baking the developed pattern. Hereinafter, the respective steps will be described.

<<Exposure Step>>

In the exposure step, the resin composition layer is exposed in a pattern shape. For example, the resin composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. For example, the irradiation dose (exposure dose) is preferably 0.03 to 2.5 $J/cm^2$, more preferably 0.05 to 1.0 $J/cm^2$, and most preferably 0.08 to 0.5 $J/cm^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

<<Development Step>>

Next, a pattern is formed by removing a non-exposed portion of the exposed resin composition layer by development. The non-exposed portion of the resin composition layer can be removed by development using a developer. As a result, a non-exposed portion of the resin composition layer in the exposure step is eluted into the developer, and only the photocured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, a surfactant may be added to the developer for use. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using heating means such as a hot plate, a convection oven (hot air circulation dryer), or a high-frequency heater under the above-described conditions. In addition, in a case where a pattern is formed through a low-temperature process, post-baking is not necessarily performed.

(Case where Pattern is Formed Using Dry Etching Method)

The formation of a pattern using a dry etching method can be performed using a method including: applying the resin composition according to the embodiment of the present invention to a support or the like to form a resin composition layer; curing the resin composition layer to form a cured composition layer; forming a patterned resist layer on the cured composition layer; and dry-etching the cured composition layer with etching gas by using the patterned resist layer as a mask. It is preferable that pre-baking is further performed in order to form the resist layer. The details of the pattern formation using the dry etching method can be found in paragraphs "0010" to "0067" of JP2013-064993A, the content of which is incorporated herein by reference.

<Optical Filter>

Next, an optical filter according to the embodiment of the present invention will be described. The optical filter according to the embodiment of the present invention includes the film according to the embodiment of the present invention. Examples of the optical filter include a near infrared cut filter and an infrared transmitting filter. Examples of the infrared transmitting filter include a filter that blocks visible light and allows transmission of light in a wavelength range of 900 nm or longer.

In the optical filter, the thickness of the film according to the embodiment of the present invention can be appropriately adjusted according to the purpose. The thickness is preferably 20 µm or less, more preferably 10 µm or less, and still more preferably 5 µm or less. For example, the lower limit is preferably 0.1 µm or more, more preferably 0.2 µm or more, and still more preferably 0.3 µm or more.

In a case where the optical filter according to the embodiment of the present invention is used as a near infrared cut filter, the optical filter may further include, for example, a layer containing copper, a dielectric multi-layer film, or an ultraviolet absorbing layer in addition to the film according to the embodiment of the present invention. By further including the layer containing copper and/or the dielectric multi-layer film, the near infrared cut filter having a viewing angle and excellent infrared blocking properties can be easily obtained. In addition, by including the ultraviolet absorbing layer, the near infrared cut filter having excellent ultraviolet blocking properties can be obtained. The details of the ultraviolet absorbing layer can be found in paragraphs "0040" to "0070" and paragraphs "0119" to "0145" of WO2015/099060, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass include the above-described examples. Examples of the copper complex include copper complexes described in JP2016-006476A, JP2016-006151A, and JP2015-158662A, the contents of which are incorporated herein by reference.

The optical filter according to the embodiment of the present invention can be used in various devices including a solid image pickup element such as a charge coupled device (CCD) or a complementary metal-oxide semiconductor (CMOS), an infrared sensor, or an image display device.

In addition, an aspect in which the optical filter according to the embodiment of the present invention includes a pixel of the film according to the embodiment of the present invention and a pixel selected from a red pixel, a green pixel, a blue pixel, a magenta pixel, a yellow pixel, a cyan pixel, a black pixel, or an achromatic pixel is also preferable.

<Solid Image Pickup Element>

A solid image pickup element according to the embodiment of the present invention includes the film according to the embodiment of the present invention. The configuration of the solid image pickup element according to the embodiment of the present invention is not particularly limited as long as it includes the film according to the embodiment of the present invention and functions as a solid image pickup element. For example, the following configuration can be adopted.

The solid image pickup element includes a plurality of photodiodes and transfer electrodes on the support, the photodiodes constituting a light receiving area of the solid image pickup element, and the transfer electrode being formed of polysilicon or the like. In the solid image pickup element, a light blocking film formed of tungsten or the like which has openings through only light receiving sections of the photodiodes is provided on the photodiodes and the transfer electrodes, a device protective film formed of silicon nitride or the like is formed on the light blocking film so as to cover the entire surface of the light blocking film and the light receiving sections of the photodiodes, and the film according to the embodiment of the present invention is formed on the device protective film. Further, a configuration in which light collecting means (for example, a microlens; hereinafter, the same shall be applied) is provided above the device protective film and below the film according to the embodiment of the present invention (on a side thereof close the support), or a configuration in which light collecting means is provided on the film according to the embodiment of the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention includes the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

The near infrared cut filter 111 can be formed using the resin composition according to the embodiment of the present invention. Spectral characteristics of the near infrared cut filters 111 can be selected according to the emission wavelength of an infrared light emitting diode (infrared LED) to be used. The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. Characteristics of the infrared transmitting filters 114 can be selected according to the emission wavelength of the infrared LED to be used.

For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and still more preferably 0.1% or lower. It is preferable that the transmittance satisfies the above-described conditions in the entire wavelength range of 400 to 650 nm. In addition, a minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in a part of a wavelength range of 800 nm or longer, and it is more preferable that the transmittance satisfies the above-described conditions at a wavelength corresponding to the emission wavelength of the infrared LED.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 30% or lower, that a light transmittance of the infrared transmitting filter 114 in the thickness direction at a wavelength of 835 nm is 30% or lower, and that a minimum value of a light transmittance of the infrared transmitting filter 114 in the thickness direction in a wavelength range of 1000 to 1300 nm is 70% or higher.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multilayer film may be provided. The details of the groups are as described above. In addition, as the other near infrared cut filter, a dual band pass filter may be used.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

Test Example 1

<Preparation of Resin Composition>

Raw materials shown in the following tables were mixed with each other to prepare a resin composition. In the resin composition in which a dispersion was used as a raw material, the dispersion was prepared as follows.

A near infrared absorbing colorant, a pigment derivative, a dispersant, and a solvent described in "Dispersion" of the following tables were mixed with each other in part(s) by mass shown in "Dispersion" of the following tables, 230 parts by mass of zirconia beads having a diameter of 0.3 mm was further added thereto, the mixture was dispersed using a paint shaker for 5 hours, and the beads were separated by filtration. As a result, a dispersion was manufactured.

TABLE 1

| Name | Dispersion | | | | | | | | Near Infrared Absorbing Colorant | | Resin | | Polymerizable Monomer | |
|---|---|---|---|---|---|---|---|---|---|---|---|---|---|---|
| | Near Infrared Absorbing Colorant | | Pigment Derivative | | Dispersant | | Solvent | | | | | | | |
| | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 1 | A1 | 2.5 | B1 | 0.5 | C1 | 1.8 | S1 | 39 | — | | D1 | 5.5 | M1 M2 M3 | 2.2 2.1 2.1 |
| Example 2 | A1 | 2.5 | B1 | 0.5 | C1 | 1.8 | S1 | 39 | — | | D1 | 5.5 | M1 M2 M3 | 2.2 2.1 2.1 |
| Example 3 | A1 | 2.5 | B1 | 0.5 | C1 | 1.8 | S1 | 39 | — | | D1 | 5.5 | M1 M2 M3 | 2.2 2.1 2.1 |
| Example 4 | A1 | 2.5 | B1 | 0.5 | C1 | 1.8 | S1 | 39 | — | | D1 | 5.5 | M1 M2 M3 | 2.2 2.1 2.1 |
| Example 5 | A1 | 2.5 | B1 | 0.5 | C1 | 1.8 | S1 | 39 | — | | D1 | 5.5 | M1 M2 M3 | 2.2 2.1 2.1 |
| Example 6 | A1 | 2.5 | B1 | 0.5 | C1 | 1.8 | S1 | 39 | — | | D1 | 5.5 | M1 M2 M3 | 2.2 2.1 2.1 |
| Example 7 | A1 | 2.5 | B1 | 0.5 | C1 | 1.8 | S1 | 39 | — | | D1 | 5.5 | M1 M2 M3 | 2.2 2.1 2.1 |
| Example 8 | A1 | 2.5 | B1 | 0.5 | C1 | 1.8 | S1 | 39 | — | | D1 | 5.5 | M1 M2 M3 | 2.2 2.1 2.1 |
| Example 9 | A1 | 2.5 | B1 | 0.5 | C1 | 1.8 | S1 | 39 | — | | D1 | 5.5 | M1 M2 M3 | 2.2 2.1 2.1 |
| Example 10 | A1 | 2.5 | B1 | 0.5 | C1 | 1.8 | S1 | 39 | — | | D1 | 5.5 | M1 M2 M3 | 2.2 2.1 2.1 |
| Example 11 | A1 | 2.5 | B1 | 0.5 | C1 | 1.8 | S1 | 39 | — | | D1 | 5.5 | M1 M2 M3 | 2.2 2.1 2.1 |
| Example 12 | A1 | 2.5 | B1 | 0.5 | C1 | 1.8 | S1 | 39 | — | | D1 | 5.5 | M1 M2 M3 | 2.2 2.1 2.1 |
| Example 13 | A1 | 2.5 | B1 | 0.5 | C1 | 1.8 | S1 | 39 | — | | D1 | 5.5 | M1 M2 M3 | 2.2 2.1 2.1 |
| Example 14 | A1 | 2.5 | B1 | 0.5 | C1 | 1.8 | S1 | 39 | — | | D1 | 5.5 | M1 M2 M3 | 2.2 2.1 2.1 |
| Example 15 | A1 | 2.5 | B1 | 0.5 | C1 | 1.8 | S1 | 39 | — | | D1 | 5.5 | M1 M2 M3 | 2.2 2.1 2.1 |
| Example 16 | A1 | 2.5 | B1 | 0.5 | C1 | 1.8 | S1 | 39 | — | | D1 | 5.5 | M1 M2 M3 | 2.2 2.1 2.1 |

| Name | Photopolymerization Initiator | | Ultraviolet Absorber | | Surfactant | | Polymerization Inhibitor | | Antioxidant 1 | | Antioxidant 2 | | Solvent | |
|---|---|---|---|---|---|---|---|---|---|---|---|---|---|---|
| | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 1 | F1 | 1 | UV1 | 1.6 | W1 | 0.025 | H1 | 0.003 | I1 | 0.1 | 121 | 0.1 | S1 | 41.5 |
| Example 2 | F1 | 1 | UV1 | 1.6 | W1 | 0.025 | H1 | 0.003 | I2 | 0.1 | 121 | 0.1 | S1 | 41.5 |
| Example 3 | F1 | 1 | UV1 | 1.6 | W1 | 0.025 | H1 | 0.003 | I3 | 0.1 | 121 | 0.1 | S1 | 41.5 |
| Example 4 | F1 | 1 | UV1 | 1.6 | W1 | 0.025 | H1 | 0.003 | I4 | 0.1 | 121 | 0.1 | S1 | 41.5 |
| Example 5 | F1 | 1 | UV1 | 1.6 | W1 | 0.025 | H1 | 0.003 | I5 | 0.1 | 121 | 0.1 | S1 | 41.5 |
| Example 6 | F1 | 1 | UV1 | 1.6 | W1 | 0.025 | H1 | 0.003 | I6 | 0.1 | 121 | 0.1 | S1 | 41.5 |
| Example 7 | F1 | 1 | UV1 | 1.6 | W1 | 0.025 | H1 | 0.003 | I7 | 0.1 | 121 | 0.1 | S1 | 41.5 |
| Example 8 | F1 | 1 | UV1 | 1.6 | W1 | 0.025 | H1 | 0.003 | I8 | 0.1 | 121 | 0.1 | S1 | 41.5 |
| Example 9 | F1 | 1 | UV1 | 1.6 | W1 | 0.025 | H1 | 0.003 | I9 | 0.1 | 121 | 0.1 | S1 | 41.5 |
| Example 10 | F1 | 1 | UV1 | 1.6 | W1 | 0.025 | H1 | 0.003 | I1 I2 | 0.05 0.05 | 121 | 0.1 | S1 | 41.5 |
| Example 11 | F1 | 1 | UV1 | 1.6 | W1 | 0.025 | H1 | 0.003 | I1 I5 | 0.05 0.05 | 121 | 0.1 | S1 | 41.5 |

TABLE 1-continued

| Name | Kind | Parts | Kind | Parts | Kind | Parts | Kind | Parts | Kind | Parts | | | Kind | Parts |
|---|---|---|---|---|---|---|---|---|---|---|---|---|---|---|
| Example 12 | F1 | 1 | UV1 | 1.6 | W1 | 0.025 | H1 | 0.003 | I1 | 0.05 | 121 | 0.1 | S1 | 41.5 |
| | | | | | | | | | I8 | 0.05 | | | | |
| Example 13 | F1 | 1 | UV1 | 1.6 | W1 | 0.025 | H1 | 0.003 | I8 | 0.05 | 121 | 0.1 | S1 | 41.5 |
| | | | | | | | | | I9 | 0.05 | | | | |
| Example 14 | F1 | 1 | UV1 | 1.6 | W1 | 0.025 | H1 | 0.003 | I1 | 0.1 | | | S1 | 41.6 |
| Example 15 | F1 | 1 | UV1 | 1.6 | W1 | 0.025 | H1 | 0.003 | I2 | 0.1 | | | S1 | 41.6 |
| Example 16 | F1 | 1 | UV1 | 1.6 | W1 | 0.025 | H1 | 0.003 | I3 | 0.1 | | | S1 | 41.6 |

TABLE 2

| | Dispersion | | | | | | | | Near Infrared Absorbing Colorant | | Resin | | Polymerizable Monomer | |
|---|---|---|---|---|---|---|---|---|---|---|---|---|---|---|
| | Near Infrared Absorbing Colorant | | Pigment Derivative | | Dispersant | | Solvent | | | | | | | |
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 17 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 18 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 19 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 20 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 21 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 22 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 23 | A1 | 2.5 | B1 | 0.5 | C1 | 1.8 | S1 | 39 | — | | D1 | 5.5 | M1 | 6.4 |
| Example 24 | A1 | 2.5 | B1 | 0.5 | C1 | 1.8 | S1 | 39 | — | | D1 | 5.5 | M2 | 6.4 |
| Example 25 | A1 | 2.5 | B1 | 0.5 | C1 | 1.8 | S1 | 39 | — | | D1 | 5.5 | M3 | 6.4 |
| Example 26 | A1 | 2.5 | B1 | 0.5 | C1 | 1.8 | S1 | 39 | — | | D2 | 5.5 | M1 | 2.2 |
| | | | | | | | | | | | | | M2 | 2.1 |
| | | | | | | | | | | | | | M3 | 2.1 |
| Example 27 | A1 | 2.5 | B1 | 0.5 | C1 | 1.8 | S1 | 39 | — | | D3 | 5.5 | M1 | 2.2 |
| | | | | | | | | | | | | | M2 | 2.1 |
| | | | | | | | | | | | | | M3 | 2.1 |
| Example 28 | A1 | 2.5 | B1 | 0.5 | C1 | 1.8 | S1 | 39 | — | | D2 | 3 | M1 | 2.2 |
| | | | | | | | | | | | D3 | 2.5 | M2 | 2.1 |
| | | | | | | | | | | | | | M3 | 2.1 |
| Example 29 | | | | | | | | | A5 | 6 | D1 | 2.5 | M1 | 2.2 |
| | | | | | | | | | | | | | M2 | 2.1 |
| | | | | | | | | | | | | | M3 | 2.1 |
| Example 30 | | | | | | | | | A5 | 2 | D1 | 6.5 | M1 | 2.2 |
| | | | | | | | | | | | | | M2 | 2.1 |
| | | | | | | | | | | | | | M3 | 2.1 |
| Example 31 | | | | | | | | | A5 | 1 | D1 | 7.5 | M1 | 2.2 |
| | | | | | | | | | | | | | M2 | 2.1 |
| | | | | | | | | | | | | | M3 | 2.1 |
| Example 32 | A1 | 2.5 | B1 | 0.5 | C1 | 1.8 | S1 | 39 | — | | D2 | 2.5 | M1 | 3.2 |
| | | | | | | | | | | | | | M2 | 3.1 |
| | | | | | | | | | | | | | M3 | 3.1 |
| Example 33 | A1 | 2.5 | B1 | 0.5 | C1 | 1.8 | S1 | 39 | — | | D2 | 7.5 | M1 | 1.5 |
| | | | | | | | | | | | | | M2 | 1.5 |
| | | | | | | | | | | | | | M3 | 1.4 |

TABLE 2-continued

| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
|---|---|---|---|---|---|---|---|---|---|---|---|---|---|---|
| Example 34 | A1 | 2.5 | B1 | 0.5 | C1 | 1.8 | S1 | 39 | — | | D2 | 9.5 | M1 | 0.8 |
| | | | | | | | | | | | | | M2 | 0.8 |
| | | | | | | | | | | | | | M3 | 0.8 |

| | Photopolymerization Initiator | | Ultraviolet Absorber | | Surfactant | | Polymerization Inhibitor | | Antioxidant 1 | | Antioxidant 2 | | Solvent | |
|---|---|---|---|---|---|---|---|---|---|---|---|---|---|---|
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 17 | F1 | 1 | UV1 | 1.6 | W1 | 0.025 | H1 | 0.003 | I5 | 0.1 | | | S1 | 41.6 |
| Example 18 | F1 | 1 | UV1 | 1.6 | W1 | 0.025 | H1 | 0.003 | I8 | 0.1 | | | S1 | 41.6 |
| Example 19 | F1 | 1 | UV1 | 1.6 | W1 | 0.025 | H1 | 0.003 | I9 | 0.1 | | | S1 | 41.6 |
| Example 20 | F1 | 1 | UV1 | 1.6 | W1 | 0.025 | H1 | 0.003 | I10 | 0.2 | | | S1 | 41.5 |
| Example 21 | F1 | 1 | UV1 | 1.6 | W1 | 0.025 | H1 | 0.003 | I1 | 0.1 | I22 | 0.1 | S1 | 41.5 |
| Example 22 | F1 | 1 | UV1 | 1.6 | W1 | 0.025 | H1 | 0.003 | I2 | 0.1 | I21 | 0.05 | S1 | 41.5 |
| | | | | | | | | | | | I22 | 0.05 | | |
| Example 23 | F1 | 1 | UV1 | 1.6 | W1 | 0.025 | H1 | 0.003 | I1 | 0.1 | 121 | 0.1 | S1 | 41.5 |
| Example 24 | F1 | 1 | UV1 | 1.6 | W1 | 0.025 | H1 | 0.003 | I1 | 0.1 | 121 | 0.1 | S1 | 41.5 |
| Example 25 | F1 | 1 | UV1 | 1.6 | W1 | 0.025 | H1 | 0.003 | I1 | 0.1 | 121 | 0.1 | S1 | 41.5 |
| Example 26 | F1 | 1 | UV1 | 1.6 | W1 | 0.025 | H1 | 0.003 | I1 | 0.1 | 121 | 0.1 | S1 | 41.5 |
| Example 27 | F1 | 1 | UV1 | 1.6 | W1 | 0.025 | H1 | 0.003 | I1 | 0.1 | 121 | 0.1 | S1 | 41.5 |
| Example 28 | F1 | 1 | UV1 | 1.6 | W1 | 0.025 | H1 | 0.003 | I1 | 0.1 | 121 | 0.1 | S1 | 41.5 |
| Example 29 | F1 | 1 | UV1 | 1.6 | W1 | 0.025 | H1 | 0.003 | I1 | 0.1 | 121 | 0.1 | S1 | 80.5 |
| Example 30 | F1 | 1 | UV1 | 1.6 | W1 | 0.025 | H1 | 0.003 | I1 | 0.1 | 121 | 0.1 | S1 | 80.5 |
| Example 31 | F1 | 1 | UV1 | 1.6 | W1 | 0.025 | H1 | 0.003 | I1 | 0.1 | 121 | 0.1 | S1 | 80.5 |
| Example 32 | F1 | 1 | UV1 | 1.6 | W1 | 0.025 | H1 | 0.003 | I1 | 0.1 | 121 | 0.1 | S1 | 80.5 |
| Example 33 | F1 | 1 | UV1 | 1.6 | W1 | 0.025 | H1 | 0.003 | I1 | 0.1 | 121 | 0.1 | S1 | 41.5 |
| Example 34 | F1 | 1 | UV1 | 1.6 | W1 | 0.025 | H1 | 0.003 | I1 | 0.1 | 121 | 0.1 | S1 | 41.5 |

TABLE 3

| | Dispersion | | | | | | | | Near Infrared Absorbing Colorant | | Resin | | Polymerizable Monomer | |
|---|---|---|---|---|---|---|---|---|---|---|---|---|---|---|
| | Near Infrared Absorbing Colorant | | Pigment Derivative | | Dispersant | | Solvent | | | | | | | |
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 35 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 36 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 37 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 38 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 39 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 40 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 41 | A2 | 2.5 | B4 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 42 | A3 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 43 | A4 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 44 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Example 45 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |

TABLE 3-continued

| Name | | | | | | | Kind | Part(s) by Mass | Kind | Part(s) by Mass | Kind | Part(s) by Mass |
|---|---|---|---|---|---|---|---|---|---|---|---|---|
| Example 46 | | | | | | | A5 | 3 | D1 | 5.5 | M1 | 2.2 |
| | | | | | | | | | | | M2 | 2.1 |
| | | | | | | | | | | | M3 | 2.1 |
| Example 47 | | | | | | | A6 | 3 | D1 | 5.5 | M1 | 2.2 |
| | | | | | | | | | | | M2 | 2.1 |
| | | | | | | | | | | | M3 | 2.1 |
| Example 48 | | | | | | | A7 | 3 | D1 | 5.5 | M1 | 2.2 |
| | | | | | | | | | | | M2 | 2.1 |
| | | | | | | | | | | | M3 | 2.1 |
| Example 49 | | | | | | | A8 | 3 | D1 | 5.5 | M1 | 2.2 |
| | | | | | | | | | | | M2 | 2.1 |
| | | | | | | | | | | | M3 | 2.1 |
| Example 50 | | | | | | | A9 | 3 | D1 | 5.5 | M1 | 2.2 |
| | | | | | | | | | | | M2 | 2.1 |
| | | | | | | | | | | | M3 | 2.1 |

| | Photopolymerization Initiator | | Ultraviolet Absorber | | Surfactant | | Polymerization Inhibitor | | Antioxidant 1 | | Antioxidant 2 | | Solvent | |
|---|---|---|---|---|---|---|---|---|---|---|---|---|---|---|
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 35 | F2 | 1 | UV1 | 1.6 | W1 | 0.025 | H1 | 0.003 | I1 | 0.1 | I21 | 0.1 | S1 | 41.5 |
| Example 36 | F3 | 1 | UV1 | 1.6 | W1 | 0.025 | H1 | 0.003 | I1 | 0.1 | I21 | 0.1 | S1 | 41.5 |
| Example 37 | F2 | 0.5 | UV1 | 1.6 | W1 | 0.025 | H1 | 0.003 | I1 | 0.1 | I21 | 0.1 | S1 | 41.5 |
| | F3 | 0.5 | | | | | | | | | | | | |
| Example 38 | F1 | 1 | UV2 | 1.6 | W1 | 0.025 | H1 | 0.003 | I1 | 0.1 | I21 | 0.1 | S1 | 41.5 |
| Example 39 | F1 | 1 | UV3 | 1.6 | W1 | 0.025 | H1 | 0.003 | I1 | 0.1 | I21 | 0.1 | S1 | 41.5 |
| Example 40 | F1 | 1 | UV2 | 0.8 | W1 | 0.025 | H1 | 0.003 | I1 | 0.1 | I21 | 0.1 | S1 | 41.5 |
| | | | UV3 | 0.8 | | | | | | | | | | |
| Example 41 | F1 | 1 | UV1 | 1.6 | W1 | 0.025 | H1 | 0.003 | I1 | 0.1 | I21 | 0.1 | S1 | 41.5 |
| Example 42 | F1 | 1 | UV1 | 1.6 | W1 | 0.025 | H1 | 0.003 | I1 | 0.1 | I21 | 0.1 | S1 | 41.5 |
| Example 43 | F1 | 1 | UV1 | 1.6 | W1 | 0.025 | H1 | 0.003 | I1 | 0.1 | I21 | 0.1 | S1 | 41.5 |
| Example 44 | F1 | 1 | UV1 | 1.6 | W1 | 0.025 | H1 | 0.003 | I1 | 0.1 | I21 | 0.1 | S1 | 33.5 |
| | | | | | | | | | | | | | S2 | 8 |
| Example 45 | F1 | 1 | UV1 | 1.6 | W1 | 0.025 | H1 | 0.003 | I1 | 0.1 | I21 | 0.1 | S1 | 33.5 |
| | | | | | | | | | | | | | S3 | 8 |
| Example 46 | F1 | 1 | UV1 | 1.6 | W1 | 0.025 | H1 | 0.003 | I1 | 0.1 | I21 | 0.1 | S1 | 80.5 |
| Example 47 | F1 | 1 | UV1 | 1.6 | W1 | 0.025 | H1 | 0.003 | I1 | 0.1 | I21 | 0.1 | S1 | 80.5 |
| Example 48 | F1 | 1 | UV1 | 1.6 | W1 | 0.025 | H1 | 0.003 | I1 | 0.1 | I21 | 0.1 | S1 | 80.5 |
| Example 49 | F1 | 1 | UV1 | 1.6 | W1 | 0.025 | H1 | 0.003 | I1 | 0.1 | I21 | 0.1 | S1 | 80.5 |
| Example 50 | F1 | 1 | UV1 | 1.6 | W1 | 0.025 | H1 | 0.003 | I1 | 0.1 | I21 | 0.1 | S1 | 80.5 |

TABLE 4

| | Dispersion | | | | | | | | Near Infrared Absorbing Colorant | | Resin | | Polymerizable Monomer | |
|---|---|---|---|---|---|---|---|---|---|---|---|---|---|---|
| | Near Infrared Absorbing Colorant | | Pigment Derivative | | Dispersant | | Solvent | | | | | | | |
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 51 | | | | | | | | | A10 | 3 | D1 | 5.5 | M1 | 2.2 |
| | | | | | | | | | | | | | M2 | 2.1 |
| | | | | | | | | | | | | | M3 | 2.1 |
| Example 52 | | | | | | | | | A11 | 3 | D1 | 5.5 | M1 | 2.2 |
| | | | | | | | | | | | | | M2 | 2.1 |
| | | | | | | | | | | | | | M3 | 2.1 |
| Example 53 | | | | | | | | | A12 | 3 | D1 | 5.5 | M1 | 2.2 |
| | | | | | | | | | | | | | M2 | 2.1 |
| | | | | | | | | | | | | | M3 | 2.1 |
| Example 54 | | | | | | | | | A13 | 3 | D1 | 5.5 | M1 | 2.2 |
| | | | | | | | | | | | | | M2 | 2.1 |
| | | | | | | | | | | | | | M3 | 2.1 |
| Example 55 | | | | | | | | | A14 | 3 | D1 | 5.5 | M1 | 2.2 |
| | | | | | | | | | | | | | M2 | 2.1 |
| | | | | | | | | | | | | | M3 | 2.1 |
| Example 56 | | | | | | | | | A15 | 3 | D1 | 5.5 | M1 | 2.2 |
| | | | | | | | | | | | | | M2 | 2.1 |
| | | | | | | | | | | | | | M3 | 2.1 |

TABLE 4-continued

| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
|---|---|---|---|---|---|---|---|---|---|---|---|---|---|---|
| Example 57 | | | | | | | | | A16 | 3 | D1 | 5.5 | M1 | 2.2 |
| | | | | | | | | | | | | | M2 | 2.1 |
| | | | | | | | | | | | | | M3 | 2.1 |
| Example 58 | A1 | 1.25 | B1 | 0.5 | C1 | 1.8 | S1 | 39 | | | D1 | 5.5 | M1 | 2.2 |
| | A4 | 1.25 | | | | | | | | | | | M2 | 2.1 |
| | | | | | | | | | | | | | M3 | 2.1 |
| Example 59 | | | | | | | | | A8 | 1.5 | D1 | 5.5 | M1 | 2.2 |
| | | | | | | | | | A9 | 1.5 | | | M2 | 2.1 |
| | | | | | | | | | | | | | M3 | 2.1 |
| Example 60 | | | | | | | | | A10 | 1 | D1 | 5.5 | M1 | 2.2 |
| | | | | | | | | | A11 | 1 | | | M2 | 2.1 |
| | | | | | | | | | A12 | 1 | | | M3 | 2.1 |
| Example 61 | A3 | 1.25 | B1 | 0.5 | C1 | 1.8 | S1 | 19.5 | A5 | 1.5 | D1 | 5.5 | M1 | 2.2 |
| | | | | | | | | | | | | | M2 | 2.1 |
| | | | | | | | | | | | | | M3 | 2.1 |
| Example 62 | A1 | 2.5 | B2 | 0.5 | C1 | 1.8 | S1 | 39 | | | D1 | 5.5 | M1 | 2.2 |
| | | | | | | | | | | | | | M2 | 2.1 |
| | | | | | | | | | | | | | M3 | 2.1 |
| Example 63 | A1 | 1.25 | B3 | 0.5 | C1 | 1.8 | S1 | 39 | | | D1 | 5.5 | M1 | 2.2 |
| | | | | | | | | | | | | | M2 | 2.1 |
| | | | | | | | | | | | | | M3 | 2.1 |
| Example 64 | A1 | 1.25 | B4 | 0.5 | C1 | 1.8 | S1 | 39 | | | D1 | 5.5 | M1 | 2.2 |
| | | | | | | | | | | | | | M2 | 2.1 |
| | | | | | | | | | | | | | M3 | 2.1 |
| Example 65 | A1 | 1.25 | B5 | 0.5 | C1 | 1.8 | S1 | 39 | | | D1 | 5.5 | M1 | 2.2 |
| | | | | | | | | | | | | | M2 | 2.1 |
| | | | | | | | | | | | | | M3 | 2.1 |

| | Photopolymerization Initiator | | Ultraviolet Absorber | | Surfactant | | Polymerization Inhibitor | | Antioxidant 1 | | Antioxidant 2 | | Solvent | |
|---|---|---|---|---|---|---|---|---|---|---|---|---|---|---|
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 50 | F1 | 1 | UV1 | 1.6 | W1 | 0.025 | H1 | 0.003 | I1 | 0.1 | I21 | 0.1 | S1 | 80.5 |
| Example 51 | F1 | 1 | UV1 | 1.6 | W1 | 0.025 | H1 | 0.003 | I1 | 0.1 | I21 | 0.1 | S1 | 80.5 |
| Example 52 | F1 | 1 | UV1 | 1.6 | W1 | 0.025 | H1 | 0.003 | I1 | 0.1 | I21 | 0.1 | S1 | 80.5 |
| Example 53 | F1 | 1 | UV1 | 1.6 | W1 | 0.025 | H1 | 0.003 | I1 | 0.1 | I21 | 0.1 | S1 | 80.5 |
| Example 54 | F1 | 1 | UV1 | 1.6 | W1 | 0.025 | H1 | 0.003 | I1 | 0.1 | I21 | 0.1 | S1 | 80.5 |
| Example 55 | F1 | 1 | UV1 | 0.8 | W1 | 0.025 | H1 | 0.003 | I1 | 0.1 | I21 | 0.1 | S1 | 80.5 |
| Example 56 | F1 | 1 | UV1 | 1.6 | W1 | 0.025 | H1 | 0.003 | I1 | 0.1 | I21 | 0.1 | S1 | 80.5 |
| Example 57 | F1 | 1 | UV1 | 1.6 | W1 | 0.025 | H1 | 0.003 | I1 | 0.1 | I21 | 0.1 | S1 | 80.5 |
| Example 58 | F1 | 1 | UV1 | 1.6 | W1 | 0.025 | H1 | 0.003 | I1 | 0.1 | I21 | 0.1 | S1 | 41.5 |
| Example 59 | F1 | 1 | UV1 | 1.6 | W1 | 0.025 | H1 | 0.003 | I1 | 0.1 | I21 | 0.1 | S1 | 80.5 |
| Example 60 | F1 | 1 | UV1 | 1.6 | W1 | 0.025 | H1 | 0.003 | I1 | 0.1 | I21 | 0.1 | S1 | 80.5 |
| Example 61 | F1 | 1 | UV1 | 1.6 | W1 | 0.025 | H1 | 0.003 | I1 | 0.1 | I21 | 0.1 | S1 | 61.9 |
| Example 62 | F1 | 1 | UV1 | 1.6 | W1 | 0.025 | H1 | 0.003 | I1 | 0.1 | I21 | 0.1 | S1 | 41.5 |
| Example 63 | F1 | 1 | UV1 | 1.6 | W1 | 0.025 | H1 | 0.003 | I1 | 0.1 | I21 | 0.1 | S1 | 41.5 |
| Example 64 | F1 | 1 | UV1 | 1.6 | W1 | 0.025 | H1 | 0.003 | I1 | 0.1 | I21 | 0.1 | S1 | 41.5 |
| Example 65 | F1 | 1 | UV1 | 1.6 | W1 | 0.025 | H1 | 0.003 | I1 | 0.1 | I21 | 0.1 | S1 | 41.5 |

TABLE 5

| | Dispersion | | | | | | | | Near Infrared Absorbing Colorant | | Resin | | Polymerizable Monomer | |
|---|---|---|---|---|---|---|---|---|---|---|---|---|---|---|
| | Near Infrared Absorbing Colorant | | Pigment Derivative | | Dispersant | | Solvent | | | | | | | |
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 66 | A1 | 2.5 | B6 | 0.5 | C2 | 1.8 | S1 | 39 | | | D1 | 5.5 | M1 | 2.2 |
| | | | | | | | | | | | | | M2 | 2.1 |
| | | | | | | | | | | | | | M3 | 2.1 |
| Example 67 | A1 | 2.5 | B7 | 0.5 | C2 | 1.8 | S1 | 39 | | | D1 | 5.5 | M1 | 2.2 |
| | | | | | | | | | | | | | M2 | 2.1 |
| | | | | | | | | | | | | | M3 | 2.1 |
| Example 68 | A1 | 2.5 | B1 | 0.25 | C1 | 1.8 | S1 | 39 | | | D1 | 5.5 | M1 | 2.2 |
| | | | B2 | 0.25 | | | | | | | | | M2 | 2.1 |
| | | | | | | | | | | | | | M3 | 2.1 |
| Example 69 | | | | | | | | | A5 | 0.6 | D4 | 7.9 | M1 | 2.2 |
| | | | | | | | | | | | | | M2 | 2.1 |
| | | | | | | | | | | | | | M3 | 2.1 |

TABLE 5-continued

| Name | | | | | | | | | Kind | Part(s) by Mass | Kind | Part(s) by Mass | Kind | Part(s) by Mass |
|---|---|---|---|---|---|---|---|---|---|---|---|---|---|---|
| Example 70 | | | | | | | | | A5 | 0.6 | D5 | 7.9 | M1 | 2.2 |
| | | | | | | | | | | | | | M2 | 2.1 |
| | | | | | | | | | | | | | M3 | 2.1 |
| Comparative Example 1 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Comparative Example 2 | A1 | 2.5 | B4 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Comparative Example 3 | A1 | 2.5 | B1 | 0.5 | C1 | 1.8 | S1 | 39 | — | | D1 | 5.5 | M1 | 2.2 |
| | | | | | | | | | | | | | M2 | 2.1 |
| | | | | | | | | | | | | | M3 | 2.1 |
| Comparative Example 4 | A1 | 2.5 | B1 | 0.5 | C1 | 1.8 | S1 | 39 | — | | D1 | 5.5 | M1 | 2.2 |
| | | | | | | | | | | | | | M2 | 2.1 |

| | Photopolymerization Initiator | | Ultraviolet Absorber | | Surfactant | | Polymerization Inhibitor | | Antioxidant 1 | | Antioxidant 2 | | Solvent | |
|---|---|---|---|---|---|---|---|---|---|---|---|---|---|---|
| Name | Kind | Part(s) by Mass | Kind | Part(s) by Mass | Kind | Part(s) by Mass | Kind | Part(s) by Mass | Kind | Part(s) by Mass | Kind | Part(s) by Mass | Kind | Part(s) by Mass |
| Example 66 | F1 | 1 | UV1 | 1.6 | W1 | 0.025 | H1 | 0.003 | I1 | 0.1 | I21 | 0.1 | S1 | 41.5 |
| Example 67 | F1 | 1 | UV1 | 1.6 | W1 | 0.025 | H1 | 0.003 | I1 | 0.1 | I21 | 0.1 | S1 | 41.5 |
| Example 68 | F1 | 1 | UV1 | 1.6 | W1 | 0.025 | H1 | 0.003 | I1 | 0.1 | I21 | 0.1 | S1 | 41.5 |
| Example 69 | F1 | 1 | UV1 | 1.6 | W1 | 0.025 | H1 | 0.003 | I1 | 0.1 | | | S1 | 80.5 |
| Example 70 | F1 | 1 | UV1 | 1.6 | W1 | 0.025 | H1 | 0.003 | I1 | 0.1 | | | S1 | 80.5 |
| Comparative Example 1 | F1 | 1 | UV1 | 1.6 | W1 | 0.025 | H1 | 0.003 | | | | | S1 | 41.7 |
| Comparative Example 2 | F1 | 1 | UV1 | 1.6 | W1 | 0.025 | H1 | 0.003 | | | I23 | 0.1 | S1 | 41.6 |
| Comparative Example 3 | F1 | 1 | UV1 | 1.6 | W1 | 0.025 | H1 | 0.003 | | | I24 | 0.1 | S1 | 41.7 |
| Comparative Example 4 | F1 | 1 | UV1 | 1.6 | W1 | 0.025 | H1 | 0.003 | | | I25 | 0.1 | S1 | 41.6 |

The raw materials shown above in the table are as follows.

(Near Infrared Absorbing Colorant)

A1 to A7: compounds having the following structures. In the following formulae, Me represents a methyl group, Ph represents a phenyl group, and EH represents an ethylhexyl group.

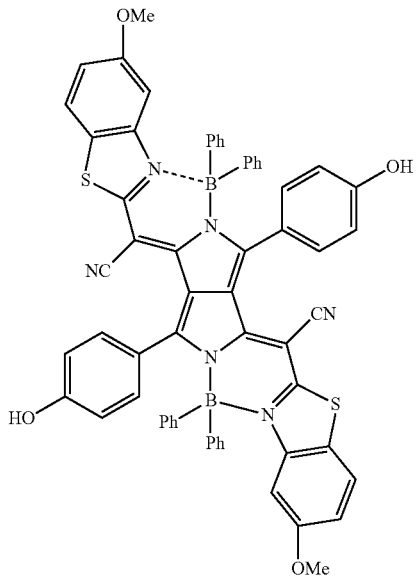

(A1)

(A2)
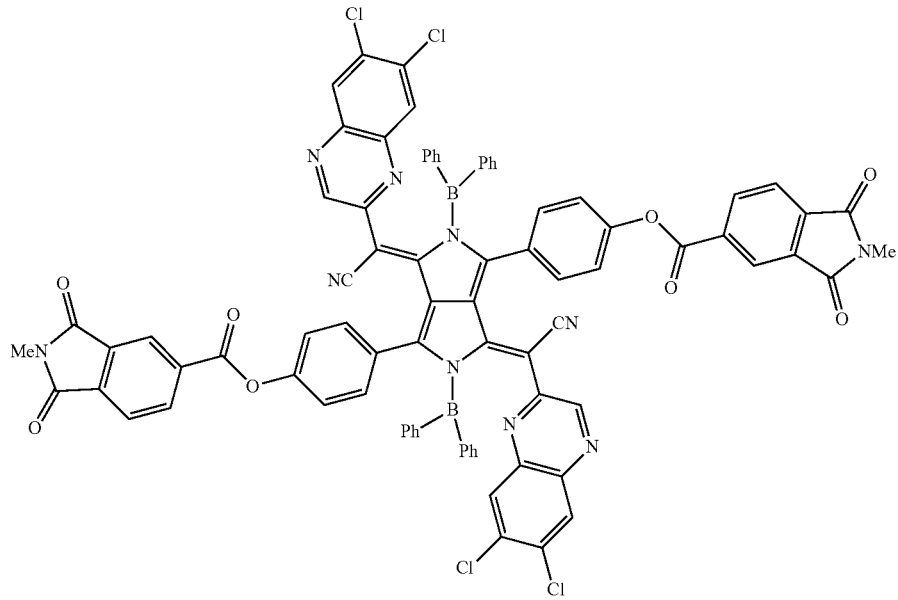
(A3)
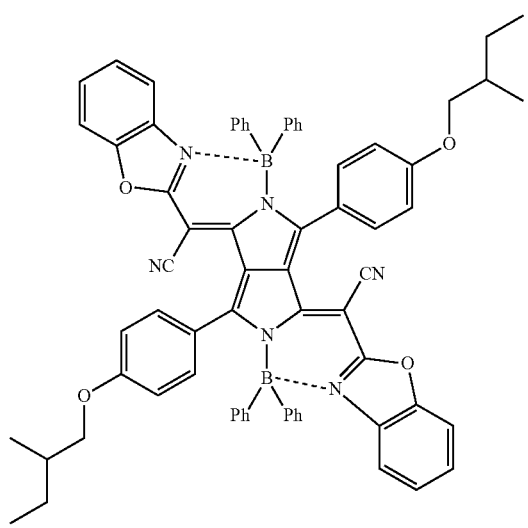
(A4)
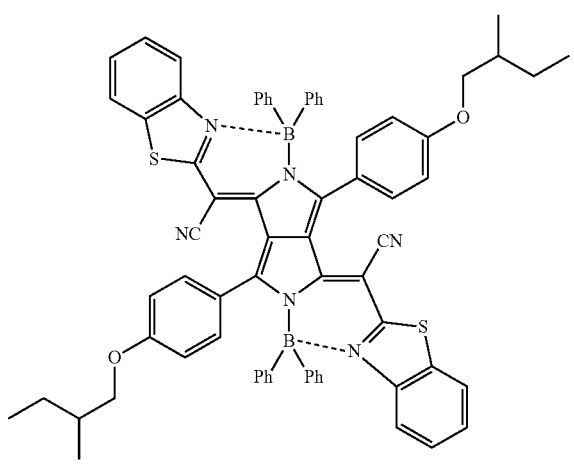
(A5)
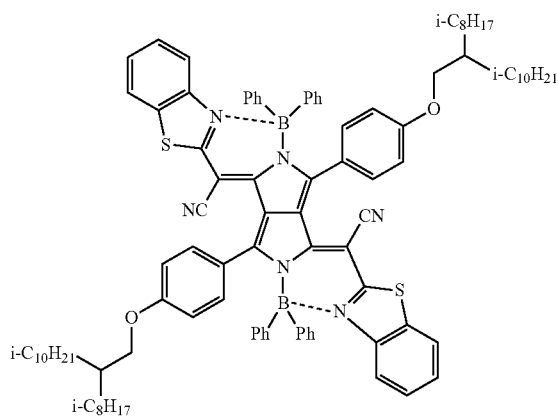
(A6)
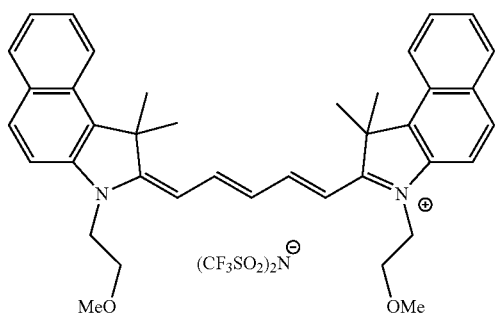

-continued (A7)

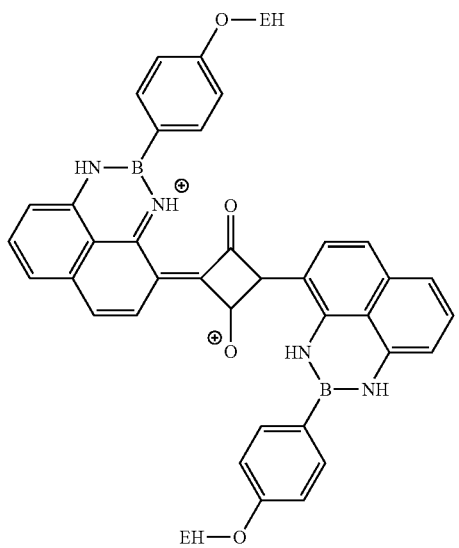

A8: a compound 31 described in paragraph "0051" of JP2008-088426A
A9: a compound 16 described in paragraph "0049" of JP2008-088426A
A10: a compound a-1 described in paragraph "0173" of JP2016-146619A
A11: a compound a-2 described in paragraph "0173" of JP2016-146619A
A12: a compound a-3 described in paragraph "0173" of JP2016-146619A
A13: NK-5060 (manufactured by Hayashibara Co., Ltd., Cyanine Compound)
A14 to A16: compounds having the following structures.

(A14)

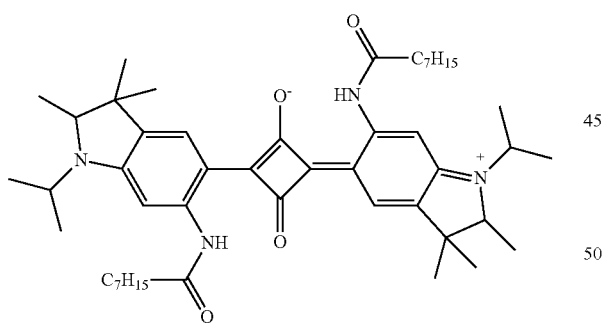

(A15)

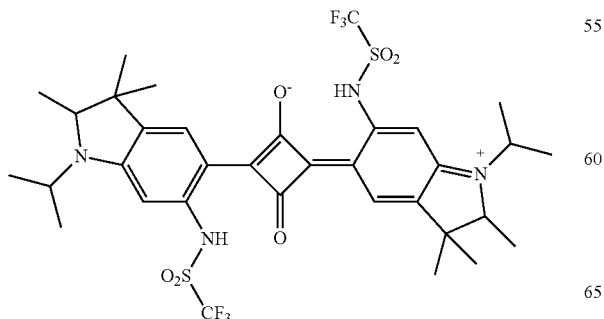

-continued (A16)

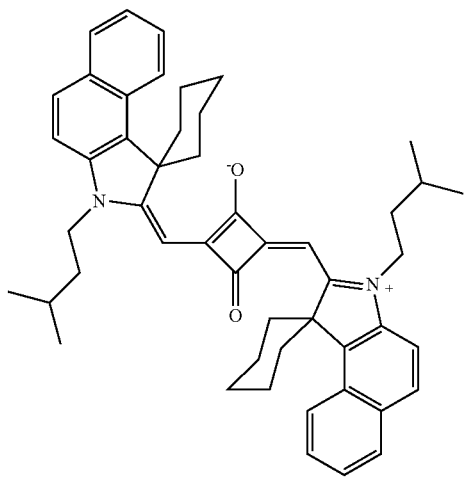

(Pigment Derivative)

B1 to B7: compounds having the following structures. In the following structural formulae, Me represents a methyl group, and Ph represents a phenyl group.

101
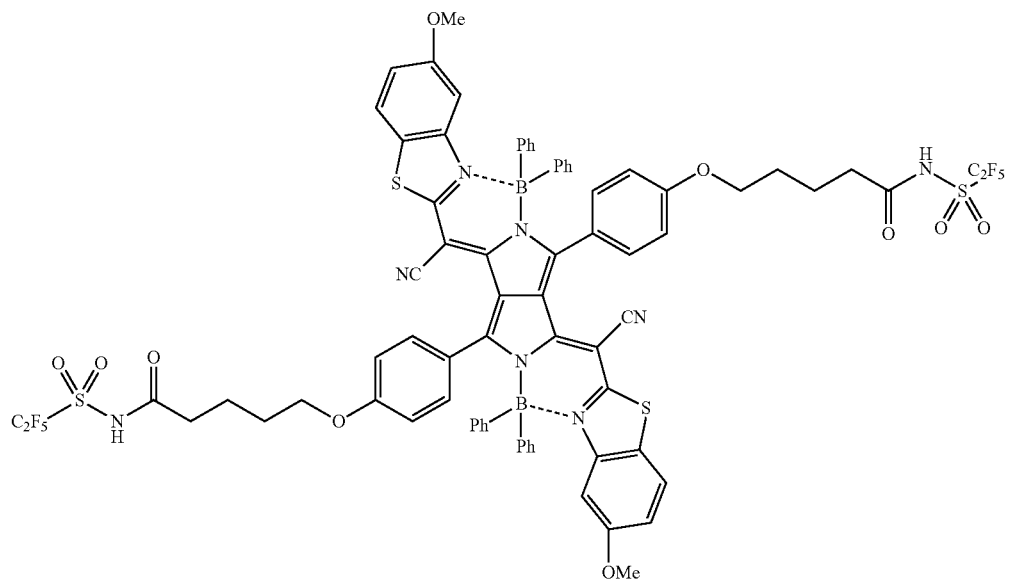
(B1)
102
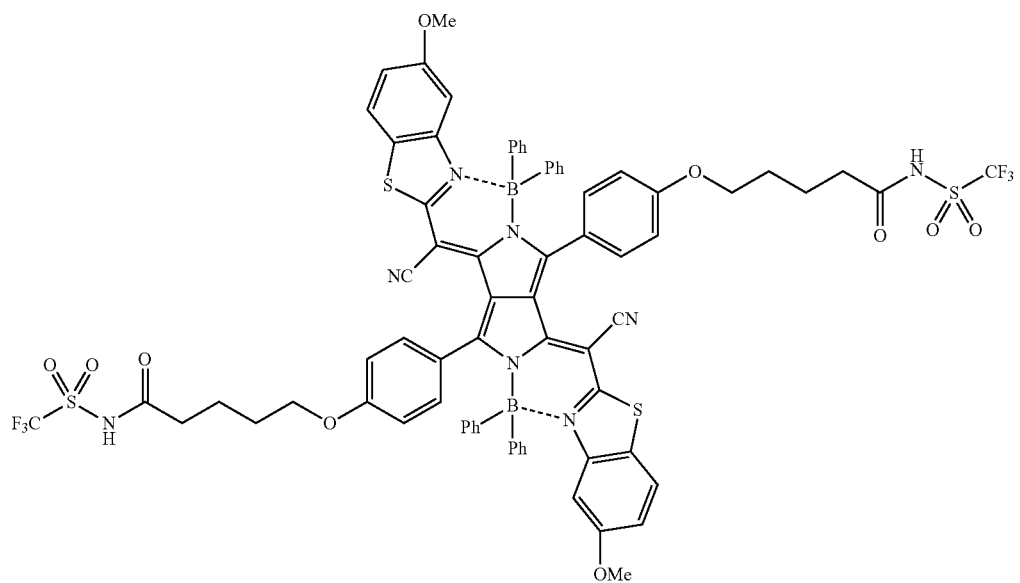
(B2)

-continued
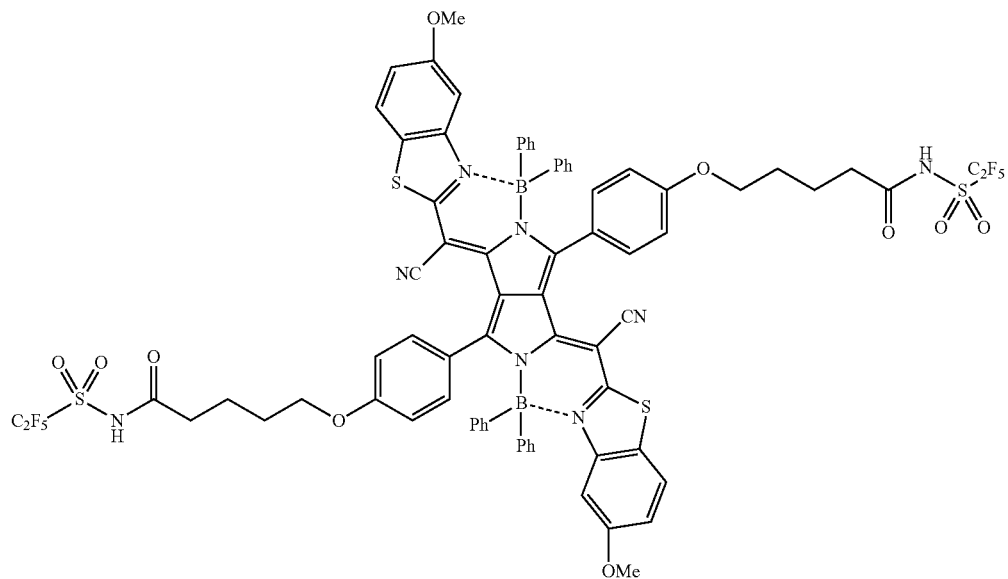
(B3)
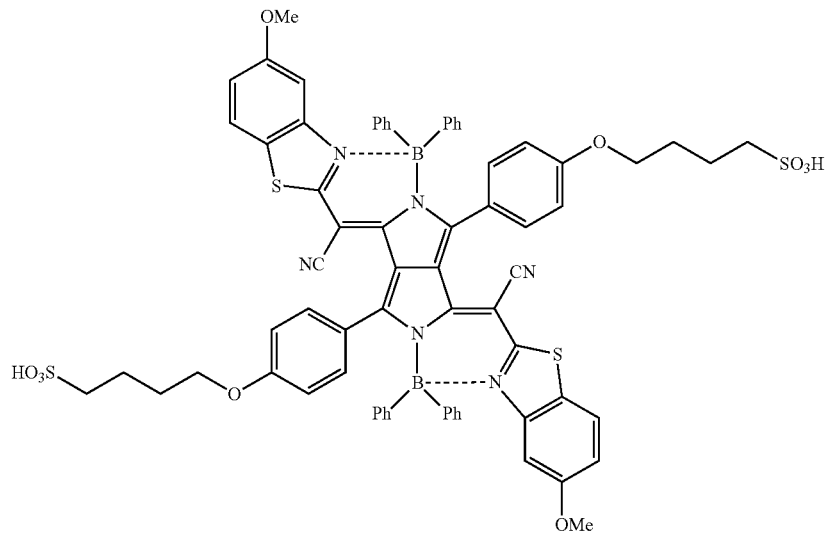
(B4)
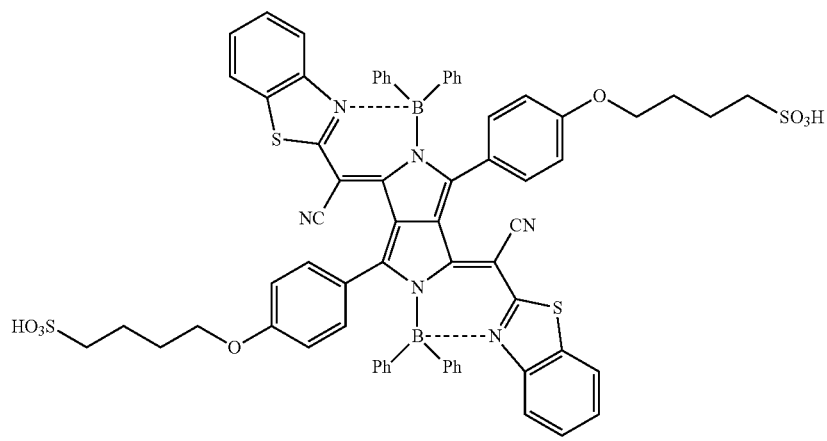
(B5)

(B6)

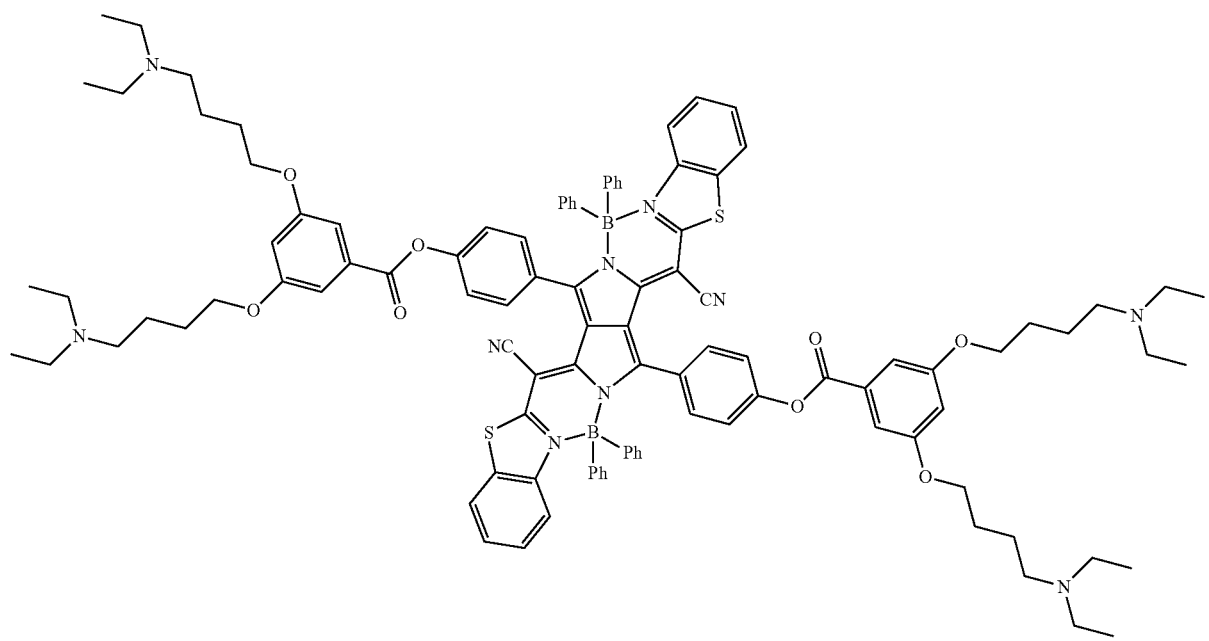

(B7)

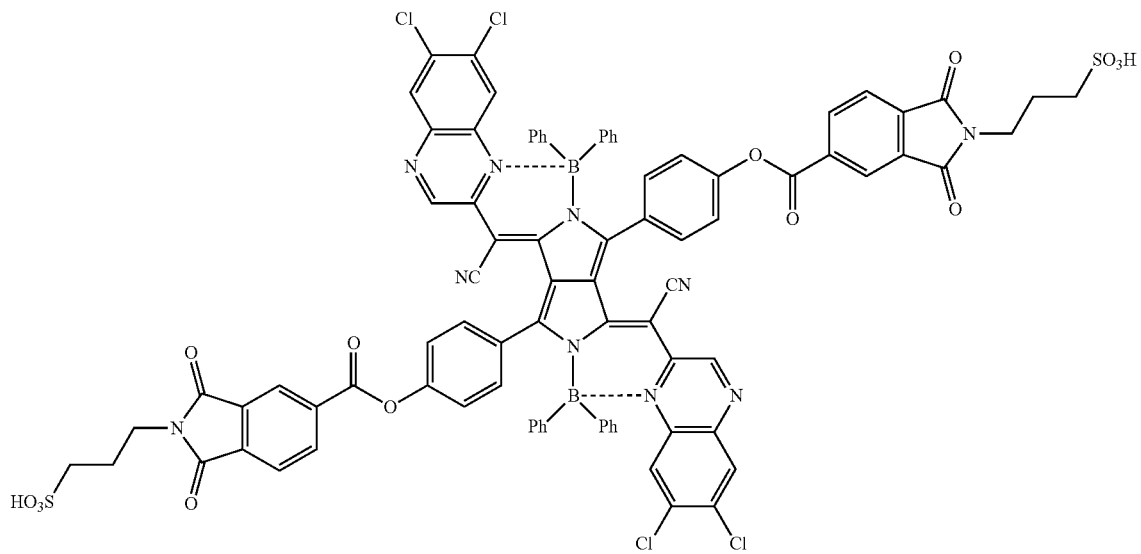

(Dispersant)

C1: a resin having the following structure (a numerical value added to a main chain represents a molar ratio, and a numerical value added to a side chain represents the number of repeating units; Mw=20000, acid value=105 mgKOH/g)

C2: a resin having the following structure (a numerical value added to a main chain represents a molar ratio, and a numerical value added to a side chain represents the number of repeating units; Mw=20000, acid value=30 mgKOH/g)

(Resin)

D1: a resin having the following structure (a numerical value added to a main chain represents a molar ratio; Mw=40000)

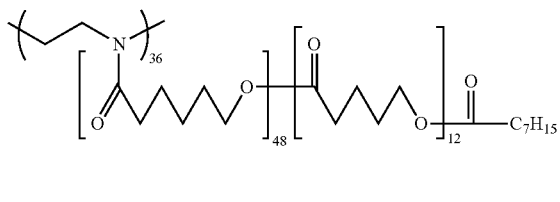
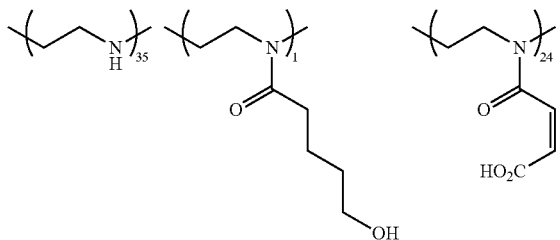
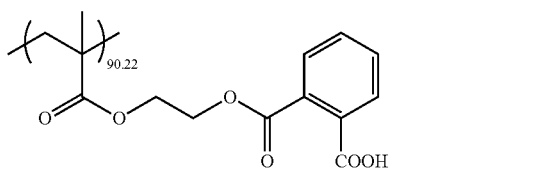
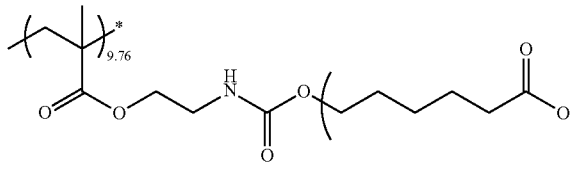

D2: a resin having the following structure (a numerical value added to a main chain represents a molar ratio; Mw=20000)

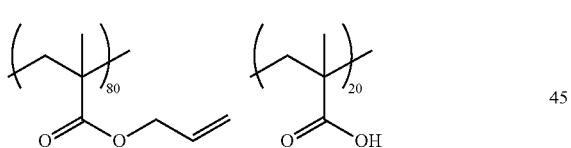
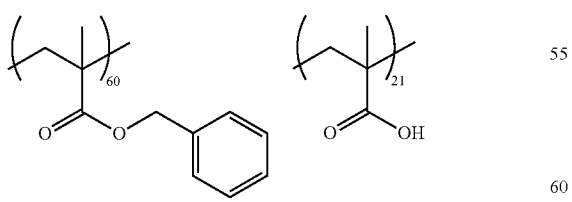

D3: a resin having the following structure (a numerical value added to a main chain represents a molar ratio; Mw=10000)

(C1)

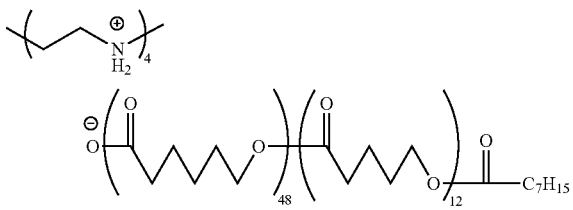

(C2)

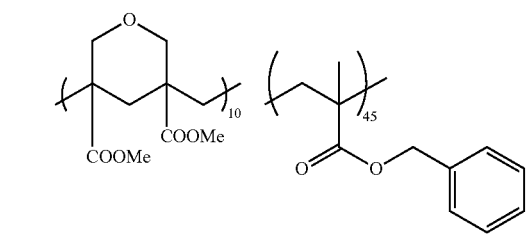
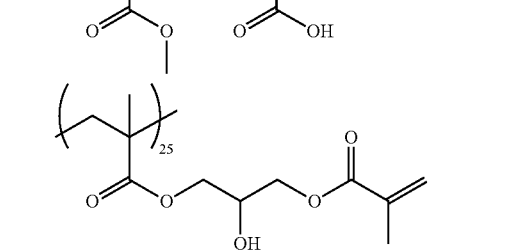

D4: a resin having the following structure (a numerical value added to a main chain represents a molar ratio; Mw=3000)

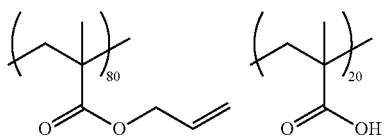

D5: a resin having the following structure (a numerical value added to a main chain represents a molar ratio; Mw=60000)

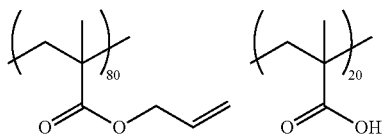

(Polymerizable Monomer)

M1: a compound having the following structure (radically polymerizable compound)

M2: a compound having the following structure (radically polymerizable compound)

M3: a compound having the following structure (radically polymerizable compound)

(M1)

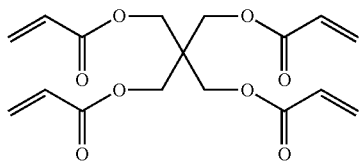

(M2)

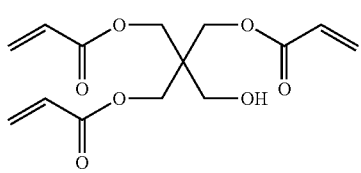

(M3)

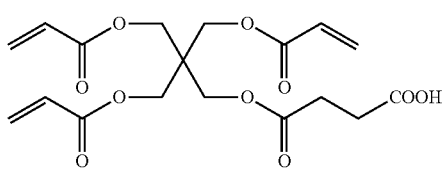

(Photopolymerization Initiator)

F1: IRGACURE OXE01 (manufactured by BASF SE, photoradical polymerization initiator)

F2: IRGACURE 369 (manufactured by BASF SE, photoradical polymerization initiator)

F3: a compound having the following structure (photoradical polymerization initiator)

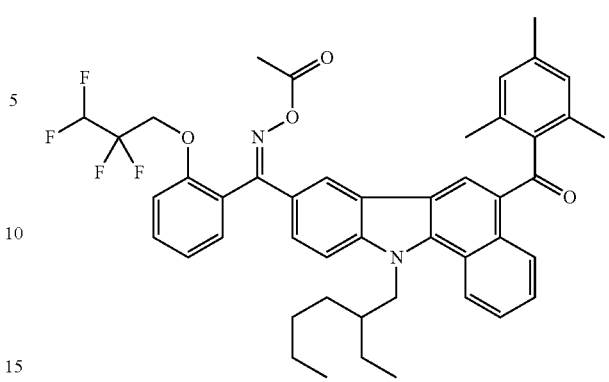

(Ultraviolet Absorber)

UV1 to UV3: compounds having the following structures (UV1)

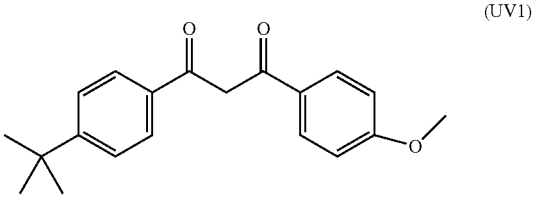

(UV2)

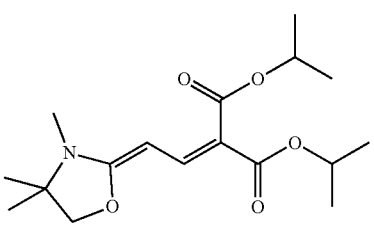

(UV3)

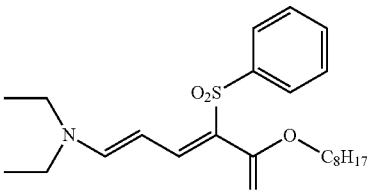

(Surfactant)

W1: the following mixture (Mw=14000, a fluorine surfactant; in the following formula, "%" representing the proportion of a repeating unit is mol %)

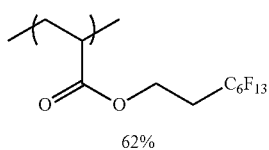

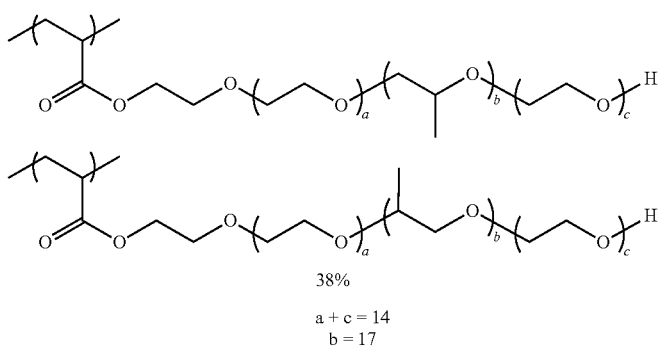

a + c = 14
b = 17

(Polymerization Inhibitor)
H1: p-methoxyphenol
(Antioxidant 1) Hindered Amine Compound
I1: ADEKA STAB LA-82 (manufactured by Adeka Corporation, a compound having the following structure)
I2: ADEKA STAB LA-87 (manufactured by Adeka Corporation, a compound having the following structure)
I3: ADEKA STAB LA-72 (manufactured by Adeka Corporation, a compound having the following structure)
I4: ADEKA STAB LA-77 (manufactured by Adeka Corporation, a compound having the following structure)
I5: ADEKA STAB LA-52 (manufactured by Adeka Corporation, a compound having the following structure)

I6: ADEKA STAB LA-57 (manufactured by Adeka Corporation, a compound having the following structure)
I7: ADEKA STAB LA-81 (manufactured by Adeka Corporation, a compound having the following structure)
I8: CHIMASSORB 2020 FDL (manufactured by BASF SE, a compound having the following structure, Mw=2600 to 3400)
I9: TINUVIN 622 SF (manufactured by BASF SE, a compound having the following structure, Mw=3100 to 4000)
I10: TINUVIN PA 144L (manufactured by BASF SE, a compound having the following structure)

(I1)

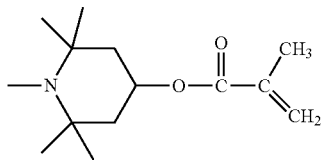

(I2)

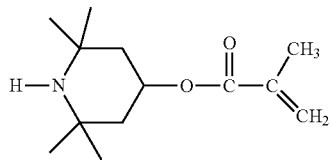

(I3)

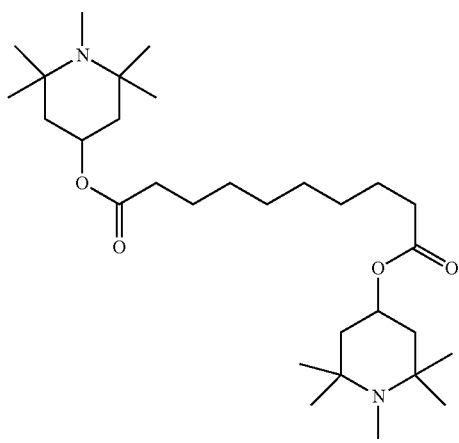

(I4)

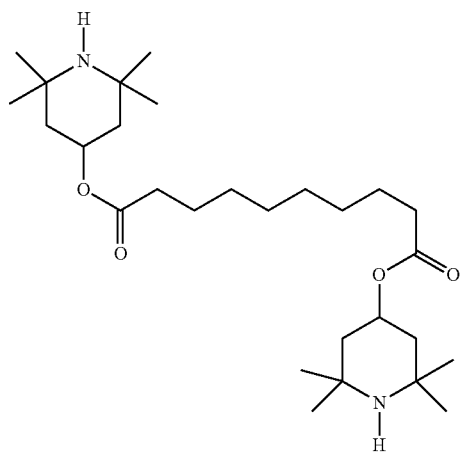

(I5)

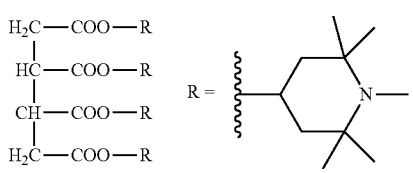

(I6)

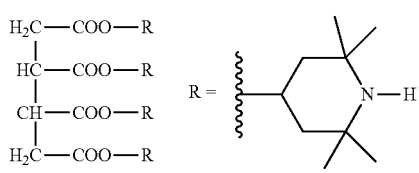

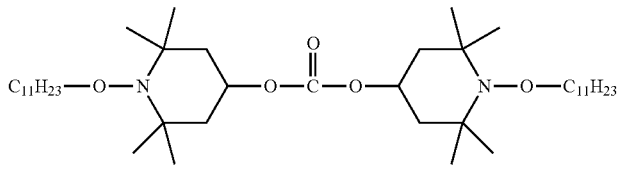

(I7)

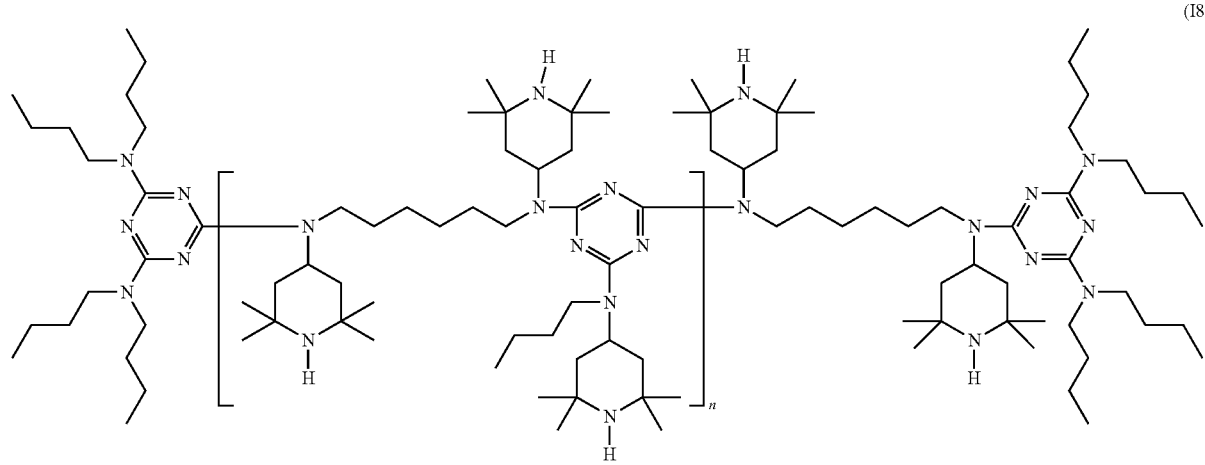

(I8)

(I9)

(I10)

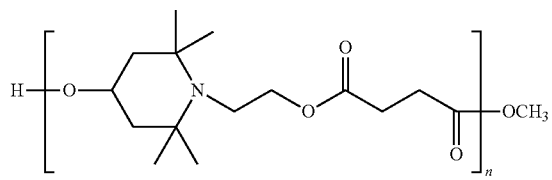

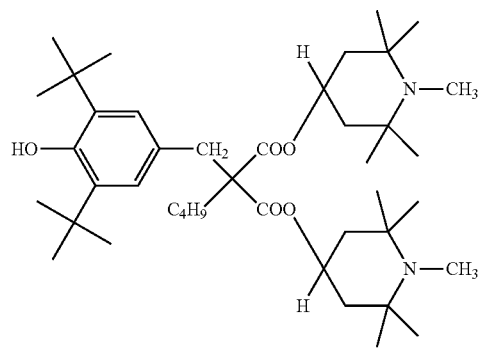

(Antioxidant 2) Antioxidant Other than Hindered Amine Compound

I21: ADEKA STAB AO-80 (manufactured by Adeka Corporation, a hindered phenol compound; a compound having the following structure; in the following structural formula, tBu represents a tert-butyl group)

I22: ADEKA STAB AO-60 (manufactured by Adeka Corporation, a hindered phenol compound; a compound having the following structure; in the following structural formula, tBu represents a tert-butyl group)

I23: ADEKA STAB PEP-36 (manufactured by Adeka Corporation; a phosphorus compound; a compound having the following structure)

I24, I25: compounds having the following structures

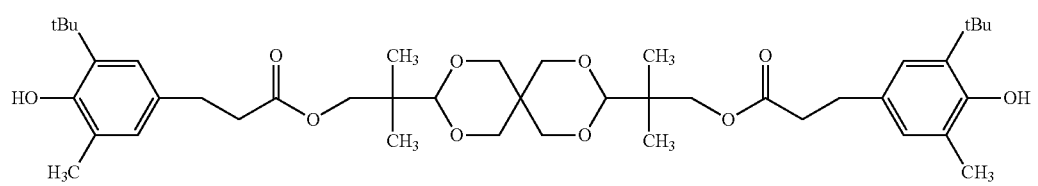

(I21)

-continued (I22)
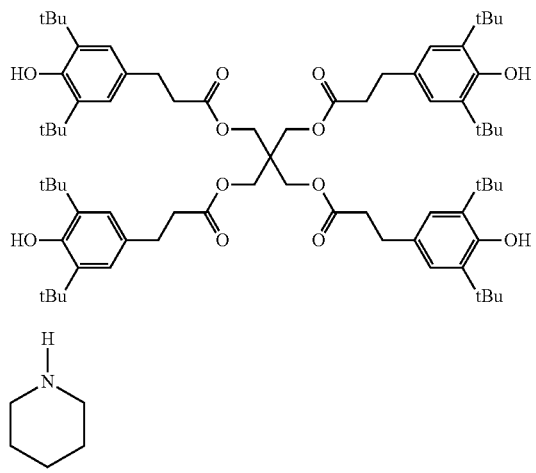

(I23)
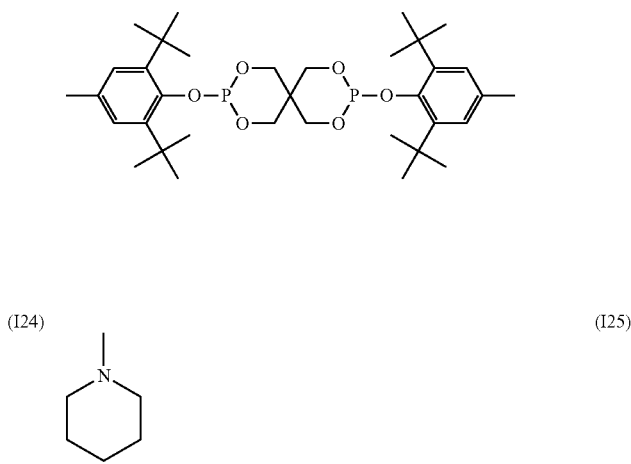

(I24)

(I25)

(Solvent)

S1: propylene glycol monomethyl ether acetate (PG-MEA)

S2: 3-methoxy-N,N-dimethylpropanamide

S3: 3-butoxy-N,N-dimethylpropanamide

<Evaluation>

[Storage Stability]

The viscosity of the resin composition immediately after preparation was measured. After measuring the viscosity, the resin composition was stored in a constant-temperature tank at 45° C. for 72 hours, and then the viscosity was measured again. The viscosity was measured after adjusting the temperature of the resin composition to 23° C. A thickening rate was calculated from the following calculation expression to evaluate storage stability.

Thickening Rate (%)=((Viscosity of Resin Composition after Storage in Constant-Temperature Tank at 45° C. for 72 Hours/Viscosity of Resin Composition immediately after Manufacturing)−1)×100

5: the thickening rate of the resin composition was 5% or lower.

4: the thickening rate of the resin composition was higher than 5% and 7.5% or lower.

3: the thickening rate of the resin composition was higher than 7.5% and 10% or lower.

2: the thickening rate of the resin composition was higher than 10% and 15% or lower.

1: the thickening rate of the resin composition was higher than 15% and 25% or lower.

0: the thickening rate of the resin composition was higher than 25%.

[Thermal Reliability]

Each of the resin compositions was applied to a glass substrate using a spin coater (manufactured by Mikasa Co., Ltd.) such that the thickness after pre-baking was 0.8 μm. As a result, a coating film was formed. Next, the coating film was heated (pre-baked) using a hot plate at 100° C. for 120 seconds. Next, the entire surface of the coating film was exposed using an i-ray stepper exposure device FPA-3000 i5+ (manufactured by Canon Corporation) at an exposure dose of 1000 mJ/cm² and then was heated (post-baked) again using a hot plate at 200° C. for 300 seconds. As a result, a film was obtained. Regarding the obtained film, an absorbance of light in a wavelength range of 400 to 1300 nm was measured. Next, after heating the obtained film using an oven at 150° C. for 6 months, an absorbance of light in a wavelength range of 400 to 1300 nm was measured. A change rate in maximum absorbance before and after heating the obtained film using an oven at 150° C. was obtained to evaluate thermal reliability based on the following standards. The change rate in maximum absorbance refers to a change rate in absorbance of the film before and after heating at a wavelength at which an absorbance in a wavelength range of 400 to 1300 nm is the maximum. In addition, the change rate in absorbance was a value obtained from the following expression.

Change Rate in Absorbance (%)=(I Absorbance before Heating-Absorbance after Heating I/Absorbance before Heating)×100

5: the change rate in maximum absorbance was 5% or lower.

4: the change rate in maximum absorbance was higher than 5% and 7.5% or lower.

3: the change rate in maximum absorbance was higher than 7.5% and 10% or lower.

2: the change rate in maximum absorbance was higher than 10% and 15% or lower.

1: the change rate in maximum absorbance was higher than 15% and 25% or lower.

0: the change rate in maximum absorbance was higher than 25%.

[Spectral Performance]

Each of the resin compositions was applied to a glass substrate using a spin coater (manufactured by Mikasa Co., Ltd.) such that the thickness after pre-baking was 0.8 μm. As a result, a coating film was formed. Next, the coating film was heated (pre-baked) using a hot plate at 100° C. for 120 seconds. Next, the entire surface of the coating film was exposed using an i-ray stepper exposure device FPA-3000 i5+ (manufactured by Canon Corporation) at an exposure dose of 1000 mJ/cm² and then was heated (post-baked) again using a hot plate at 200° C. for 300 seconds. As a result, a film was obtained. Regarding the obtained film, an absorbance of light in a wavelength range of 400 to 1300 nm was measured, and an absorbance A at a maximum absorption wavelength in a wavelength range of 700 to 1300 nm was calculated to evaluate spectral performance based on the following standards.

A: the absorbance A was 0.3 or higher
B: the absorbance A was lower than 0.3

TABLE 6

| Name | Storage Stability | Thermal Reliability | Spectral Performance |
|---|---|---|---|
| Example 1 | 5 | 5 | A |
| Example 2 | 4 | 5 | A |
| Example 3 | 4 | 3 | A |
| Example 4 | 3 | 3 | A |
| Example 5 | 4 | 4 | A |
| Example 6 | 3 | 4 | A |
| Example 7 | 5 | 3 | A |
| Example 8 | 5 | 5 | A |
| Example 9 | 5 | 4 | A |
| Example 10 | 4 | 5 | A |
| Example 11 | 4 | 4 | A |
| Example 12 | 5 | 5 | A |
| Example 13 | 5 | 4 | A |
| Example 14 | 5 | 4 | A |
| Example 15 | 4 | 4 | A |
| Example 16 | 4 | 3 | A |
| Example 17 | 4 | 3 | A |
| Example 18 | 5 | 4 | A |
| Example 19 | 5 | 4 | A |
| Example 20 | 5 | 3 | A |
| Example 21 | 5 | 5 | A |
| Example 22 | 5 | 5 | A |
| Example 23 | 3 | 5 | A |
| Example 24 | 4 | 5 | A |
| Example 25 | 5 | 5 | A |
| Example 26 | 5 | 5 | A |
| Example 27 | 5 | 4 | A |
| Example 28 | 5 | 4 | A |
| Example 29 | 3 | 3 | A |
| Example 30 | 5 | 5 | A |
| Example 31 | 5 | 5 | B |
| Example 32 | 4 | 5 | A |
| Example 33 | 5 | 5 | A |
| Example 34 | 5 | 4 | A |
| Example 35 | 5 | 4 | A |
| Example 36 | 5 | 4 | A |
| Example 37 | 5 | 4 | A |
| Example 38 | 5 | 4 | A |
| Example 39 | 5 | 4 | A |
| Example 40 | 5 | 4 | A |
| Example 41 | 5 | 5 | A |
| Example 42 | 5 | 5 | A |
| Example 43 | 5 | 5 | A |
| Example 44 | 5 | 5 | A |
| Example 45 | 5 | 5 | A |
| Example 46 | 4 | 4 | A |
| Example 47 | 4 | 4 | A |
| Example 48 | 4 | 4 | A |
| Example 49 | 4 | 4 | A |
| Example 50 | 4 | 4 | A |
| Example 51 | 4 | 4 | A |
| Example 52 | 4 | 4 | A |
| Example 53 | 4 | 4 | A |
| Example 54 | 4 | 4 | A |
| Example 55 | 4 | 4 | A |
| Example 56 | 4 | 4 | A |
| Example 57 | 4 | 4 | A |
| Example 58 | 4 | 4 | A |
| Example 59 | 4 | 4 | A |
| Example 60 | 4 | 4 | A |
| Example 61 | 4 | 4 | A |
| Example 62 | 4 | 5 | A |
| Example 63 | 3 | 5 | A |
| Example 64 | 3 | 5 | A |
| Example 65 | 3 | 5 | A |
| Example 66 | 3 | 5 | A |
| Example 67 | 3 | 5 | A |
| Example 68 | 4 | 5 | A |
| Example 69 | 4 | 2 | A |
| Example 70 | 2 | 4 | A |

TABLE 6-continued

| Name | Storage Stability | Thermal Reliability | Spectral Performance |
|---|---|---|---|
| Comparative Example 1 | 5 | 0 | A |
| Comparative Example 2 | 1 | 3 | A |
| Comparative Example 3 | 0 | 3 | A |
| Comparative Example 4 | 0 | 3 | A |

In the resin composition according to each of Examples, a maximum absorption wavelength was present in a wavelength range of 700 to 1300 nm, and an absorbance at the above-described maximum absorption wavelength was high. The film obtained using the resin composition according to each of Examples had excellent visible transparency and near infrared blocking properties. In addition, as shown in the tables, the resin composition according to each of Examples had excellent storage stability, and the film obtained using the resin composition had excellent thermal reliability.

Test Example 2

The resin composition according to each of Examples was applied to a silicon wafer using a spin coating method such that the thickness of the formed film was 1.0 Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm Bayer pattern at an exposure dose of 1000 mJ/cm².

Next, puddle development was performed at 23° C. for 60 seconds using a tetramethylammonium hydroxide (TMAH) 0.3 mass % aqueous solution. Next, the coating film was rinsed by spin showering using pure water. Next, the coating film was heated using a hot plate at 200° C. for 5 minutes. As a result, a 2 μm×2 μm Bayer pattern (near infrared cut filter) was formed.

Next, a Red composition was applied to the Bayer pattern of the near infrared cut filter using a spin coating method such that the thickness of the formed film was 1.0 μm Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering using pure water. Next, the coating film was heated using a hot plate at 200° C. for 5 minutes. As a result, the Red composition was patterned on the Bayer pattern of the near infrared cut filter. Likewise, a Green composition and a Blue composition were sequentially patterned to form red, green, and blue color patterns.

Next, the infrared transmitting filter-forming composition was applied to the pattern-formed film using a spin coating method such that the thickness of the formed film was 2.0 Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm pattern at an exposure dose of 1000 mJ/cm². Next, puddle development was performed at 23° C. for 60 seconds using a tetramethylammonium hydroxide (TMAH) 0.3 mass % aqueous solution. Next, the coating film was rinsed by spin showering using pure water. Next, the coating film was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method.

The obtained solid image pickup element was irradiated with light emitted from an infrared light emitting diode (infrared LED) as a light source in a low-illuminance environment (0.001 Lux) to acquire images. Next, the imaging performance of the solid image pickup element was evaluated. The subject was able to be clearly recognized on the image. In addition, incidence angle dependence was good.

The Red composition, the Green composition, the Blue composition, and the infrared transmitting filter-forming composition used in Test Example 2 are as follows.

(Red Composition)

The following components were mixed and stirred, and the obtained mixture was filtered through a nylon filter (manufactured by Pall Corporation) having a pore size of 0.45 to prepare a Red composition.

| | |
|---|---|
| Red Pigment Dispersion | 51.7 parts by mass |
| The above-described resin D3 | 0.6 parts by mass |
| Polymerizable monomer 4 | 0.6 parts by mass |
| Photopolymerization Initiator 1 | 0.4 parts by mass |
| Surfactant 1 | 4.2 parts by mass |
| Ultraviolet absorber (UV-503, manufactured by Daito Chemical Co., Ltd.) | 0.3 parts by mass |
| Propylene glycol monomethyl ether acetate (PGMEA) | 42.6 parts by mass |

(Green Composition)

The following components were mixed and stirred, and the obtained mixture was filtered through a nylon filter (manufactured by Pall Corporation) having a pore size of 0.45 to prepare a Green composition.

| | |
|---|---|
| Green Pigment Dispersion | 73.7 parts by mass |
| The above-described resin D3 | 0.3 parts by mass |
| Polymerizable monomer 1 | 1.2 parts by mass |
| Photopolymerization Initiator 1 | 0.6 parts by mass |
| Surfactant 1 | 4.2 parts by mass |
| Ultraviolet absorber (UV-503, manufactured by Daito Chemical Co., Ltd.) | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 to prepare a Blue composition.

| | |
|---|---|
| Blue Pigment Dispersion | 44.9 parts by mass |
| The above-described resin D3 | 2.1 parts by mass |
| Polymerizable monomer 1 | 1.5 parts by mass |
| Polymerizable monomer 4 | 0.7 parts by mass |
| Photopolymerization Initiator 1 | 0.8 parts by mass |
| Surfactant 1 | 4.2 parts by mass |
| Ultraviolet absorber (UV-503, manufactured by Daito Chemical Co., Ltd.) | 0.3 parts by mass |
| PGMEA | 45.8 parts by mass |

(Infrared Transmitting Filter-Forming Composition)

The following components were mixed and stirred, and the obtained mixture was filtered through a nylon filter (manufactured by Pall Corporation) having a pore size of 0.45 to prepare an infrared transmitting filter-forming composition.

| | |
|---|---|
| Pigment Dispersion 1-1 | 46.5 parts by mass |
| Pigment Dispersion 1-2 | 37.1 parts by mass |
| Polymerizable monomer 5 | 1.8 parts by mass |
| The above-described resin D3 | 1.1 parts by mass |
| Photopolymerization Initiator 2 | 0.9 parts by mass |
| Surfactant 1 | 4.2 parts by mass |
| Polymerization inhibitor (p-methoxyphenol) | 0.001 parts by mass |
| Silane coupling agent | 0.6 parts by mass |
| PGMEA | 7.8 parts by mass |

Raw materials used in the Red composition, the Green composition, the Blue composition, and the infrared transmitting filter-forming composition are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Pigment Dispersion 1-1

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, Pigment Dispersion 1-1 was prepared.

| | |
|---|---|
| Mixed pigment including a red pigment (C.I. Pigment Red 254) and a yellow pigment (C.I. Pigment Yellow 139) | 11.8 parts by mass |
| Resin (Disperbyk-111, manufactured by BYK Chemie) | 9.1 parts by mass |
| PGMEA | 79.1 parts by mass |

Pigment Dispersion 1-2

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, Pigment Dispersion 1-2 was prepared.

| | |
|---|---|
| Mixed pigment including a blue pigment (C.I. Pigment Blue 15:6) and a violet pigment (C.I. Pigment Violet 23) | 12.6 parts by mass |
| Resin (Disperbyk-111, manufactured by BYK Chemie) | 2.0 parts by mass |
| The above-described resin D2 | 3.3 parts by mass |
| Cyclohexanone | 31.2 parts by mass |
| PGMEA | 50.9 parts by mass |

Polymerizable monomer 1: KAYARAD DPHA (manufactured by Nippon Kayaku Co., Ltd.)

Polymerizable monomer 4: a compound having the following structure

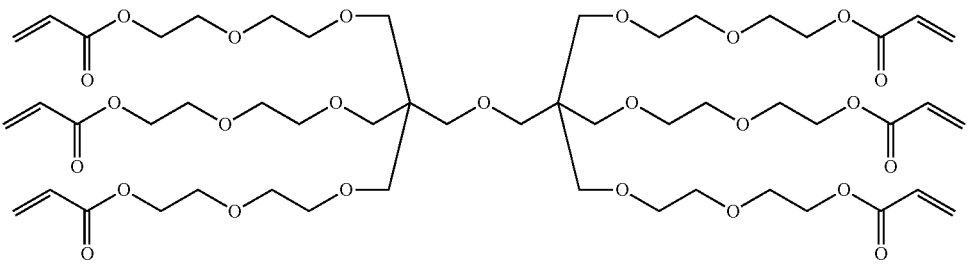 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable monomer 5: a compound having the following structures (a mixture in which a molar ratio between a left compound and a right compound is 7:3)

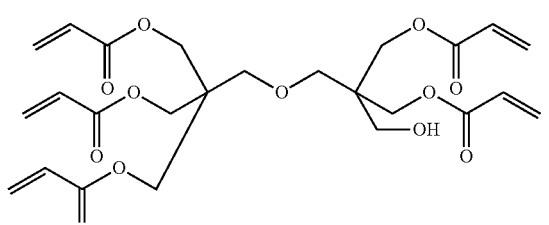

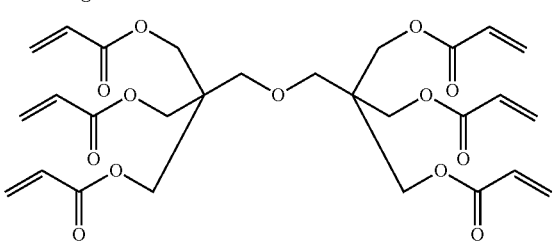

Photopolymerization Initiator 1: IRGACURE-OXE 01 (manufactured by BASF SE)

Photopolymerization Initiator 2: a compound having the following structure

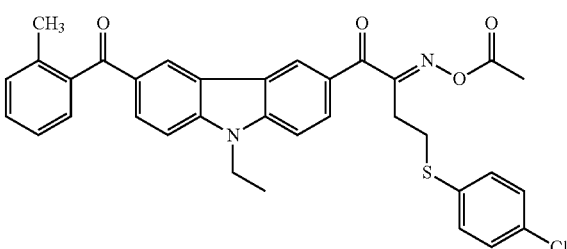

Surfactant 1: 1 mass % PGMEA solution of the following mixture (Mw: 14000) In the following formula, "%" representing the proportion of a repeating unit is mol %.

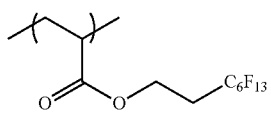 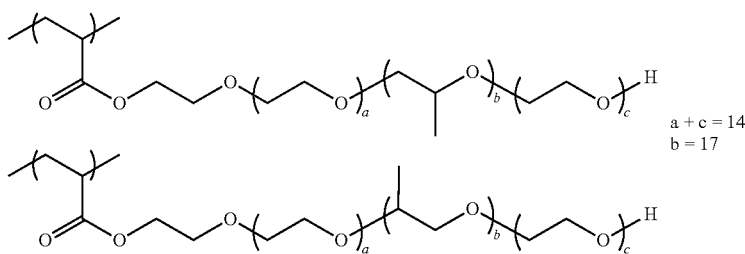

62%   38%

Silane coupling agent: a compound having the following structure In the following structural formulae, Et represents an ethyl group.

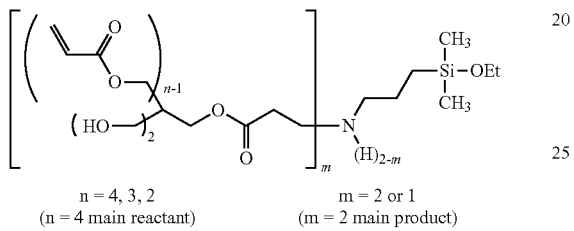

n = 4, 3, 2   m = 2 or 1
(n = 4 main reactant)   (m = 2 main product)

EXPLANATION OF REFERENCES

110: solid image pickup element
111: near infrared cut filter
112: color filter
114: infrared transmitting filter
115: microlens
116: planarizing layer

What is claimed is:

1. A resin composition comprising:
a near infrared absorbing colorant;
an antioxidant; and
a resin,
wherein a content of the near infrared absorbing colorant is 5 mass % or higher with respect to a total solid content of the resin composition,
the antioxidant includes a hindered amine compound in an amount from 0.1 to 10 parts by mass with respect to 100 parts by mass of the near infrared absorbing colorant,
the antioxidant further includes a phenol antioxidant,
a weight-average molecular weight of the resin is 5000 to 40000,
the phenol antioxidant comprises a compound including a structure represented by Formula (A-1):

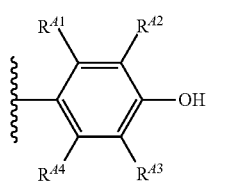

(A-1)

in Formula (A-1) $R^{41}$ to $R^{44}$ each independently represent a hydrogen atom or a substituent, at least one of $R^{41}$ to $R^{44}$ represents a hydrocarbon group having one or more carabon atoms, and a wave line represents a linking site, and
a content of the phenol antioxidant is form 10 to 90 parts by mass with respect to 100 parts by mass of the hindered amine compound.

2. The resin composition according to claim 1,
wherein the hindered amine compound is a compound having a partial structure represented by Formula (1) or a partial structure represented by Formula (2),

(1)

(2)

in Formulae (1) and (2), a wave line represents a linking site,
$R^1$ represents a hydrogen atom, an alkyl group, an alkoxy group, or an oxygen radical,
$R^2$ to $R^5$ each independently represent an alkyl group,
$R^6$ represents a substituent,
n represents an integer of 1 to 3,
in a case where n represents 1, m represents an integer of 0 to 3, in a case where n represents 2, m represents an integer of 0 to 5, and in a case where n represents 3, m represents an integer of 0 to 7, and
in a case where m represents an integer of 2 or more, m $R^6$'s may be the same as or different from each other.

3. The resin composition according to claim 2,
wherein $R^2$ to $R^5$ each independently represent an alkyl group having 1 to 3 carbon atoms, and n represents 1 or 2.

4. The resin composition according to claim 2,
wherein m represents 1 or more, and one or more $R^6$'s among m $R^6$'s represent a polymerizable group.

5. The resin composition according to claim 2,
wherein the hindered amine compound has two or more of the partial structures represented by Formula (1) or two or more of the partial structures represented by Formula (2) in one molecule.

6. The resin composition according to claim 2,
wherein the hindered amine compound is a polymer having the partial structure represented by Formula (1) or the partial structure represented by Formula (2).

7. The resin composition according to claim 1,
wherein the hindered amine compound is a compound having a partial structure represented by the following Formula (1a) or a partial structure represented by the following Formula (2a),

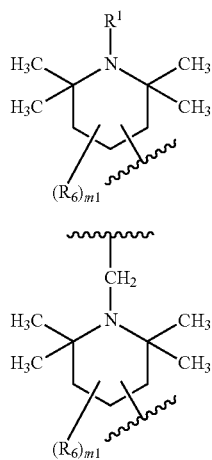

in Formulae (1a) and (2a), a wave line represents a linking site,
$R^1$ represents a hydrogen atom, an alkyl group, an alkoxy group, or an oxygen radical,
$R_6$ represents a substituent,
m1 represents an integer of 0 to 5, and
in a case where m1 represents an integer of 2 or more, m1 $R_6$'s may be the same as or different from each other.

8. The resin composition according to claim 1, further comprising:
a surfactant.

9. The resin composition according to claim 1,
wherein the near infrared absorbing colorant is at least one selected from the group consisting of a cyanine compound, a squarylium compound, a pyrrolopyrrole compound, and an iminium compound.

10. The resin composition according to claim 1, further comprising:
a curable compound.

11. The resin composition according to claim 1, further comprising:
a radically polymerizable compound; and
a photoradical polymerization initiator.

12. The resin composition according to claim 1, further comprising:
a silane coupling agent.

13. A film which is formed of the resin composition according to claim 1.

14. An optical filter comprising:
the film according to claim 13.

15. The optical filter according to claim 14,
wherein the optical filter is a near infrared cut filter or an infrared transmitting filter.

16. A solid image pickup element comprising:
the film according to claim 13.

17. An image display device comprising:
the film according to claim 13.

18. An infrared sensor comprising:
the film according to claim 13.

19. The resin composition according to claim 1,
wherein the near infrared absorbing colorant is at least one selected from the group consisting of a pyrrolopyrrole compound, a cyanine compound, and a squarylium compound,
the hindered amine compound is at least one selected from the group consisting of a compound represented by following Formula (3), a polymer having a partial structure represented by the following Formula (2a) in a polymeer main chain, and a polymer having a partial structure represented by the following Formula (1a) in a polymer main chain,
the resin includes a resin having an acid group, and
a content of the resin is form 1 to 80 mass % with respect to the total solid content of the resin composition:

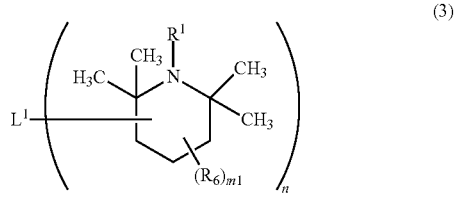

wherein, in Formula (3), R1 represents a hydrogen atom, an alkyl group, an alkoxy group, or an onygen radical,
R6 represents a substituent,
m1 represents an integer from 0 to 5, and in a case where m1 represents an integer of 2 or more, each R6 may be the same as or different from another R6,
n represents an integer form 1 to 8,
in a case where n represents 1, L1 represents a hydrogen atom, m1 represents 1, and R6 represents a polymerizable group,
in a case where n represents 2 or more, L1 represents an n-valent linking group, and
the n-valent linking group is a group that consists of a hydrocarbon group, a heterocyclic group, —O—, —S—, —NR—, —CO—, —COO—, —OCO—, —SO2—, or a combination of these groups, where R represents a hydrogen atom, an alkyl group, or an aryl group:

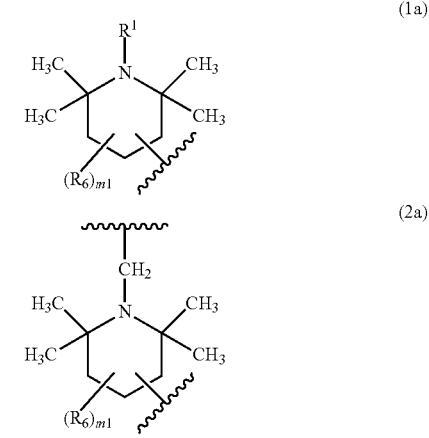

wherein, in Formulae (1a) and (2a), the wave line represents a linking site, R1 represents a hydrogen atom, an alkyl group, an alkoxy gorup, or an oxygen radical, R6 represents a substituent, and m1 represents 0.

20. The resin composition according to claim 1, wherein the phenol antioxidant is a compound representd by Formula (A-2):

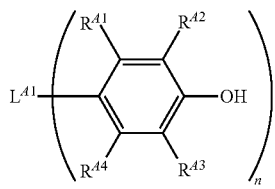

in Formula (A-2), $R^{A1}$ to $R^{A4}$ each independently represent a hydrogen atom or a substituent, and at least one of $R^{A1}$ to $R^{A4}$ represents a hydrocarbon group having one or more carbon atoms, n represents an integer of 1 or more, in a case where n represents 1, $L^{A1}$ represents a hydrogen atom or a substituent and in a case where n represents 2 or more, $L^{A1}$ represents an n-valent linking group.

21. A resin composition, comprising:
a near infrared absorbing colorant;
an antioxidant; and
a resin, wherein:
a content of the near infrared absorbing colorant is 5 mass % or higher with respect to a total solid content of the resin composition,
the antioxidant includes a hindered amine compound,
the resin includes a resin having a carboxyl group,
the antioxidant further includes a phenol antioxidant,
a weight-average molecular weight of the resin is 5000 to 40000,
the phenol antioxidant comprises a compound including a structure represented by Formula (A-1):

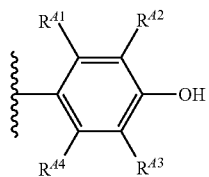

in Formula (A-1), $R^{A1}$ to $R^{A4}$ each independently represent a hydrogen atom or a substituent, at least one or $R^{A1}$ to $R^{A4}$ represents a hydrocarbon group having one or more carbon atoms, and a wave line represents a linking site, and
a content of the phenol antioxidant is form 10 to 90 parts by mass with respect to 100 parts by mass of the hindered amine compound.

22. The resin composition according ot claim 21, wherein the phenol antioxidant is a compound represented by Formula (A-2):

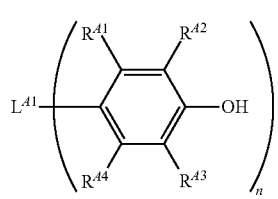

in Formula (A-2), $R^{A1}$ to $R^{A4}$ each independently represent a hydrogen atom or a substituent, and at one of $R^{A1}$ to $R^{A4}$ represents a hydrocarbon group having one or more carbon atoms, n represents an integer of 1 or more, in a case where n represents 1, $L^{A1}$ represents a hydrogen atom or a substituent, and in a case where n represents 2 or more, $L^{A1}$ represents an n-valent linking group.

* * * * *